(12) United States Patent
Isobe et al.

(10) Patent No.: US 7,538,350 B2
(45) Date of Patent: May 26, 2009

(54) SEMICONDUCTOR THIN FILM DEVICE

(75) Inventors: Atsuo Isobe, Atsugi (JP); Koji Dairiki, Tochigi (JP); Hiroshi Shibata, Higashine (JP); Chiho Kokubo, Tochigi (JP); Tatsuya Arao, Atsugi (JP); Masahiko Hayakawa, Atsugi (JP); Hidekazu Miyairi, Atsugi (JP); Akihisa Shimomura, Atsugi (JP); Koichiro Tanaka, Atsugi (JP); Shunpei Yamazaki, Setagaya (JP); Mai Akiba, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 138 days.

(21) Appl. No.: 11/698,864

(22) Filed: Jan. 29, 2007

(65) Prior Publication Data

US 2007/0120127 A1 May 31, 2007

Related U.S. Application Data

(62) Division of application No. 11/087,652, filed on Mar. 24, 2005, now Pat. No. 7,176,490, which is a division of application No. 10/330,025, filed on Dec. 27, 2002, now Pat. No. 6,933,527.

(30) Foreign Application Priority Data

Dec. 28, 2001 (JP) ............................ 2001-399004
Dec. 28, 2001 (JP) ............................ 2001-401472

(51) Int. Cl.
*H01L 29/786* (2006.01)
(52) U.S. Cl. ................. 257/66; 257/E29.028; 438/151

(58) Field of Classification Search ............ 257/49, 257/64, 619, E29.022, E29.026, E29.028, 257/E29.114, 66
See application file for complete search history.

(56) References Cited

U.S. PATENT DOCUMENTS 4,330,363 A   5/1982   Biegesen et al.

(Continued)

FOREIGN PATENT DOCUMENTS

EP   1 049 144   11/2000

(Continued)

OTHER PUBLICATIONS

M.W. Geis et al., *Crystallographic Orientation of Silicon on an Amorphous Substrate Using an Artificial Surface-Relief Grating and Laser Crystallization*, Appl. Phys. Lett. vol. 35, No. 1, Jul. 1, 1979, pp. 71-74.

(Continued)

*Primary Examiner*—Jerome Jackson, Jr.
*Assistant Examiner*—Paul A Budd
(74) *Attorney, Agent, or Firm*—Eric J. Robinson; Robinson Intellectual Property Law Office, P.C.

(57) ABSTRACT

It is a problem to provide a semiconductor device production system using a laser crystallization method capable of preventing grain boundaries from forming in a TFT channel region and further preventing conspicuous lowering in TFT mobility due to grain boundaries, on-current decrease or off-current increase. An insulation film is formed on a substrate, and a semiconductor film is formed on the insulation film. Due to this, preferentially formed is a region in the semiconductor film to be concentratedly applied by stress during crystallization with laser light. Specifically, a stripe-formed or rectangular concavo-convex is formed on the semiconductor film. Continuous-oscillation laser light is irradiated along the striped concavo-convex or along a direction of a longer or shorter axis of rectangle.

20 Claims, 45 Drawing Sheets

U.S. PATENT DOCUMENTS

| | | | |
|---|---|---|---|
| 4,631,804 A * | 12/1986 | Roy | 438/404 |
| 4,710,604 A | 12/1987 | Shirasu et al. | |
| 4,829,013 A * | 5/1989 | Yamazaki | 438/71 |
| 5,097,297 A | 3/1992 | Nakazawa | |
| 5,145,808 A | 9/1992 | Sameshima et al. | |
| 5,163,220 A | 11/1992 | Zeto et al. | |
| 5,432,122 A | 7/1995 | Chae | |
| 5,578,897 A | 11/1996 | Nomura et al. | |
| 5,589,406 A | 12/1996 | Kato et al. | |
| 5,594,296 A | 1/1997 | Mitsutake et al. | |
| 5,636,042 A | 6/1997 | Nakamura et al. | |
| 5,643,826 A | 7/1997 | Ohtani et al. | |
| 5,659,329 A | 8/1997 | Yamanobe et al. | |
| 5,759,879 A | 6/1998 | Iwasaki | |
| 5,776,803 A | 7/1998 | Young | |
| 5,841,097 A | 11/1998 | Esaka et al. | |
| 5,847,780 A | 12/1998 | Kim et al. | |
| 5,851,862 A | 12/1998 | Ohtani et al. | |
| 5,854,803 A | 12/1998 | Yamazaki et al. | |
| 5,858,823 A | 1/1999 | Yamazaki et al. | |
| 5,932,893 A | 8/1999 | Miyanaga et al. | |
| 5,953,597 A | 9/1999 | Kusumoto et al. | |
| 5,965,915 A | 10/1999 | Yamazaki et al. | |
| 5,970,368 A | 10/1999 | Sasaki et al. | |
| 5,981,974 A | 11/1999 | Makita | |
| 5,986,306 A | 11/1999 | Nakajima et al. | |
| 5,994,174 A | 11/1999 | Carey et al. | |
| 6,133,583 A | 10/2000 | Ohtani et al. | |
| 6,162,667 A | 12/2000 | Funai et al. | |
| 6,184,559 B1 | 2/2001 | Hayakawa et al. | |
| 6,210,996 B1 | 4/2001 | Yamazaki et al. | |
| 6,283,813 B1 | 9/2001 | Kaneko et al. | |
| 6,288,414 B1 | 9/2001 | Ahn | |
| 6,291,320 B1 | 9/2001 | Yamazaki et al. | |
| 6,307,214 B1 | 10/2001 | Ohtani et al. | |
| 6,337,259 B1 | 1/2002 | Ueda et al. | |
| 6,355,940 B1 | 3/2002 | Koga et al. | |
| 6,365,933 B1 | 4/2002 | Yamazaki et al. | |
| 6,372,562 B1 | 4/2002 | Matsumoto | |
| 6,387,779 B1 | 5/2002 | Yi et al. | |
| 6,388,386 B1 | 5/2002 | Kunii et al. | |
| 6,410,368 B1 | 6/2002 | Kawasaki et al. | |
| 6,424,331 B1 | 7/2002 | Ozawa | |
| 6,429,100 B2 | 8/2002 | Yoneda | |
| 6,433,842 B1 | 8/2002 | Kaneko et al. | |
| 6,455,360 B1 | 9/2002 | Miyasaka | |
| 6,472,289 B2 * | 10/2002 | Oi et al. | 438/404 |
| 6,475,840 B1 | 11/2002 | Miyanaga et al. | |
| 6,482,721 B1 | 11/2002 | Lee | |
| 6,492,659 B1 | 12/2002 | Yamazaki et al. | |
| 6,512,246 B1 | 1/2003 | Tanabe | |
| 6,555,875 B2 | 4/2003 | Kawasaki et al. | |
| 6,566,179 B2 | 5/2003 | Murley et al. | |
| 6,583,440 B2 | 6/2003 | Yasukawa | |
| 6,600,197 B1 | 7/2003 | Nakajima et al. | |
| 6,602,744 B1 | 8/2003 | Ino et al. | |
| 6,602,758 B2 | 8/2003 | Kizilyalli et al. | |
| 6,632,696 B2 | 10/2003 | Kimura et al. | |
| 6,653,212 B1 | 11/2003 | Yamanaka et al. | |
| 6,700,133 B1 | 3/2004 | Ohtani et al. | |
| 6,727,122 B2 | 4/2004 | Seo et al. | |
| 6,746,901 B2 | 6/2004 | Kasahara et al. | |
| 6,759,628 B1 | 7/2004 | Ino et al. | |
| 6,762,081 B2 | 7/2004 | Yamazaki et al. | |
| 6,812,491 B2 | 11/2004 | Kato et al. | |
| 6,841,434 B2 | 1/2005 | Miyairi et al. | |
| 6,841,797 B2 | 1/2005 | Isobe et al. | |
| 6,847,050 B2 | 1/2005 | Yamazaki et al. | |
| 6,861,614 B1 | 3/2005 | Tanabe et al. | |
| 6,862,008 B2 | 3/2005 | Yamazaki et al. | |
| 6,875,998 B2 | 4/2005 | Kato et al. | |
| 6,884,668 B2 | 4/2005 | Yamazaki et al. | |
| 6,906,343 B2 | 6/2005 | Yamazaki | |
| 7,064,016 B2 | 6/2006 | Kasahara et al. | |
| 2001/0000243 A1 | 4/2001 | Sugano et al. | |
| 2001/0000627 A1 | 5/2001 | Hayakawa et al. | |
| 2001/0035526 A1 | 11/2001 | Yamazaki et al. | |
| 2001/0052598 A1 | 12/2001 | Koga et al. | |
| 2002/0004292 A1 | 1/2002 | Yamazaki et al. | |
| 2002/0031876 A1 | 3/2002 | Hara et al. | |
| 2002/0048864 A1 | 4/2002 | Yamazaki et al. | |
| 2002/0060322 A1 | 5/2002 | Tanabe et al. | |
| 2002/0075208 A1 | 6/2002 | Bae et al. | |
| 2002/0096680 A1 | 7/2002 | Sugano et al. | |
| 2002/0098628 A1 | 7/2002 | Hamada et al. | |
| 2002/0119609 A1 | 8/2002 | Hatano et al. | |
| 2002/0121665 A1 | 9/2002 | Kawasaki et al. | |
| 2002/0134981 A1 | 9/2002 | Nakamura et al. | |
| 2003/0001800 A1 | 1/2003 | Nakajima et al. | |
| 2003/0057418 A1 | 3/2003 | Asano | |
| 2003/0061984 A1 | 4/2003 | Maekawa et al. | |
| 2003/0128200 A1 | 7/2003 | Yumoto | |
| 2003/0141505 A1 | 7/2003 | Isobe et al. | |
| 2003/0141521 A1 | 7/2003 | Isobe et al. | |
| 2003/0181043 A1 | 9/2003 | Tanada et al. | |
| 2003/0183854 A1 | 10/2003 | Kato et al. | |
| 2003/0186490 A1 | 10/2003 | Kato et al. | |
| 2003/0209710 A1 | 11/2003 | Yamazaki et al. | |
| 2003/0218169 A1 | 11/2003 | Isobe et al. | |
| 2003/0218170 A1 | 11/2003 | Yamazaki et al. | |
| 2003/0218171 A1 | 11/2003 | Isobe et al. | |
| 2003/0218177 A1 | 11/2003 | Yamazaki | |
| 2003/0219935 A1 | 11/2003 | Miyairi et al. | |
| 2003/0230749 A1 | 12/2003 | Isobe et al. | |
| 2003/0230750 A1 | 12/2003 | Koyama et al. | |
| 2004/0016958 A1 | 1/2004 | Kato et al. | |
| 2004/0016967 A1 | 1/2004 | Yamazaki et al. | |
| 2004/0026696 A1 | 2/2004 | Yamazaki et al. | |
| 2004/0079962 A1 * | 4/2004 | Kanechika et al. | 257/163 |
| 2005/0020096 A1 | 1/2005 | Miyairi et al. | |
| 2005/0029518 A1 | 2/2005 | Kato et al. | |
| 2005/0029519 A1 | 2/2005 | Yamazaki et al. | |
| 2005/0098784 A1 | 5/2005 | Isobe et al. | |
| 2006/0246634 A1 | 11/2006 | Kasahara et al. | |

FOREIGN PATENT DOCUMENTS

| | | |
|---|---|---|
| EP | 1 054 452 | 11/2000 |
| EP | 1 067 593 | 1/2001 |
| JP | 62-104117 | 5/1987 |
| JP | 63-031108 | 2/1988 |
| JP | 02-140980 | 5/1990 |
| JP | 06-349735 | 12/1994 |
| JP | 07-130652 | 5/1995 |
| JP | 08-070129 | 3/1996 |
| JP | 08-078329 | 3/1996 |
| JP | 08-195357 | 7/1996 |
| JP | 08-288515 | 11/1996 |
| JP | 10-012891 | 1/1998 |
| JP | 10-135468 | 5/1998 |
| JP | 10-135469 | 5/1998 |
| JP | 11-084418 | 3/1999 |
| JP | 11-121753 | 4/1999 |
| JP | 11-177102 | 7/1999 |
| JP | 11-354442 | 12/1999 |
| JP | 2000-068520 | 3/2000 |
| JP | 2000-277450 | 10/2000 |
| JP | 2000-349296 | 12/2000 |
| JP | 2001-011085 | 1/2001 |
| JP | 2001-053285 | 2/2001 |
| JP | 2001-144027 | 5/2001 |
| JP | 2001-196599 | 7/2001 |
| JP | 2002-014337 | 1/2002 |
| JP | 2002-033330 | 1/2002 |

| JP | 2002-313811 | 10/2002 |
| JP | 2002-324808 | 11/2002 |
| WO | WO 00/63956 | 10/2000 |

OTHER PUBLICATIONS

M.A. Baldo et al., *Very High-Efficiency Green Organic Light-Emitting Devices Based on Electrophosphorescence*, Applied Physics Letters, vol. 75, No. 1, Jul. 5, 1999, pp. 4-6.

T. Tsutsui et al., *High Quantum Efficiency in Organic Light-Emitting Devices with Iridium-Complex as a Triplet Emissive Center*, Jpn. J. Appl. Phys., vol. 38, Part 2, No. 12B, Dec. 15, 1999, pp. L1502-L1504.

M.A. Baldo et al., *Highly Efficient Phosphorescent Emission from Organic Electroluminescent Devices*, Nature, vol. 395, Sep. 10, 1998, pp. 151-154.

T. Tsutsui et al., *Electroluminescence in Organic Thin Films*, Photochemical Processes in Organized Molecular Systems, Proceedings of the Memorial Conference for the late Professor Shigeo Tazuke, Sep. 22-24, 1990, pp. 437-450.

M. Kishino et al., *Physics of VLSI Device*, Maruzen Co. Ltd., 1995, pp. 144-146.

H.W. Lam et al., *Characteristics of MOSFETS Fabricated in Laser-Recrystallized Polysilicon Islands with a Retaining Wall Structure on an Insulating Substrate*, IEEE Electron Device Letters, vol. EDL-1, No. 10, Oct. 1980, pp. 206-208.

H. I. Smith et al., *Oriented Crystal Growth on Amorphous Substrates Using Artificial Surface-Relief Gratings*, Appl. Phys. Lett. 32(6), Mar. 15, 1978, pp. 349-350.

D. K. Biegelsen et al., *Laser-Induced Crystallization of Silicon Islands on Amorphous Substrates: Multilayer Structures*, Appl. Phys. Lett. 38(3), Feb. 1, 1981, pp. 150-152.

Geis et al., *Crystalline Silicon on Insulators by Graphoepitaxy*, IEEE, 1979, pp. 210-212.

Geis et al., *Grapho-Epitaxy of Silicon on Fused Silica Using Surface Micropatterns and Laser Crystallization*, J. Vac. Sci. Tech., 16(6), Nov./Dec. 1979, pp. 1640-1643.

Hara et al., *Ultra-High Performance Poly-Si TFTs on a Glass by a Stable Scanning CW Laser Lateral Crystallization*, AM-LCD '01, pp. 227-230.

Geis et al., *Crystalline Silicon on Insulators by Graphoepitaxy*, IEDM, 1979, pp. 210-212.

\* cited by examiner

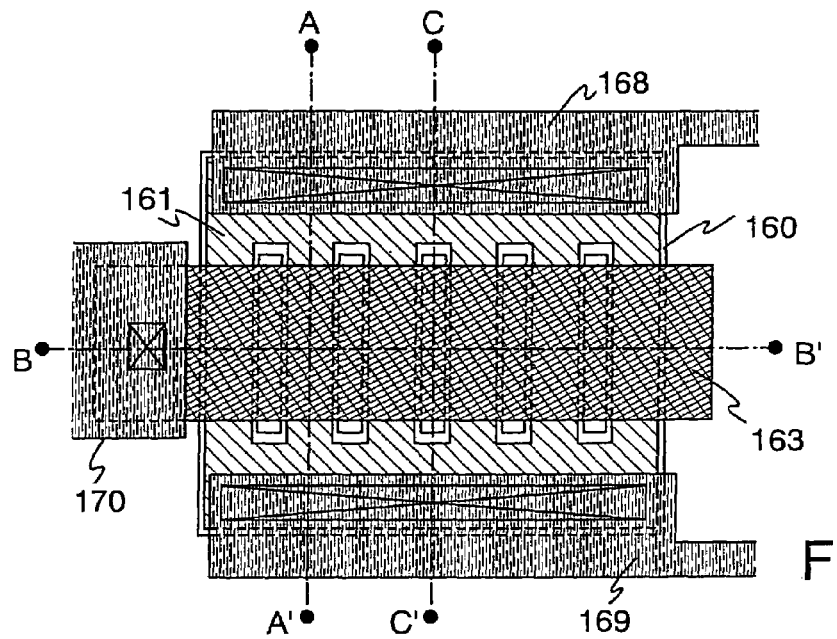
Fig. 34A
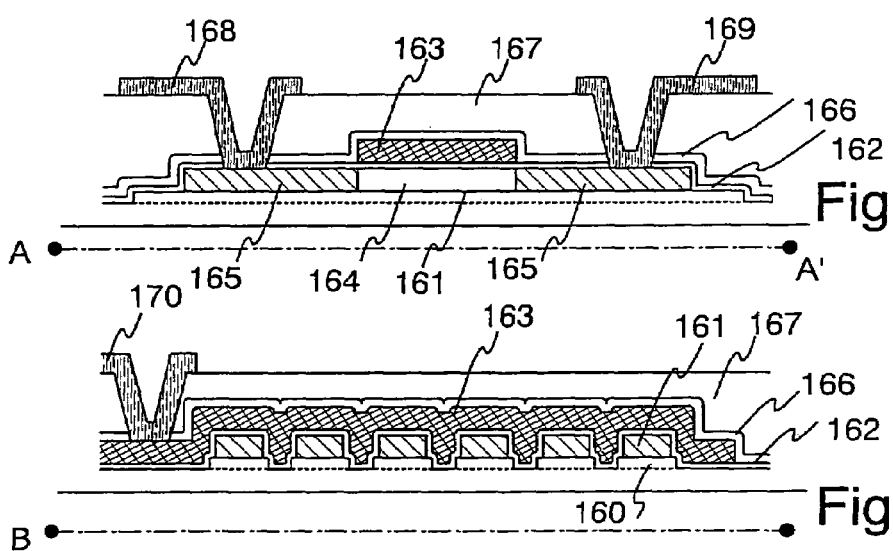
Fig. 34B
Fig. 34C
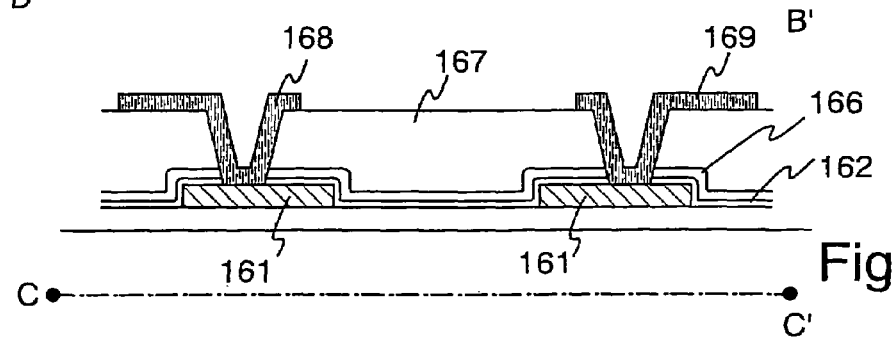
Fig. 34D

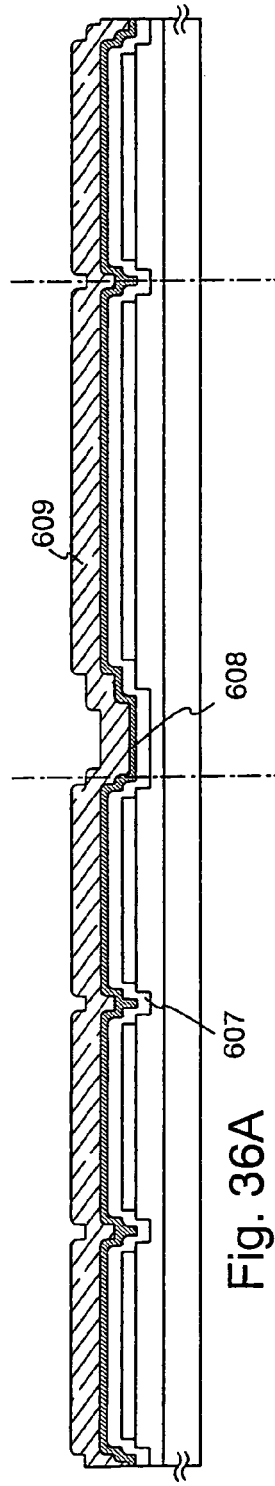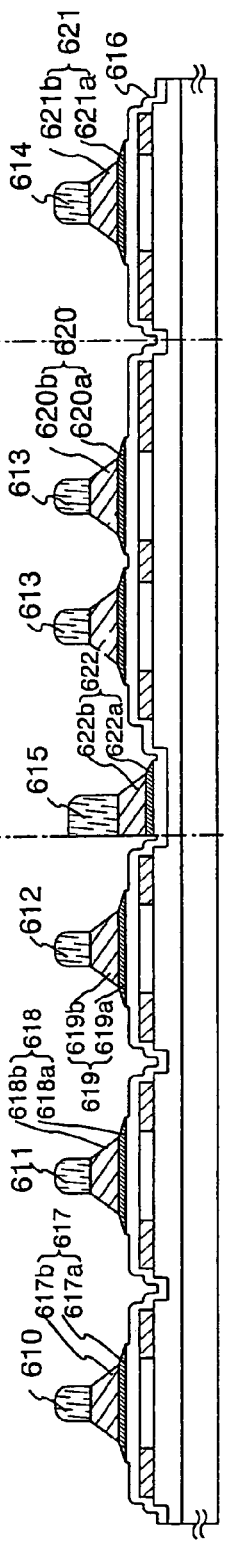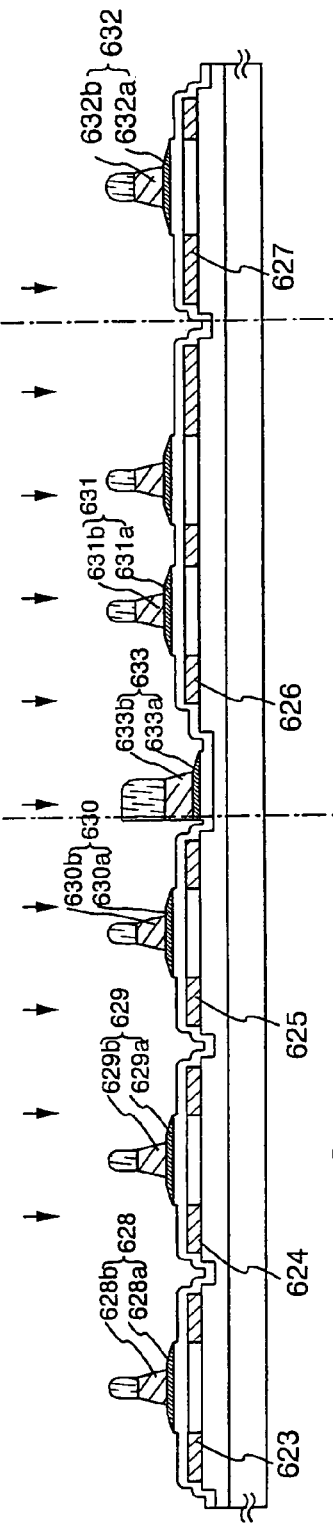

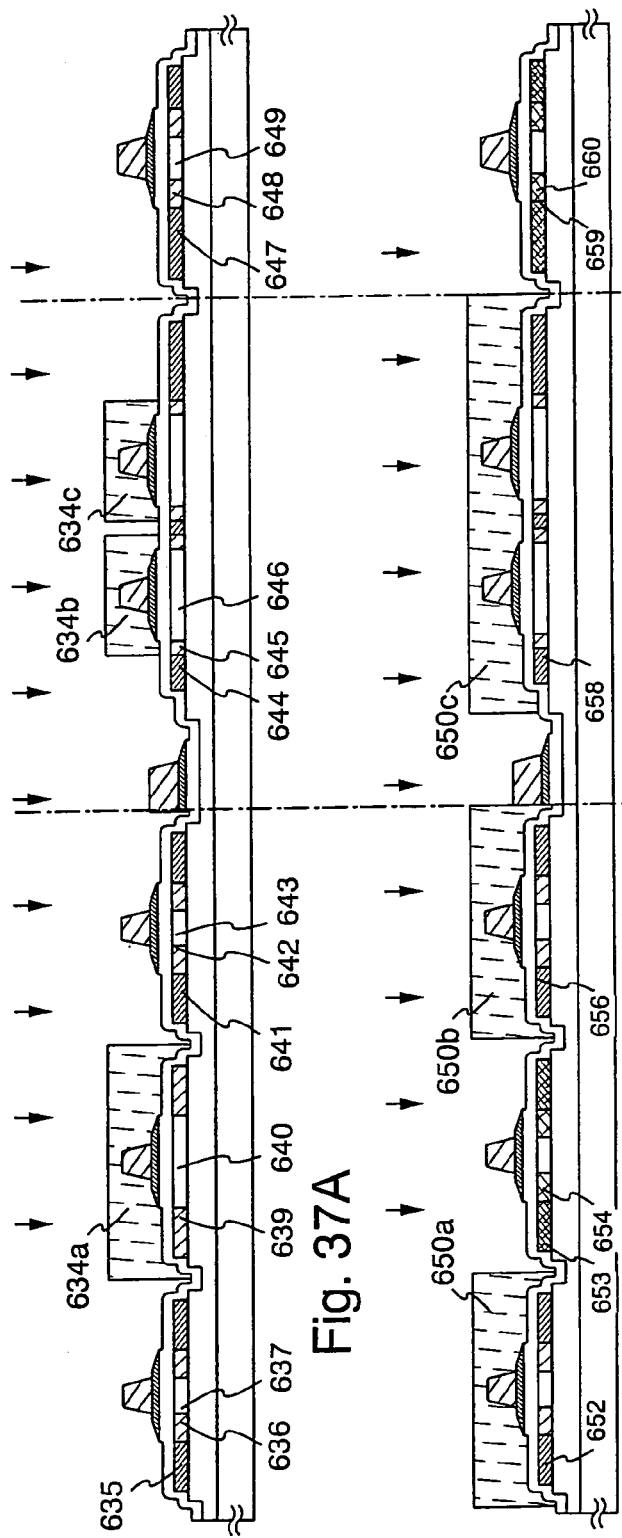

SEMICONDUCTOR THIN FILM DEVICE

BACKGROUND OF THE INVENTION

1. Technical Field of the Invention

This invention relates to a semiconductor device configured by using a semiconductor film having a crystal structure and concerned with a semiconductor device using field-effect transistors, particularly thin-film transistors, by the use of a crystalline semiconductor film crystally grown on an insulation surface. The invention also relates to a semiconductor device production system for crystallizing or activation of after ion implant, with the use of laser light.

2. Description of the Related Arts

There is known an art for crystallizing, by a laser process, an amorphous semiconductor film formed on a substrate of glass or the like. Laser process refers to an art for recrystallizing a damaged or amorphous layer formed on a semiconductor substrate or film, an art for crystallizing an amorphous semiconductor film formed on an insulation film, an art for improving the crystallinity of a semiconductor film having a crystal structure (crystalline semiconductor film), and so on. The laser oscillator for such laser processes uses a gas laser as represented in the excimer laser and a solid laser as represented in the YAG laser.

The use of a laser beam is characterized in that the region irradiated by a laser beam and absorbing the energy thereof can be preferentially heated up, as compared with the heating process utilizing radiation or conduction heating. For example, the laser process using an excimer laser oscillator oscillating a wavelength of 400 nm or shorter of ultraviolet light preferentially and locally heats up a semiconductor film, realizing the crystallization and activation process of a semiconductor film without causing less thermal damage to the glass substrate.

Laser processes includes those to poly-crystallize an amorphous semiconductor film without placing into a fully melt state by a high-speed scanning at a scanning speed of laser beam spot diameter×5000 per second or higher as disclosed in Patent Document 1 for example, and those to irradiate an extended laser beam to an island-formed semiconductor region to form substantially a single crystal region as disclosed in Patent Document 2 for example. Besides, there is known a method for forming the beam into a linear form by an optical system of a laser processing apparatus as disclosed in Patent Document 3.

[Patent Document 1]
JP-A-104117/1987 (page 92)
[Patent Document 2]
U.S. Pat. No. 4,330,363 (FIG. 4)
[Patent Document 3]
JP-A-195357/1996 (pages 3-4, FIGS. 1-5)

Furthermore, there is disclosed an art of crystallization using a solid laser oscillator of $YVO_4$ laser or the like in Patent Document 4, for example. In this publication, the second harmonic of laser beam emitted from the solid laser oscillator is used to obtain a crystalline semiconductor film having a greater crystal grain size as compared to the conventional, showing the application to thin film transistors (hereinafter described TFTs).

[Patent Document 4]
JP-A-2001-144027 (page 4)

Meanwhile Non-patent Document 1 also reports on such an application to the thin film transistors (hereinafter described TFTs) in an crystallization art using a solid laser oscillator. This uses the second harmonic of a diode-excited solid continuous-oscillation laser ($YVO_4$) to crystallize an amorphous silicon film, showing a result of TFT fabrication using the same.

A. Hara, F. Takeuchi, M. Takei, K. Yoshino, K. Suga and N. Sasaki, "Ultra-high Performance Poly-Si TFTs on a. Glass by a Stable Scanning CW Laser Lateral Crystallization", AMLCD '01 Tech. Dig., 2001, pp. 227-230.

To begin with, it has been considered, in order to improve TFT characteristics, crystallinity improvement is requisite for the active layer thereof (herein referring to the semiconductor film forming the channel region or source and drain regions).

An attempt has being made for a long time to form a single-crystal semiconductor film on an insulation surface. There is devised an art called graphoepitaxy as a more active trial. Graphoepitaxy is a technique to form a step on a surface of a quartz substrate. After forming an amorphous or polycrystal semiconductor film on that, this is heated by a laser beam or heater to form a growth layer in an epitaxial fashion by utilizing, as a nucleus, the step form formed on the quartz substrate. This art is disclosed, e.g. in Non-patent Document 2.

[Non-patent Document 2]
J. Vac. Sci. Technol., "Grapho-epitaxy of silicon on fused silica using surface micropatterns and laser crystallization", 16(6), 1979, pp 1640-1643.

Meanwhile, Non-patent Document 3 also discloses a technique of semiconductor film crystallization called graphoepitaxy. This is an attempt on epi-growth of a semiconductor film through the inducement of a surface relief grating on amorphous substrate surface artificially made. The Non-patent Document 3 discloses that the graphoepitaxy technique is to provide a step on an insulation film surface and subjecting a process of heating or laser light irradiation to the semiconductor film formed on the insulation film thereby epitaxially growing the crystal in the semiconductor film.

[Non-patent Document 3]
M. W. Geis, et al., "CRYSTALLINE SILICON ON INSULATORS BY GRAPHOEPITAXY" Technical Digest of International Electron Devices Meeting, 1979, pp. 210.

However, for forming a quality crystalline semiconductor film fewer in defects or grain boundaries and aligned in orientation, particularly a single-crystal semiconductor film, on an insulation surface, the mainstream is in the method to heating a semiconductor film to a high temperature into a melt state and then recrystallize it as known by the zone melting scheme.

In the known graphoepitaxy technique, because an underlying step is utilized, a crystal grows along the step. It has been considered problematic that the step is left on a surface of a single-crystal semiconductor film formed. Also, it has been impossible to form, using graphoepitaxy, a single-crystal semiconductor film on a large-sized glass substrate comparatively low in strain point.

In any case, it has been impossible to form a crystalline semiconductor film fewer in defects, due to semiconductor volume contraction caused by crystallization, thermal stress or lattice mismatch with the underlying layer and so on. Also, position control could not be done so as to determine and form a region for accumulating strains and causing defects to an outside of a device forming region. From the above reasons, where omitting a bonded SOI (silicon on insulator), it has been impossible to obtain, by using a crystalline semiconductor film formed on an insulation surface, a quality equivalent to the MOS transistors formed on a single-crystal substrate.

The present invention has been made in view of the foregoing problems. It is an object to provide a semiconductor device to form an uniform crystalline semiconductor film, particularly preferably a single-crystal semiconductor film, on a glass substrate low in strain point thereby providing a semiconductor device configured with semiconductor elements high in operating speed and current driving capability.

Meanwhile, recently the art for forming TFTs on a substrate has greatly advanced to put forward the development for applying it to the active-matrix semiconductor device. Particularly, the TFT using a polycrystal semiconductor film has higher field-effect mobility (also called mobility) than the TFT using the conventional amorphous semiconductor film, and hence is operable at high speed. This makes it possible to implement pixel control, conventionally done by a drive circuit provided outside the substrate, by a drive circuit provided on the same substrate as the pixels.

In the meanwhile, concerning the substrate used for a semiconductor device, the glass substrate is considered hopeful rather than the single-crystal silicon substrate in respect of cost. The glass substrate is less resistive to heat and ready to be thermally deformed. Consequently, in the case polysilicon TFTs are formed on the glass substrate, the use of laser anneal for semiconductor film crystallization is much effective in avoiding thermal deformation of the glass substrate.

The features of laser anneal include great reduction in process time as compared with the anneal scheme utilizing radiation or conduction heating and less thermal damage to the substrate because of preferential, local heating the semiconductor or semiconductor film.

Incidentally, the laser anneal process herein refers to an art to recrystallize a damaged layer formed in a semiconductor substrate or film or an art to crystallize the semiconductor film formed on the substrate. Also, included is the art to be applied for planarizing or surface-quality-improving a semiconductor substrate or film. The laser oscillator applied is a gas laser oscillator as represented by the excimer laser or a solid laser oscillator as represented by the YAG laser. These are known as those for heating up a semiconductor surface layer for an extremely brief time of from approximately several tens nano-seconds to several tens micro-seconds by laser light irradiation thus causing crystallization.

The lasers are roughly divided into two, i.e. pulse oscillation and continuous oscillation, according to oscillation scheme. The pulse oscillation laser, having a comparatively high output energy, can increase producibility with a laser-beam size increased to several $cm^2$ or greater. Particularly, in case the laser beam form is worked by using an optical system into a linear form having a length of 10 cm or greater, laser light irradiation can be effective for the substrate, thereby further increasing producibility. Consequently, in semiconductor film crystallization, the main stream has gradually been on a trend to use a pulse oscillation laser.

However, recently it has been found, in semiconductor film crystallization, that the use of a continuous oscillation laser, rather than a pulse oscillation laser, provides the greater grain size of crystal formed in a semiconductor film. With a greater crystal grain size in the semiconductor film, the TFT formed using the semiconductor film has an increased mobility to suppress TFT characteristic variation. For this reason, attentions have been abrupt drawn to the continuous oscillation laser.

The crystalline semiconductor film, formed by using a laser anneal process roughly divided into pulse and continuous oscillations, is generally formed with gathering of a plurality of crystal grains. The crystal grains are random in position and size. It is difficult to form a crystalline semiconductor film by designating a position and size of crystal grains. Consequently, there are cases that crystal grain interfaces (grain boundaries) exist in an active layer formed by patterning the crystalline semiconductor into an island form.

Unlike the inside of a crystal grain, a countless number of recombination and trap centers exist at the grain boundary that are caused by amorphous structure or crystal defects. It is known that, in case a carrier is trapped in the trap center, the potential on the grain boundary rises into a barrier against the carrier hence lowering the carrier's current transport characteristic. Accordingly, in case there is a grain boundary in the TFT active layer, particularly channel region, it has a serious effect upon the TFT characteristic, e.g. conspicuous lowering in TFT mobility, on-current decrease, or off-current increase due to current flow at the grain boundary. Meanwhile, in a plurality of TFTs fabricated on the assumption to obtain the same characteristic, there encounters characteristic variation depending upon a presence or absence of grain boundaries in the active layer.

The fact that, when irradiating laser light to a semiconductor film, the crystal grains obtained are random in position and size because of the following reason. A certain degree of time is required in causing solid phase nucleation within a liquid semiconductor film fully melted by laser light irradiation. As time elapses, a countless number of crystal nuclei occur in the fully melted region to grow crystals at the crystal nuclei. Because the position such a crystal nucleus occurs is random, crystal nuclei distribute unevenly. Since crystal growth ends where crystal grains push against one another, the crystal grains are random in position and size.

For this reason, although the channel region having an great effect upon TFT characteristic is ideally formed with a single crystal grain by excluding the influence of grain boundaries, it has been almost impossible to form an amorphous silicon film free of grain boundaries by a laser anneal scheme. Consequently, up to the present, there has never been obtained a TFT having as an active layer a crystalline silicon film crystallized by using the laser anneal process that is equivalent in characteristic to the MOS transistor fabricated on a single-crystal silicon substrate.

It is a problem of the present invention to provide, in view of the foregoing problem, a semiconductor device production system using a laser crystallization method capable of preventing grain boundaries from forming in a TFT channel region and further preventing conspicuous lowering in TFT mobility due to grain boundaries, on-current decrease or off-current increase.

SUMMARY OF THE INVENTION

In order to solve the foregoing problem, the present invention forms an amorphous or crystalline semiconductor film on an underlying insulation film having a rectangular or stripe-like step form formed by layering a plurality of insulation films or by lithography on an insulation film, so that it is crystallized by laser beam irradiation to leave a crystalline semiconductor film at least on a convex part (projection part) of underlying insulation film whereby a TFT is formed such that its channel region is arranged in the crystalline semiconductor film. The channel region is provided extending in a lengthwise direction on the convex part (projection part) of the rectangular or stripe-like step form.

The underlying insulation film having a step form is formed by using silicon nitride, silicon oxide, silicon nitride oxide or silicon oxide nitride. The step form may be formed by etching the film or layering a plurality of films. Note that, in the present invention, silicon nitride is assumably considered containing an oxygen concentration of 20 atomic % or higher and 30 atomic % or lower, a nitrogen concentration of 20 atomic % or higher and 30 atomic % or lower, and a hydrogen concentration of 10 atomic % or higher and 20 atomic % or lower. Also, silicon oxide nitride is assumably considered containing an oxygen concentration of 55 atomic % or higher and 65 atomic % or lower, a nitrogen concentration of 1 atomic % or higher and 20 atomic % or lower, and a hydrogen concentration of 0.1 atomic % or higher and 10 atomic % or lower.

The structure forming the rectangular or stripe-like step form has a first insulation film formed of silicon nitride or silicon nitride oxide over the entire substrate surface and a second insulation film formed thereon of silicon oxide or silicon oxide nitride in a rectangular or stripe-like pattern Otherwise, a second insulation film is formed of silicon oxide nitride on the entire surface on a first insulation film formed of silicon nitride, silicon oxide, silicon nitride oxide or silicon oxide nitride in a rectangular or stripe-formed pattern.

Although the silicon nitride film, in nature, has a favorable block property against impurity ions or the like, it has great stress. In case a crystalline semiconductor film is formed on that, strain is unfavorably formed by the action of stress. A silicon oxide nitride film has a comparatively small internal stress and hence a well adhesion at an interface with a crystalline semiconductor film, reducing the interface state density. However, there is no block effect against impurities. The silicon nitride oxide film has an enhanced nitrogen content ratio to relax stress by oxygen content while providing blockability. The silicon oxide nitride film has a property having both the characteristic as silicon oxide and the blockability against impurities as seen in silicon nitride. This has the internal stress controlled comparatively small and hence is suited as an underlying insulation film contacting with a semiconductor film.

The step form is formed to a TFT arrangement on the substrate surface, which does not require a regular periodic pattern. In the invention, the step form formed on the underlying insulation film effectively serves for the purpose of locally concentrating the stress upon volume contraction due to crystallization not to apply stress/strain to the active layer of a semiconductor device, particularly channel region.

It is known that volume contraction occurs due to atom rearrangement or contained hydrogen separation in the process of crystallizing an amorphous semiconductor film. The percentage is considered to be approximately 0.1-1% though depending upon forming condition of the amorphous semiconductor film. As a result, tensile stress occurs in the crystalline semiconductor film, the magnitude of which presumably reach approximately $1 \times 10^{10}$ dyn/cm$^2$. This is conspicuous in an amorphous silicon film containing hydrogen or the like. It is to be considered that similar phenomenon occurs also in recrystallizing a crystalline semiconductor film. The stress upon crystallization concentrates to the sep region and stored as internal stress or to be confirmed as crack.

Of course, the region accumulated with the strain is not considered unapplicable at all. Channel regions may be provided in a crystalline semiconductor formed on the respective convex parts (projection parts) on an underlying insulation film having a plurality of rectangular or stripe-like step forms, wherein a source and a drain regions may be formed using another region of semiconductor film.

For crystallization utilizing the step form formed on the underlying insulation film, laser beam is irradiated which is focused into a linear form and has, as a light source, a continuous oscillation laser oscillator. The laser beam desirably has an intensity distribution having a uniform energy density distribution in a major axis direction. In a minor-axis direction, it may be in an arbitrary distribution, e.g. may have a distribution such as the Gaussian distribution. Laser process is carried out with scanning in a direction intersecting the major-axis direction of a continuous oscillation laser beam focused in a linear form. At this time, crystal growth parallel with the scanning direction is made possible by having a uniform intensity distribution in the major axis direction. Namely, in case there is a nonuniform energy density distribution in the major-axis direction, temperature gradient occurs within an irradiation region. This results in forming a crystal having extending crystal boundaries extension relying on that. Namely, this makes it impossible to extend grain boundaries in a direction parallel with the scanning direction.

The light source for a continuous oscillation laser beam is a rectangular-beam solid laser oscillator, typically a slab laser oscillator applicable.

By laser beam irradiation, the semiconductor film is nearly preferentially heated up when a light absorption coefficient is suitable. The semiconductor fused by laser beam irradiation crystallizes in the course of solidification. However, there is a difference in thermal capacity due to the presence of the step form on the underlying insulation film so that cooling rate is low on the convex part (projection parts). This can achieve the increase of crystal grain size.

The crystal in the rectangular semiconductor region, to provide a channel region, extends in a direction parallel with the channel length direction or has a feature that crystal orientation is in alignment.

Namely, in the region to form a TFT channel region, a quality crystal can be preferentially used by being formed on the convex part (projection part) of underlying insulation film. Otherwise, the strain region, at which stress is to concentrate maximally in the step region, can be excluded out of the channel region.

With this structure, by arranging a plurality of rectangular semiconductor regions in parallel and provided between a pair of source and drain regions to form one transistor, characteristic variation can be reduced between the elements. Also, the use of only a quality crystal can improve the field-effect mobility.

Note that the amorphous semiconductor film referred in the invention includes not only that having a perfect amorphous structure in a narrow sense but also a state containing fine crystal grains or what is called fine crystal semiconductor film and a semiconductor film locally including a crystal structure. Typically, an amorphous silicon film is to be applied. Besides, applicable are an amorphous silicon-germanium film, an amorphous silicon-carbide film and the like.

Meanwhile, the present inventors have found that the direction of a stress caused in the semiconductor film has close bearing on the position and direction of grain boundaries in the course of crystallizing the semiconductor film by laser light irradiation. FIG. 1 shows a TEM sectional view taken in a direction perpendicular to a scanning direction of laser light when continuous oscillation laser light is irradiated at a scanning speed of 5 cm/sec to a 200-nm amorphous semiconductor film. In FIG. 1A, 10a, 10b and 10c are crystal grain boundaries having a random width thereof in a direction perpendicular to the scanning direction.

FIG. 1B typically shows a TEM sectional image shown in FIG. 1A. As shown in FIG. 1B, there can be seen rises on the semiconductor film 102 at between the grain boundary 10a and the grain boundary 10b and between the grain boundary 10b and the grain boundary 10c. The present inventors have considered that this is because of possible stress application of from a vicinity of grain boundary toward a crystal grain center in a direction parallel with the substrate.

Consequently, the present inventors have considered that, by intentionally forming a stress concentrated region in the semiconductor film, the position at which a grain boundary is to be formed could be preferentially defined. In the invention, by forming an insulation film having concavo-convex on a substrate and a semiconductor film on the insulation film, preferentially formed is a region at which stress is concentratedly applied upon crystallizing with laser light. Specifically, a stripe-formed or rectangular concavo-convex is provided on the semiconductor film. Laser light in continuous oscillation is irradiated to along the stripe concavo-convex formed on the semiconductor film or along a lengthwise or transverse direction of the rectangle. In this case, the use of continuous oscillation laser light is best preferred but pulse oscillation laser light may be used. The energy density shape of laser-light, in a direction vertical to the laser-light scanning direction, may be rectangular, triangular or trapezoidal in section.

During crystallization with laser light irradiation, stress concentration occurs in a vicinity of concave-part (depression part) or convex-part (projection part) edge of the semiconductor film to preferentially form grain boundaries. Because in a vicinity of convex-part (projection part) or concave-part (depression part) center, stress is small as compared to that in the vicinity of concave-part (depression part) or convex-part (projection part) edge of the semiconductor film, grain boundaries are less formed. If formed, because there is increase in grain size, excellent crystallinity is to be obtained.

In the invention, after crystallization with laser light, concave-part (depression part) or convex-part (projection part) edge and its vicinity of semiconductor film is removed by patterning to actively use, as a TFT active layer, the region excellent in crystallinity in the vicinity of the convex-part (projection part) center. This can prevent grain boundaries from forming in the TFT channel region, and further prevent conspicuous lowering in TFT mobility due to grain boundaries, on-current decrease or off-current increase. Note that the designer is allowed to properly define to what region the convex-part (projection part) edge and its vicinity are to be removed by patterning.

Incidentally, it is often the case that, in a vicinity of a laser-beam edge of laser light, energy density is generally lower as compared to that in the vicinity of the center to give deteriorated crystallinity to the semiconductor film. Consequently, during scanning laser light, there is a need to avoid an overlap between a region subsequently formed into a TFT channel region, more preferably a semiconductor film convex part (projection part), and an edge of the path thereof.

Accordingly, in a production system of the present invention, the geometrical data (pattern information) of an insulation or semiconductor film as viewed from the above of the substrate obtained in a design stage is stored to storage means. Then, a scanning route of laser light is determined from the pattern information and a width of laser light vertical to a scanning direction of laser beam such that an overlap is avoided at least between the region to be formed into a TFT channel region and an edge of a laser light path. With reference to a marker, the substrate is aligned in position to irradiate laser light to the semiconductor film on the substrate according to a determined scanning route.

The above configuration can scan laser light at least only to a requisite region instead of irradiating laser light to throughout the substrate entirety. Accordingly, it is possible to omit the time for irradiating laser light to unnecessity regions and hence to shorten the time required in laser light irradiation and increase substrate process rate. It is also possible to prevent the substrate from being damaged due to irradiation of laser light to the unnecessity region thereof.

Incidentally, the marker may be formed by directly etching the substrate due to laser light or the like. Otherwise, the marker may be formed on part of the insulation film during forming an insulation film having a concavo-convex. Meanwhile, the geometry of an insulation or semiconductor film actually formed may be read out by using an imaging device such as a CCD and stored as data to first storing means. The pattern information of an insulation or semiconductor film obtained in a design stage is stored to second storing means. By collating between the data stored in the first storing means and the pattern information stored in the second storing means, the substrate may be aligned.

In the case of reading out a geometry of semiconductor film, there is not necessarily coincidence between the semiconductor film geometry and the insulation film mask because the semiconductor film itself has a film thickness. Accordingly, collation is made with the pattern information by taking a semiconductor film thickness into computation. Meanwhile, there is not necessarily a need to grasp a geometry by using a CCD. For example, the laser light emitted from a laser diode may be irradiated to the insulation or semiconductor film so that a geometry can be grasped by monitoring reflection light.

By forming on a part of an insulation film or using a geometry of the insulation film as a marker, it is possible to decrease by one sheet of masks for marker. Furthermore, a marker can be formed in a correct position rather than the case of forming it on the substrate by laser light, thus improving the accuracy of alignment.

Incidentally, the energy density of a laser beam of laser light is generally not uniform but varies in height depending on a position within the laser beam. In the invention, there is a need to irradiate a constant energy density of laser light to minimally a region to be made into a channel region, preferably the entire of convex flat surface. Consequently, the invention requires to use a laser beam having such an energy density distribution that a uniform energy density region is to perfectly overlap with minimally a region to be made into a channel region, more preferably the entire of convex flat surface. In order to fulfill the condition of energy density, it is considered to make a laser beam into a rectangular or linear form.

Furthermore, the low energy density region of laser beam may be shaded through a slit. The use of a slit makes it possible to irradiate a comparatively uniform energy density of laser light onto the entire of convex flat surface, enabling uniform crystallization. Also, by providing a slit, the laser beam width can be partially varied according to the pattern information of insulation or semiconductor film, reducing the restriction in laying out channel regions and TFT active layers. Note that the laser beam width means a length of laser beam in a direction vertical to the scanning direction.

Meanwhile, one laser beam obtained by combining ones of laser light oscillated from a plurality of laser oscillators may be used in laser crystallization. The above configuration can compensate for energy-density weak regions in each of the laser light.

Meanwhile, after forming a semiconductor film, laser light may be irradiated to crystallize the semiconductor film in a manner not to expose it to the air (e.g. in a specified gas atmosphere of inert gas, nitrogen or oxygen, or in a low pressure atmosphere). With the above configuration, it is possible to prevent a molecular level of contaminant substance present within a clean room, e.g. boron or the like contained in a filter for enhancing air cleanness, from mixing into a semiconductor film during crystallization with laser light.

In a semiconductor-film crystallization technique called graphoepitaxy described in the Non-patent Document 2 or 3, epitaxial growth requires a temperature of at least approximately 700° C. When carrying out epitaxial growth on a glass substrate, grain boundaries are formed in a semiconductor film in a region close toga convex edge of insulation film. In the invention, a mask for an island is laid out. The convex form and edge position of an insulation film is designed to an island layout in order to enhance the crystallinity in a region to be made into an island. Specifically, the convex part (projection part) is defined in form, size and the like to avoid an overlap between the convex edge and the island. Using an insulation film designed to the island layout, a semiconductor film is formed that is intentionally formed with grain boundaries in the vicinity of the edge. Then, the region of semiconductor film close to the edge, where many grain boundaries exist, is removed by patterning to use, as an island, a region comparatively excellent in crystallinity. Accordingly, the art disclosed in the invention is identical to the conventional graphoepitaxy in that a semiconductor film is formed on a stepped insulation film to crystallize the semiconductor film by the use of the step. The conventional graphoepitaxy does not include the concept that a step is used to control the position of grain boundaries thereby reducing the grain boundary in the island. Thus, this is quite different from the invention.

BRIEF DESCRIPTION OF THE DRAWINGS

FIGS. 34A and 34B and 34C and 34D are a top view and sectional views of a TFT formed by using the insulation film shown in FIG. 13B;

FIGS. 36A, 36B and 36C are views showing a method for manufacturing a semiconductor device using the invention;

FIGS. 37A, 37B and 37C are views showing a method for manufacturing a semiconductor device using the invention;

DETAILED DESCRIPTION OF THE PREFERRED EMBODIMENTS

Figure 1A:
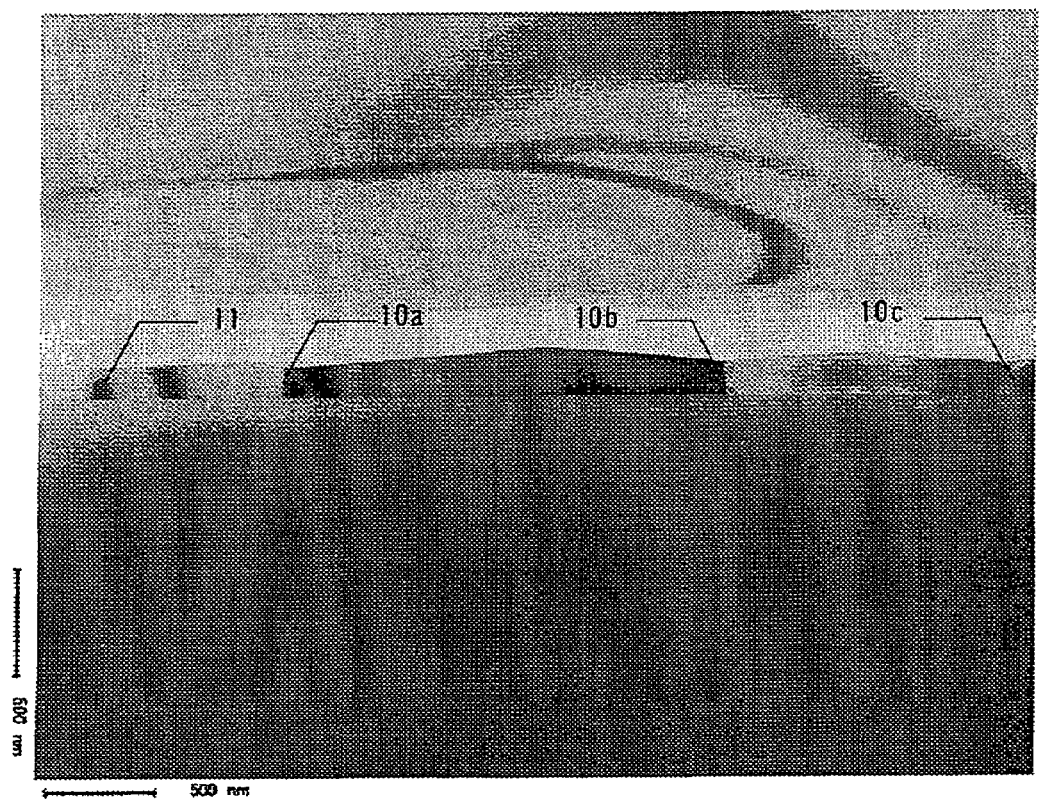
FIG. 1A is a view typically showing a TEM sectional image, and 1B is a sectional view of a crystallized semiconductor film.
Figure 1B:
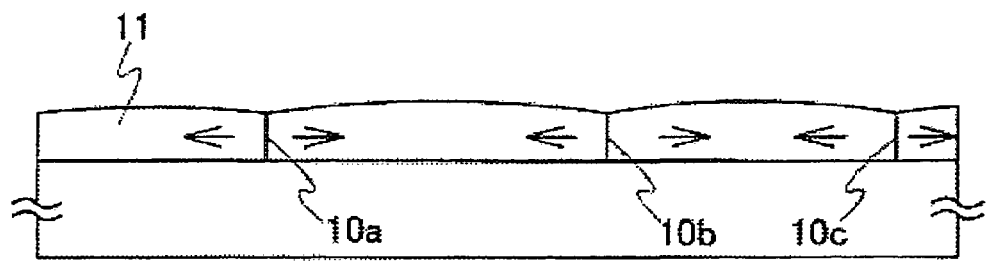
Figure 2:
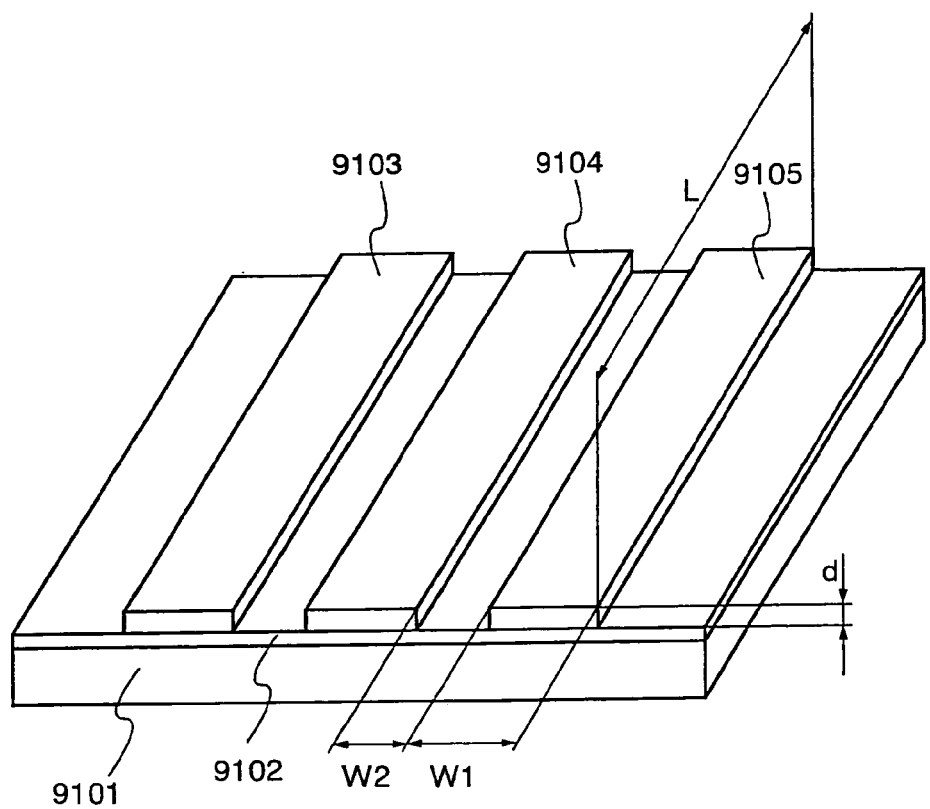
FIG. 2 is a perspective view explaining a structure and manufacturing method of a semiconductor device of the invention.
Figure 3:
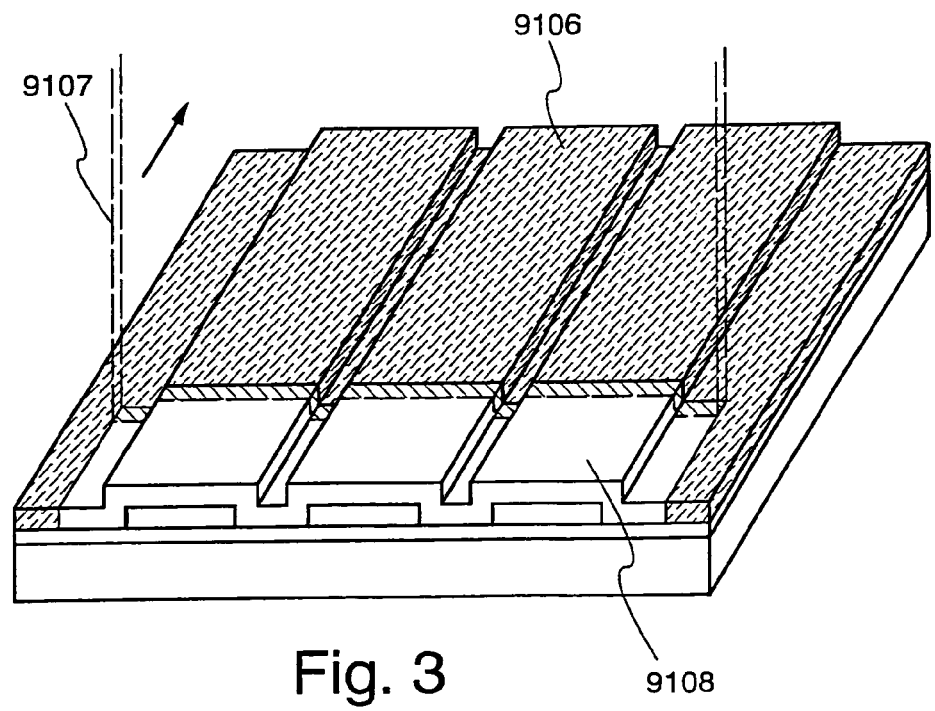
FIG. 3 is a perspective view explaining a structure and manufacturing method of a semiconductor device of the invention.

Embodiments of the present invention will now be explained with reference to the drawings. FIG. 2 is a perspective view showing a form having, on a substrate 9101, a first insulation film 9102, as an underlying insulation film, and second insulation films 9103-9105 patterned in a stripe-form. Although three stripe patterns of second insulation film are shown herein, the number is, of course, not limited to that. The substrate can be applied with a marketed non-alkali glass substrate, a quartz substrate, a sapphire substrate, a substrate coating an insulation film on the surface of a single-crystal or polycrystal semiconductor substrate, or a substrate coating an, insulation film on the surface of a metal substrate.

The second insulation film in the stripe-form suitably has a width W1 of 1-10 µm, a spacing W2 between the adjacent second insulation films of 0.5-10 µm, and a thickness d of 0.05-0.5 µm. The step form is not required in a regular periodic pattern but may be desirably arranged matchedly to semiconductor elements, such as TFTs. The length L of the second insulation film is not limited but may be satisfactory if the length allows to form a TFT channel region, for example.

The material of the first insulation film is silicon nitride or silicon oxide nitride. For a silicon nitride oxide film, oxygen concentration contained is 20 atomic % or higher and 30 atomic % or lower, nitrogen concentration is 20 atomic % or higher and 30 atomic % or lower, and hydrogen concentration is 10 atomic % or higher and 20 atomic % or lower. Otherwise, the composition ratio of nitrogen to oxygen is 0.6 or higher and 1.5 or lower. Density is $8 \times 10^{22}/cm^3$ or higher and $2 \times 10^{23}/cm^3$ or lower. The applicable etching rate, at 20° C. in a mixture solution containing 7.13% of ammonium hydrogen fluoride ($NH_4HF_2$) and 15.4% of ammonium fluoride ($NH_4F$), is 60-70 nm/min (40-50 nm/min after a thermal process at 500° C., 1 hour+550° C., for 4 hours). Such a silicon nitride oxide film can be formed using, as material, $SiH_4$, $NH_2$ and $N_2O$ and through a plasma CVD process.

The material of the second insulation film is silicon nitride or silicon oxide nitride. Silicon oxide can be formed by mixing Tetraethyl Ortho Silicate (TEOS) and $O_2$ and through a plasma CVD process. For a silicon oxide nitride film, oxygen concentration contained is 55 atomic % or higher and 65 atomic % or lower, nitrogen concentration is 1 atomic % or higher and 20 atomic % or lower, and hydrogen concentration is 0.1 atomic % or higher and 10 atomic % or lower. Density is $6 \times 10^{22}/cm^3$ or higher and $9 \times 10^{22}/cm^3$ or lower. The etching rate, at 20° C. in a mixture solution containing 7.13% of ammonium hydrogen fluoride ($NH_4HF_2$) and 15.4% of ammonium fluoride ($NH_4F$), is 110-130 nm/min (90-100 nm/min after a thermal process at 500° C., 1 hour+550° C., for 4 hours). Note that the etching rate defined herein is a value to be obtained, at 20° C., with using a solution, as an etching solution, containing 7.13% of $NH_4HF_2$ and 15.4% of $NH_4F$. Such a silicon oxide nitride film can be formed by using, as material, $SiH_4$ and $N_2O$ and through a plasma CVD process.

The angle of a step sidewall formed by the second insulation film, may be appropriately set in a range of 5-120 degrees. The sectional form may be a saw-teethed concavo/convex form, besides the rectangular concavo/convex form.

Figure 29A:
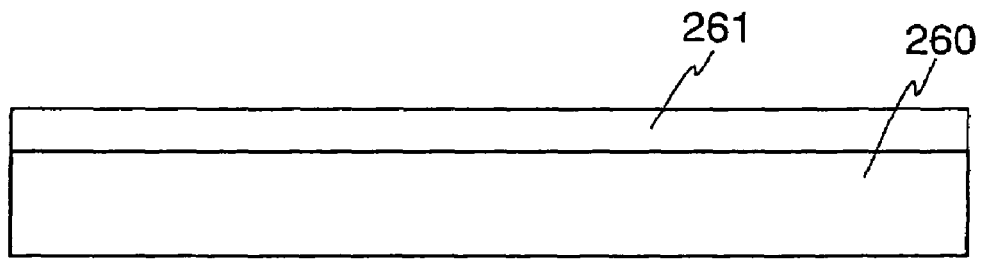
FIGS. 29A, 29B and 29C are views showing a method for forming an insulation film having a concavo-convex.
Figure 29B:
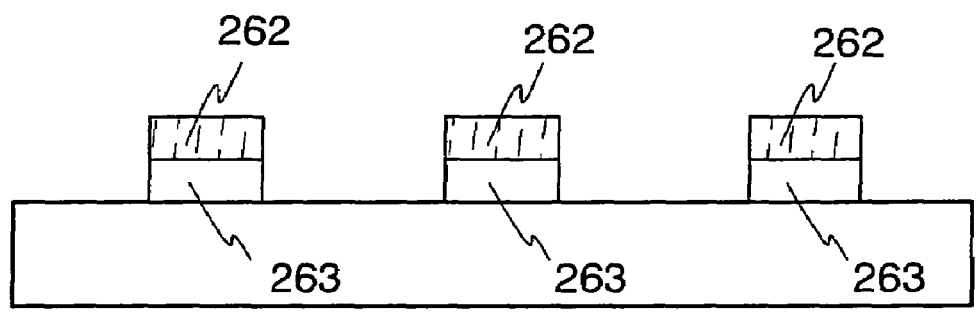
Figure 29C:
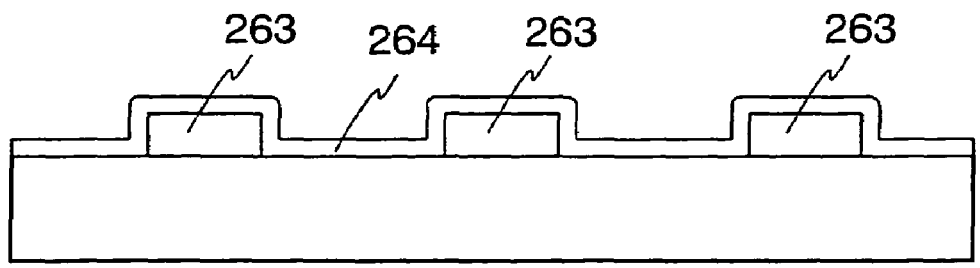

As shown in FIG. 29, an amorphous semiconductor film 9106 is formed in a thickness of 50-200 nm on the underlying layer, formed by the first insulation film 9102 and second insulation film 9103-9105, to cover on a convex part (projection part), convex bottom and step side surface. The material of the amorphous semiconductor film can be silicon, a compound or alloy of silicon and germanium, or a compound or alloy of silicon and carbon. Among these, silicon is the best suited material.

The amorphous semiconductor film 9106 is crystallized by irradiating a continuous-oscillation laser beam 9107. Numeral 9107 denotes crystallized semiconductor film. The laser beam to be applied is in a linear form focused by an optical system. The intensity distribution may have a uniform region in a major-axis direction and a distribution in a minor-axis direction. The laser oscillator for use as a light source is a rectangular-beam solid laser oscillator, especially preferably a slab laser oscillator. Otherwise, a solid laser oscillator is applicable using a rod doped with Nd, Tm or Ho. Particularly, it may be a combination of a slab-structure amplifier with a solid laser oscillator using a crystal of YAG, $YVO_4$, YLF or $YAlO_3$ doped with Nd, Tm or Ho. As shown by the arrow in the figure, scanning is in a direction transverse to a linear lengthwise direction. In this case, scanning is the most desirable in a direction parallel with a lengthwise direction of the stripe pattern formed in the underlying insulation film. Note that the linear form herein refers to that having a ratio of lengthwise length to transverse length of 1:10 or greater.

The slab material uses a crystal of Nd:YAG, Nd:GGG (gadolinium·gallium·garnet), Nd:GsGG (gadolinium·scandium·gallium·garnet) or the like. In the case of a slab laser, traveling is along a zigzag optical path while repeating total reflection within the plate-like laser medium.

Meanwhile, the wavelength of a continuous oscillation laser beam is desirably 400-700 nm in consideration of an light absorption coefficient of amorphous semiconductor film. Such a wavelength band of light is to be obtained by extracting the second or third harmonic of a basic wave by the use of a wavelength changer device. The wavelength changer device is applied by ADP (ammonium dihydrogenphosphate), $Ba_2NaNb_5O_{15}$ (barium sodium niobate), CdSe (selenium-cadmium), KDP (potassium dihydrogenphosphate), $LiNbO_3$ (lithium niobate), Se, Te, LBO, BBO, KB5 or the like. Particularly, LBO is desirably used. In a typical example, used is the second harmonic (532 nm) of an $Nd:YVO_4$ laser oscillator (basic wave: 1064 nm). Also, for laser oscillation mode, applied is a single mode as a $TEM_{00}$ mode.

In the case of silicon selected as an optimal material, the region having an absorption coefficient $10^3$-$10^4$ $cm^{-1}$ falls nearly within a visible portion of light. In crystallizing an amorphous semiconductor film formed of a silicon in a thickness of 30-200 nm on a substrate of glass or the like having a high transparency for visible portion of light, by irradiating a visible portion of light having a wavelength of 400-700 nm, the semiconductor region can be selectively heated and crystallized without causing damage to the underlying layer. Specifically, for an amorphous silicon film, the light with a wavelength 532 nm has an intrusion length of approximately 100 nm-1000 nm and can fully reach an interior of an amorphous semiconductor film 9106 formed in a film thickness of 30-200 nm. Namely, heating is possible at an inside of the semiconductor film. The semiconductor film in a laser-beam irradiation region can be heated up evenly in almost the entire thereof.

Figure 4A:
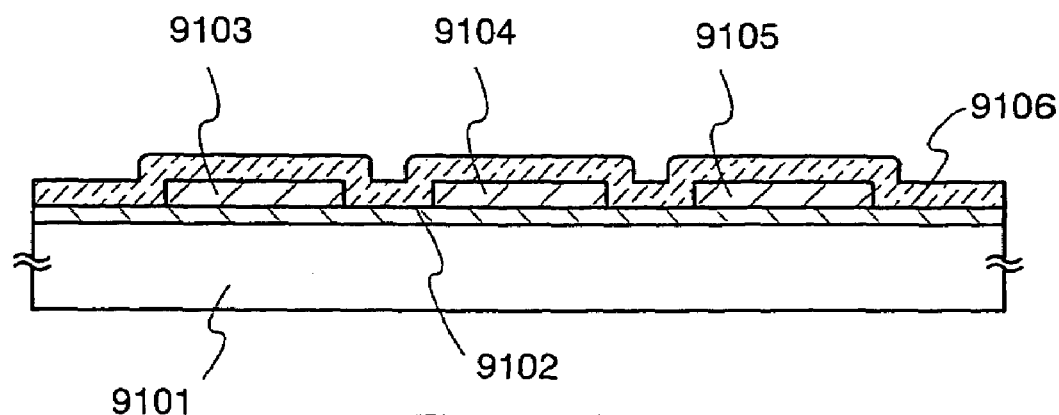
FIGS. 4A and 4B are vertical sectional views explaining the detail of a crystallization process of the invention.
Figure 4B:
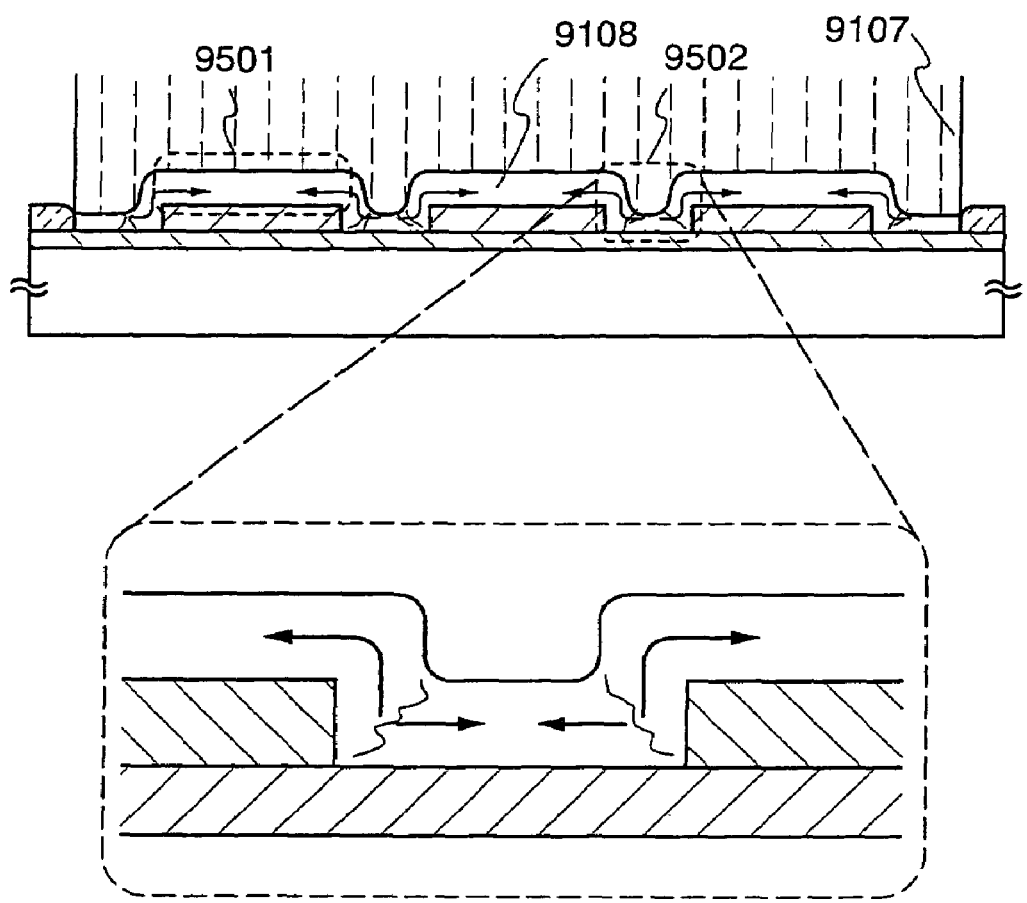

FIG. 4 explains such a crystallization process by a vertical sectional view. As shown in FIG. 4A, after forming a first insulation film 9102, second insulation films 9103-9105 and amorphous semiconductor film 9106 on the substrate 9101, crystallization is carried out by irradiating a laser beam 9107 as shown in FIG. 4B. It is considered that, in the crystallization, cool-down and solidification first begin at the boundary of between the first insulation film 9102 and the sidewall of second insulation films 9103-9105. Crystallization begins at that point to cause crystal growth toward the above of convex part (projection part). On the convex part (projection part), the first and second insulation films are layered to have a greater thermal capacity and hence a lower cooling rate as compared with the other region, making possible to crystal growth with a greater grain size. In the stepped region, a pulling force acts toward the direction of crystal growth. Due to the geometrical factor, strain concentrates to accumulate internal stress.

This manner is typically shown by enlarged view in FIG. 4B. In the crystalline semiconductor film 9108, there is a possibility that crystal quality is poor in the concave bottom 9502 where cooling rate is comparatively high and, in the stepped region, strain accumulates resulting in formation of cracks or the like. On the other hand, on the above of convex part (projection part) 9501, a crystalline semiconductor film is formed with a crystal relaxed in strain. It can be considered that, on the convex part (projection part), the crystalline semiconductor film is substantially formed with a single crystal or single crystal region.

Figure 5:
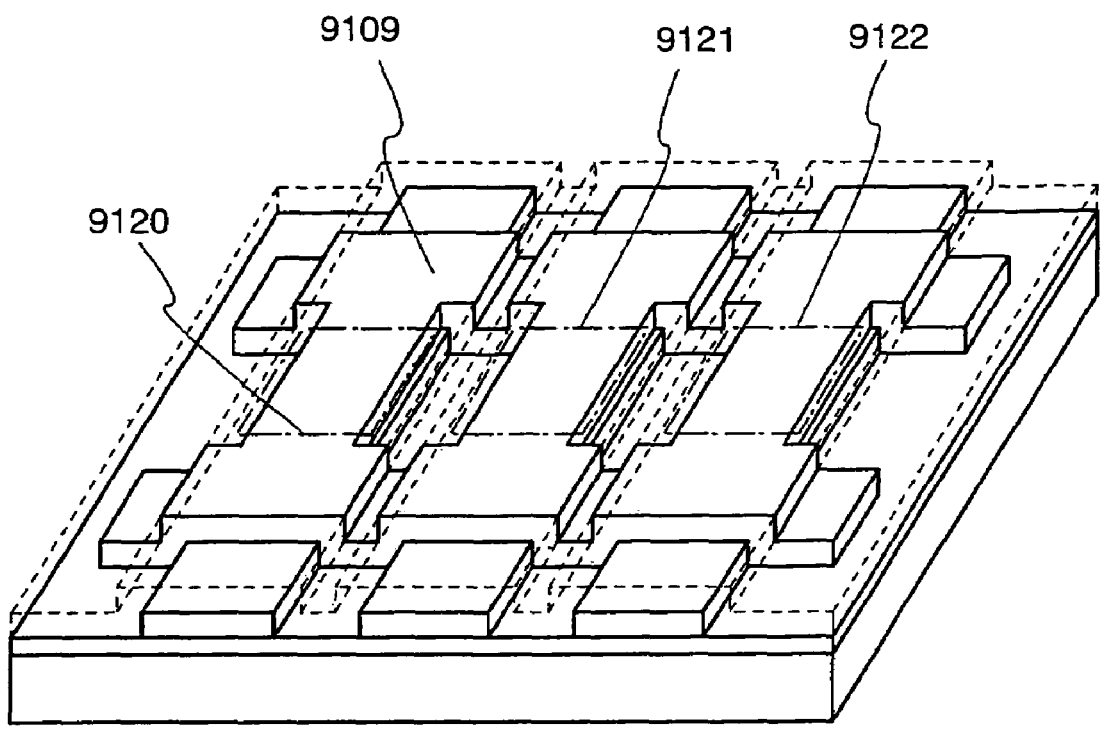
FIG. 5 is a perspective view explaining a structure and manufacturing method of a semiconductor device of the invention.

After crystallization, an active layer 9109 of crystalline semiconductor film is formed by etching, as shown in FIG. 5. In the active layer 9109, channel regions 9120-9122 (regions generally surrounded by the dotted lines) are provided on the convex part (projection part) of the underlying insulation film, i.e. on the second insulation film. The stepped part region, accumulated with grain boundaries and strains extending from the concave bottom, is removed for the crystal not to exist in the channel region.

The active layer 9109 shown in FIG. 5 is to be considered as a form which integrally forms a plurality of rectangular semiconductor regions (channel regions) arranged in parallel and a pair of semiconductor regions (source region and drain region) connecting between the rectangular semiconductor regions. In each of the plurality of rectangular semiconductor regions in the active layer, a channel region can be formed therein by providing the electrodes in an over relationship through an insulation film. There is a characteristic that crystals are aligned in orientation within the channel region.

Figure 6A:
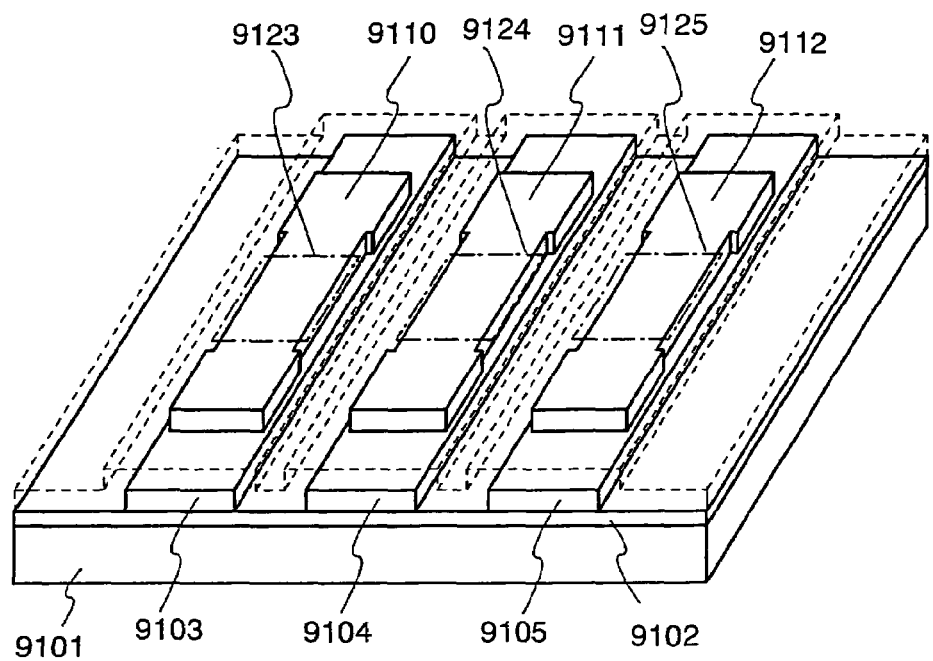
FIGS. 6A and 6B are perspective views explaining a structure and manufacturing method of a semiconductor device of the invention.
Figure 6B:
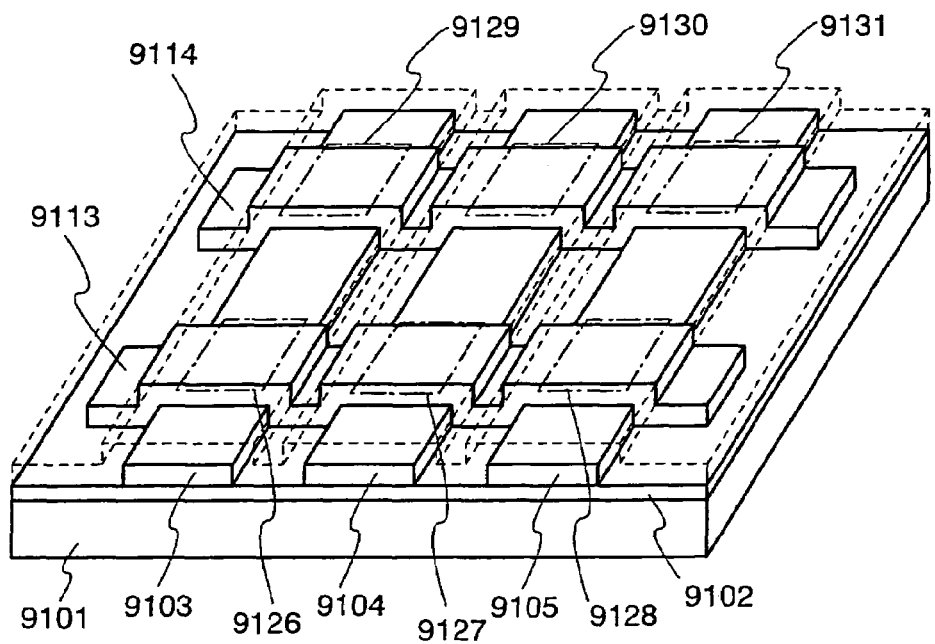

As another form, crystalline semiconductor films 9110-9112 may be formed correspondingly on the second insulation films 9103-9105, as shown in FIG. 6A. In the TFT, by the arrangement of a gate electrode, channel regions 9123-9125 can be arranged there. Meanwhile, as shown in FIG. 6B, crystalline semiconductor films 9113, 9114 may be formed. In this case, by the arrangement of a gate electrode, a channel regions 9126-9131 can be provided there.

Figure 7:
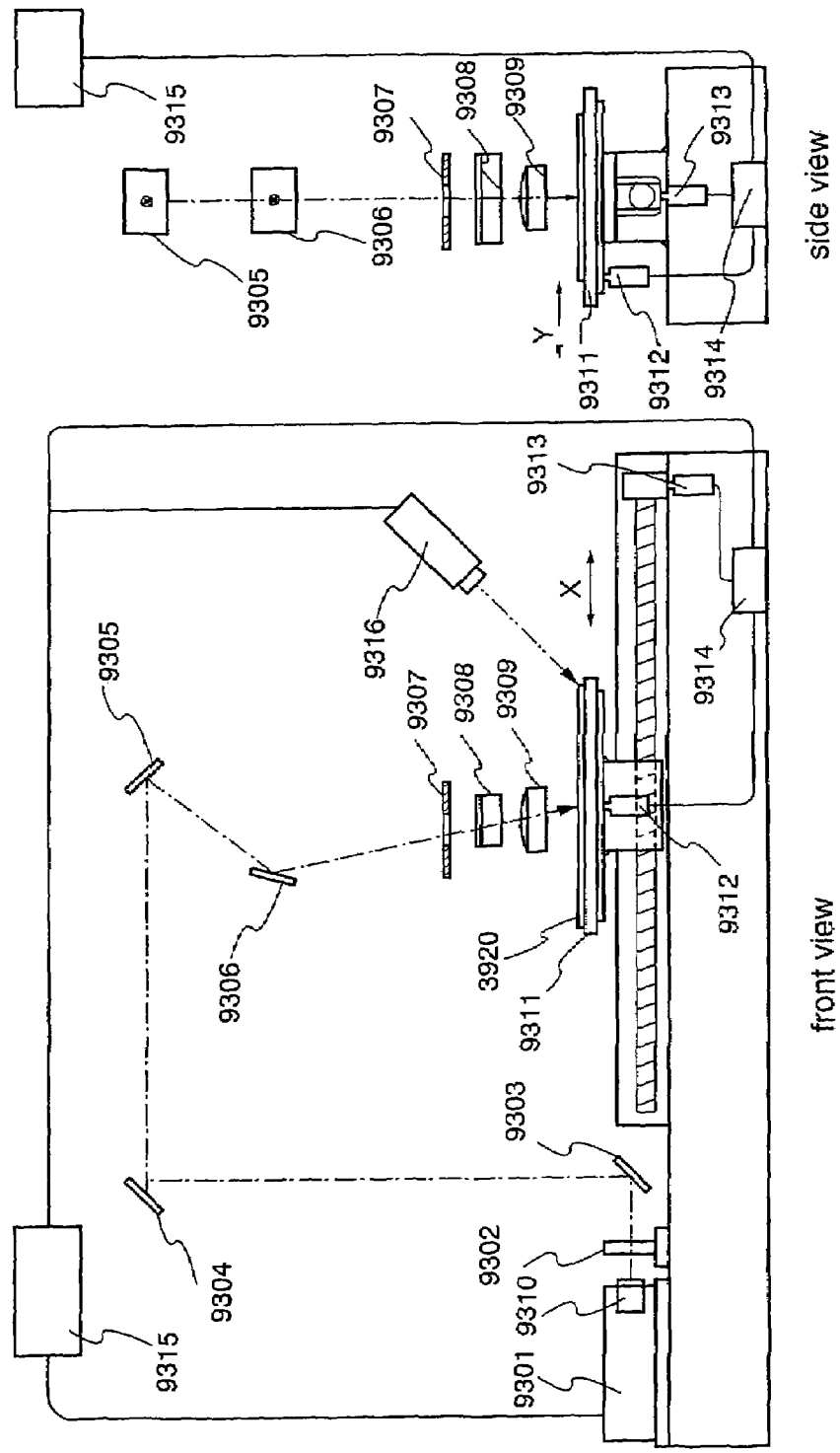
FIG. 7 is an arrangement view showing one form of a laser irradiation apparatus to be applied to the invention.

FIG. 7 shows a structural example of a laser processing apparatus applicable for crystallization. FIG. 7 illustrates, in front and side views, a construction of laser processing apparatus having a laser oscillator 9301, a shutter 9302, high change mirrors 9303-9306, a slit 9307, cylindrical lenses 9308, 9309, a table 9311, drive means 9312, 9313 to move the table 9311 in X-Y directions, control means 9314 to control the drive means, information processing means 9315 to send signals to the laser oscillator 9301 and control means 9314 according to a previously stored program, and so on.

The laser beam, to be linearly focused in sectional form on an irradiated surface by the cylindrical lenses 9308, 9309, is incident obliquely on a surface of a substrate 9320 on the table 9311. This is deviated in focal point by the aberration of astigmatism or the like, and can form a linear focal plane on or around an irradiation surface. The cylindrical lens, 9308, 9309, if made of synthetic quartz, provides a high optical transmissivity. The coating provided on a lens surface is applied to realize an optical transmissivity of 99% or higher for a laser beam wavelength. Of course, the sectional form on irradiation surface is not limited to the linear one but may be in an arbitrary form, e.g. rectangular, elliptic or oval one. In any case, this refers to those having a ratio of minor and major axes included within a range of 1:10 to 1:100. Meanwhile, the wavelength changer device 9310 is provided to obtain the harmonic with respect to a basic wave.

As described above, the laser oscillator is a rectangular-beam solid laser oscillator, particularly preferably by a slab laser oscillator. Otherwise, it may be a slab-structured amplifier combined with a solid laser oscillator using a crystal of YAG, $YVO_4$, YLF or $YAlO_3$ doped with Nd, Tm or Ho. The slab material uses a crystal of Nd:YAG, Nd:GGG (gadolinium-gallium-garnet), Nd:GsGG (gadolinium-scandium-gallium-garnet) or the like. Besides these, a gas-laser or solid-laser oscillator for continuous oscillation can be used. For a continuous-oscillation solid laser oscillator, applied is a laser oscillator using a crystal of YAG, $YVO_4$, YLF or YAlO3 doped with Cr, Nd, Er, Ho, Ce, Co, Ti or Tm. The basic wave of oscillation wavelength, although different depending upon a doping material, is to oscillate at a wavelength of from 1 µm to 2 µm. In order to obtain higher output, a diode-excited solid laser is applied which may be in a cascade connection.

Laser processing on the substrate 9302 is made possible by moving the table 9311 by the drive means 9312, 9313 in two-axis directions. In the movement in one direction, continuous movement is available at an equal speed of 1-200 cm/sec, preferably 5-50 cm/sec over a distance that is longer than one side of the substrate 9320 in the other direction, non-continuous step movement is available over a distance nearly the same as that of the linear beam in its major-axis direction. The oscillation by laser oscillator 9301 and the table 9311 are operated in synchronism by the information processing means 9315 mounted with a microprocessor.

By the linear movement of table 9311 in X-direction shown in the figure, processing is possible over the entire surface of substrate by a laser beam irradiated from a fixed optical system. Position detecting means 9316 is allowed to detect a laser-beam irradiation point on the substrate 9320 and send a signal thereof to the information processing means 9315.

The laser irradiation apparatus thus constructed irradiates a laser beam to the substrate 9320. By moving it relatively in X or Y direction shown in the figure, processing is possible in a desired region or over the entire surface of a semiconductor film.

In this manner, in the crystallization with irradiation of a continuous-oscillation laser beam to an amorphous semiconductor film, the provision of a stepped form in the underlying insulation film makes it possible to concentrate strain or stress upon crystallization to the relevant point. This allows the crystalline semiconductor for an active layer to be free from the application of such strain or stress. By forming a TFT such that its channel region is arranged in the crystalline semiconductor film released from strain or stress, current drive capability can be improved to a high speed, hence improving device reliability.

Explanation is now made on how to irradiate laser light to be used in the invention, by using FIG. 8.

Figure 8A:
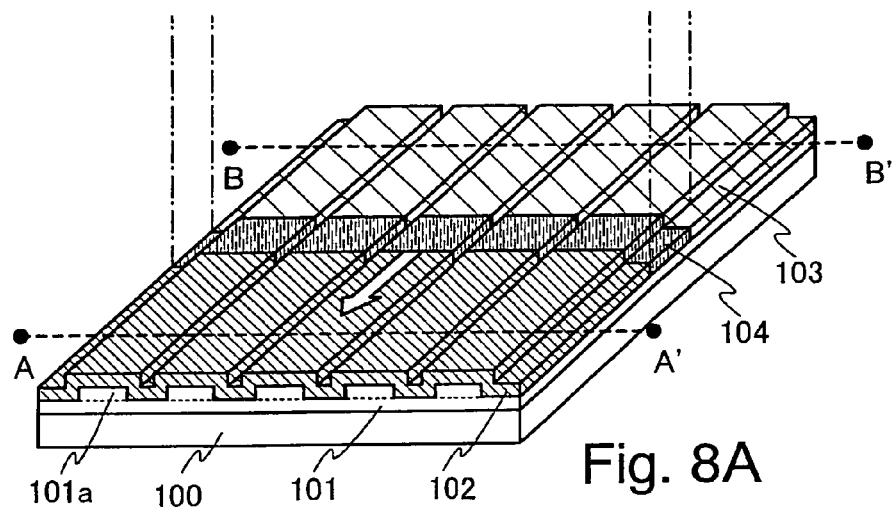
FIGS. 8A, 8B, 8C and 8D are views showing a manner that laser light is being irradiated to a semiconductor film.

At first, an insulation film 101 is formed over a substrate 100, as shown in FIG. 8A. An insulation film 101 includes stripe-formed convexes 101a. Note that how to form such, a concavo-convex will be explained in detail later. The insulation film 101 can use a silicon oxide film, a silicon oxide nitride film or a silicon nitride film. Besides these, other insulation film may be used provided that it can prevent impurities such as alkali metal from being introduced into a semiconductor film to be formed later and have insulation to withstand a temperature in a later process wherein concavo-convex can be formed thereon. Otherwise, the film may be in a layered structure having two or more layers.

At this time, a marker may be formed utilizing a part of the insulation film simultaneously with the insulation film 101.

The substrate 100 is satisfactorily of a material to withstand a temperature in the subsequent process, e.g. it can use a quartz substrate, a silicon substrate, a glass substrate of barium borosilicate glass or aluminum borosilicate glass, a substrate forming an insulation film on a surface of a metal or stainless-steel substrate. Otherwise, a plastic substrate may be used which has a heat resistance in a degree to withstand a process temperature.

Then, a semiconductor film 102 is formed covering the insulation film 101. The semiconductor film 102 can be formed by the known means (sputter process, PLCVD process, plasma CVD process or the like). The semiconductor film may be an amorphous semiconductor film, or a fine-crystal semiconductor film or crystalline semiconductor film. Besides silicon, silicon-germanium may be used.

At this time, a concavo-convex appears also in the semiconductor film 102, along the concavo-convex on the insulation film 101. There is a need to form such a convex 101a of insulation film 101 by taking a film thickness of semiconductor film 102 into consideration such that a concavo-convex is to appear on a semiconductor film 102 to be subsequently formed.

Next, as shown in FIG. 8A, laser light is irradiated to the semiconductor film 102 to form a semiconductor film (post-LC) 103 enhanced in crystallinity. The laser light has an energy density decreasing in a vicinity of an edge of the laser beam 104. Consequently, grain size is smaller in the vicinity of the edge to cause a rise region (ridge) along a grain boundary. For this reason, there is a necessity to avoid an overlap between the edge of a path of a laser beam 104 of laser light and the region to be made into a channel region or the convex flat surface of semiconductor film 102.

The scanning direction of laser beam is defined to be parallel with a direction of convex part (projection part) 110a, as shown by the arrow.

The invention can use a known laser. Laser light is desirably in continuous oscillation. However, pulse oscillation is considered to provide the effect of the invention. As the laser can be used a gas or solid laser. The gas lasers include an excimer laser, an Ar laser and a Kr laser. The solid lasers include a YAG laser, a YVO$_4$ laser, a YLF laser, a YAlO$_3$ laser, a glass laser, a ruby laser, an alexandorite laser, a Ti:sapphire laser and a Y$_2$O$_3$ laser. For a solid laser, a laser is applied that uses a crystal of YAG, YVO$_4$, YLF or YAlO$_3$ doped with Cr, Nd, Er, Ho, Ce, Co, Ti, Yb or Tm. This laser has a different basic wave depending upon a doping material, providing laser light having a basic wave at around 1 μm. The harmonic to the basic wave is available by the use of a non-linear optical device.

Furthermore, it is possible to use an ultraviolet laser light obtained by converting an infrared laser light emitted from the solid laser into green laser light by the non-linear optical device and then converted by another non-linear optical device.

Figure 8B:
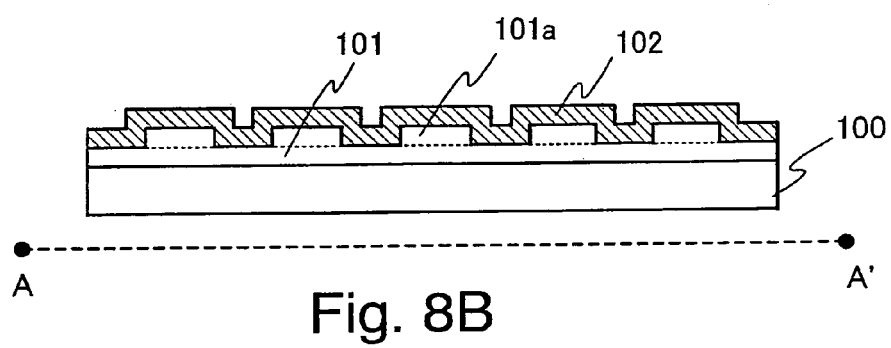
Figure 8C:
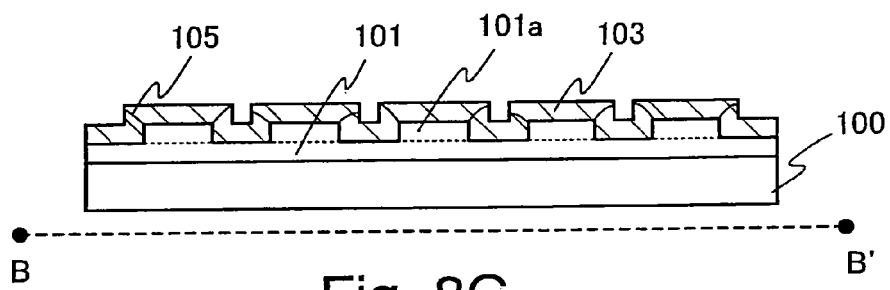
Figure 8D:
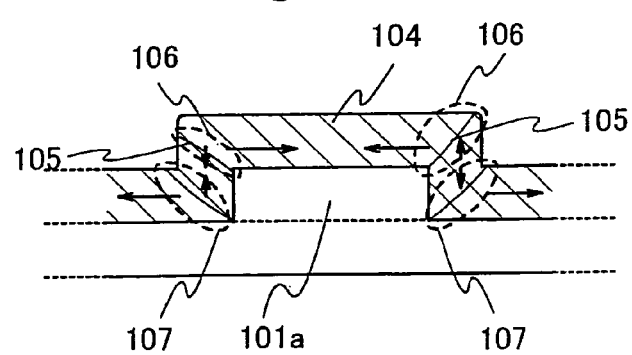

Note that the sectional view taken on the line A-A' before crystallization in FIG. 8A corresponds to FIG. 8B while the sectional view on the line B-B' of after crystallization corresponds to FIG. 2C. In the semiconductor film (post-LC) 103 crystallized by laser light irradiation, stress concentration occurs in the vicinity of an edge of convex or concave part, readily causing a grain boundary 105. FIG. 2D shows a magnifying view of the convex part (projection part) of semiconductor film 103 after crystallization. The arrow represents a direction of internal stress. It can be considered that stress concentration occurs in the vicinity 106 of convex edge and in the vicinity 107 of convex edge of semiconductor film to thereby cause the grain boundary 105. However, on a flat region of convex part (projection part) 101a (104), stress is small as compared to that on around the convex or concave edge region, hence causing less grain boundaries. If any grain boundaries should occur, comparatively great crystal grains are obtainable.

Figure 9A:
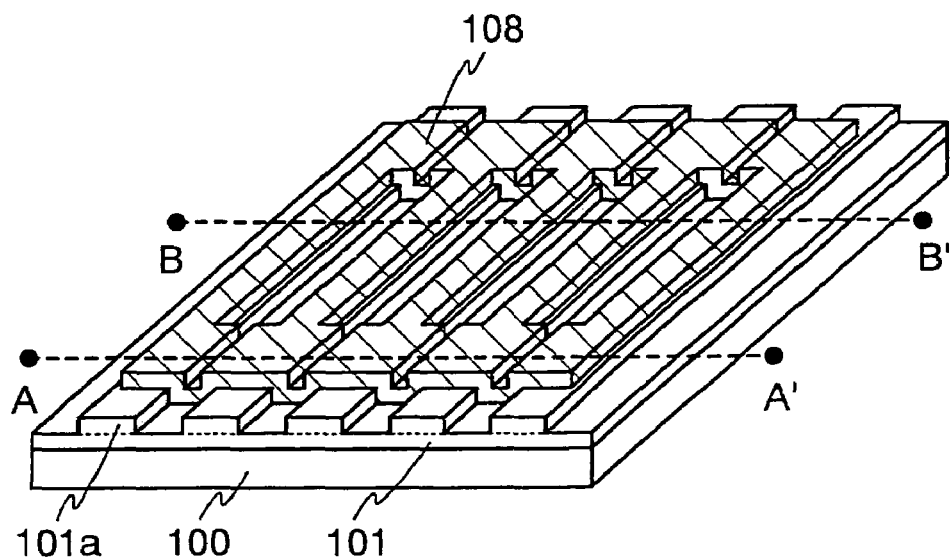
FIGS. 9A, 9B and 9C are views of an island formed by patterning the crystallized semiconductor film.

Then, as shown in FIG. 9A, the crystallized semiconductor film 103 is patterned to remove the region on around the convex edge or concave edge where many grain boundaries are considered to have been formed, together with the concave part region. Using a flat region positioned on the convex part (projection part) 101a excellent in crystallinity, an island-formed semiconductor film 108 is formed.

Figure 9B:
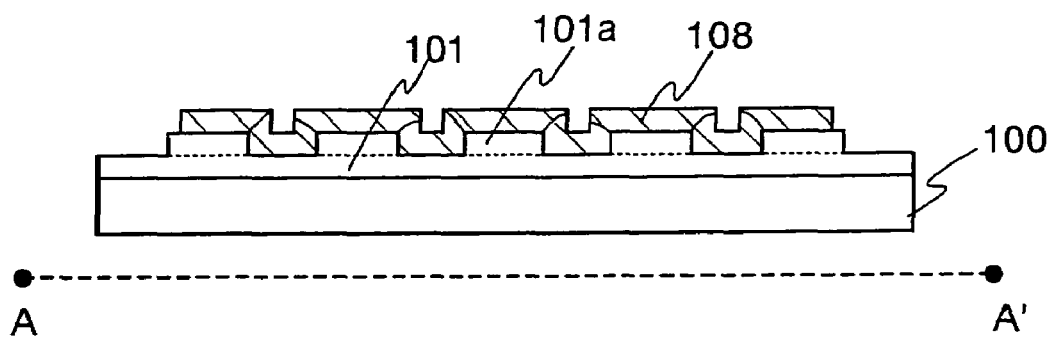
Figure 9C:
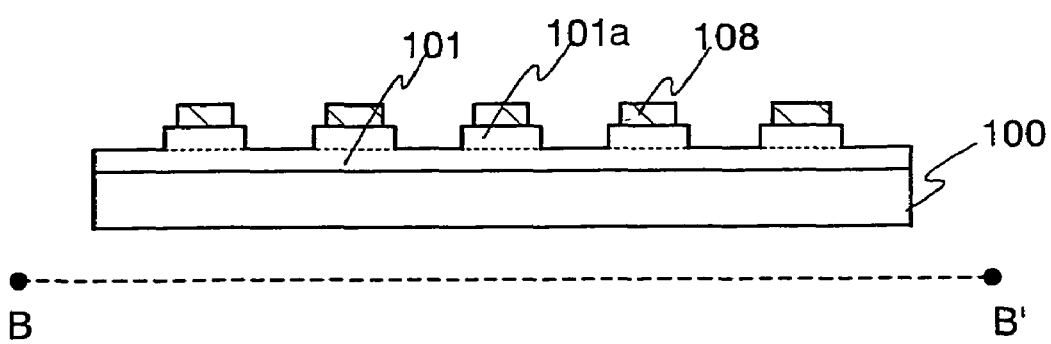

Incidentally, this embodiment patterned the semiconductor film 103 in a manner partly leaving the vicinity of convex or concave edge and concave part, whereby islands 108 was formed that is to be used as a slit-formed active layer with only the portion between the channel regions separated, as shown in FIG. 9A. The sectional view taken on the line A-A' of the islands 108 is shown in FIG. 9B while the sectional view on the line B-B' is in FIG. 9C. The region to be made into a source or drain region has not so great effect, due to semiconductor film crystallinity, upon TFT characteristic as that of the channel region. Consequently, there is no significant problem if leaving the vicinity of convex or concave edge not so good in crystallinity.

Figure 10A:
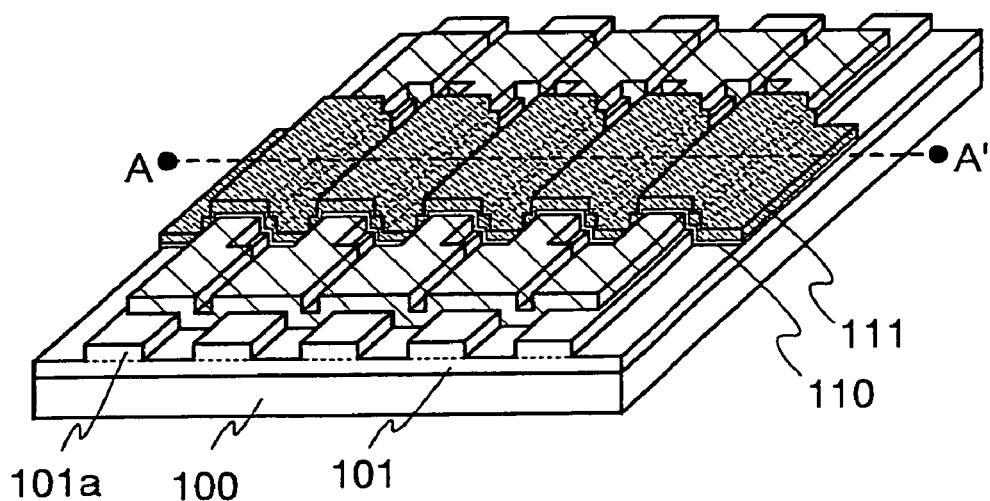
FIGS. 10A and 10B are views showing a structure of a TFT formed by using an island shown in FIG. 9A.

Then, as shown in FIG. 10A, a gate insulation film 110 is formed covering the islands 108 at least in a region to be made into channel regions. Although the region to be made into a source or drain region is exposed in FIG. 10A, the island 108 may be entirely covered by the gate insulation film 110.

Figure 10B:
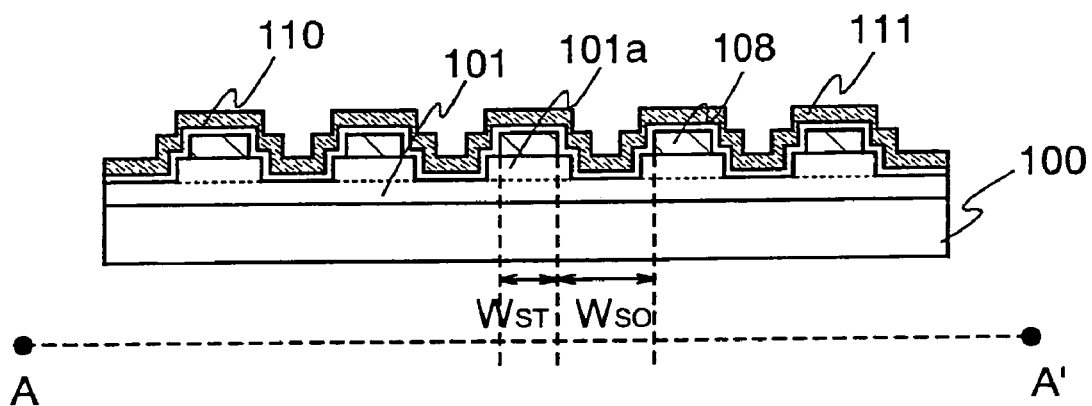

Then, a conductive film is formed and patterned thereby forming a gate electrode 111. The sectional view taken on the line A-A' in FIG. 10A is shown in FIG. 10B. The gate electrode 111 is superposed on all the channel regions.

By the above fabrication process, a TFT is completed that has a plurality of channel regions separated one from another. With this structure, the channel region can be made with an increased channel width. This can efficiently dissipate the heat generated by driving the TFT while securing on-current.

Provided that the channel region has a channel width $W_{ST}$ and a width at between the channel regions is $W_{SO}$, the ratio of $W_{ST}$ and $W_{SO}$ can be appropriately set by the designer. However, it is preferred to provide $3W_{ST} \approx W_{SO}$.

Figure 11:
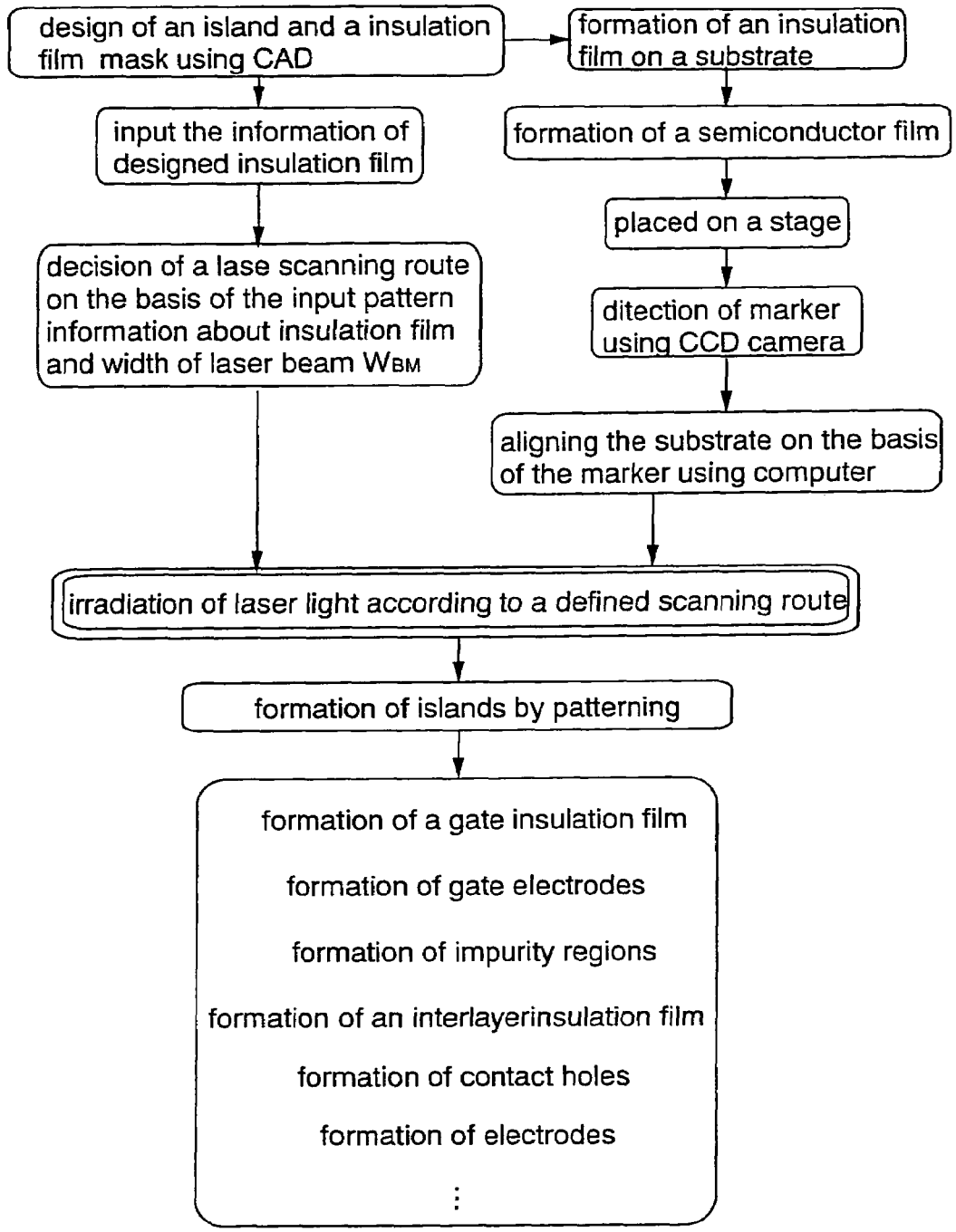
FIG. 11 is a figure showing a flowchart of a production system of the invention.

Explanation is now made on a production system according to the invention. FIG. 11 shows a flowchart on the production system. At first, an island mask is designed. Then, design is made to provide an insulation film to a stripe or rectangular form of concave-convex. In this case, one or a plurality of islands are laid out on convex flat surfaces of insulation film. In the case of using the island as a TFT active layer, it is desired to align the direction in which carrier moves through the channel region to a direction of insulation film stripe or to a direction of rectangle longer or shorter side. However, such a direction may be intentionally out of alignment depending upon the application.

In this case, the form of an insulator film may be designed to form a marker on one part of the insulation film.

The information about the form of designed insulation film (pattern information) is inputted to a computer possessed by the laser irradiation apparatus and stored to storage means thereof. The computer defines a laser scanning route on the basis of the input pattern information about insulation film and a width in a direction perpendicular to a direction of laser beam scanning. In this case, it is emphasized to define a scanning route no to provide an overlap between an edge of laser light path and convex flat surface of insulation film. Incidentally, by storing island pattern information in addition to the insulation-film pattern information to the storage means of the computer, a scanning path may be defined no to cause an overlap between an edge of laser light path and an island or channel region of an island.

In the case of providing a slit to control a laser beam width, the computer grasp a convex width of insulation film in a perpendicular direction to scanning direction, on the basis of the input pattern information about insulation film. Considering the convex width of insulation film, a slit width perpendicular to scanning direction is set not to cause an overlap between an edge of laser light path and an convex flat surface of insulation film.

On the other hand, an insulation film is formed on a substrate according to the information about designed pattern. Then, a semiconductor film is formed on the insulation film. After forming the semiconductor film, the substrate is placed on a stage of laser irradiation apparatus and the substrate is aligned in its position. In FIG. 5, a CCD camera is used to detect a marker, thereby aligning the substrate. Note that the CCD camera means a camera using a CCD (charge coupled device) as an imaging device.

Incidentally, the pattern information of an insulation or semiconductor film, on the substrate placed on the stage, may be detected by a CCD camera or the like so that the computer collates between the pattern information of insulation or semiconductor film designed by CAD and the pattern information about an insulation film or semiconductor film actually formed on the substrate obtained by the CCD camera, thereby aligning the substrate.

Then, laser light is irradiated according to a defined scanning route to crystallize the semiconductor film.

After irradiating a laser light, the semiconductor film enhanced in crystallinity by laser light irradiation is patterned to form islands. From then on, carried out is a process to form TFTs using the islands. Although concrete fabrication process for TFTs differs depending upon a TFT form, typically a gate insulation film is formed to form impurity regions in the island. Then, an interlayer insulation film is formed covering the gate insulation film and gate electrode. Contact holes are formed through the interlayer insulation film to expose a part of the impurity region. Interconnections are formed on the interlayer insulation film to have a contact with the impurity region through the contact hole.

Explanation is now made on the structure of a laser irradiation apparatus of the invention.

Figure 12:
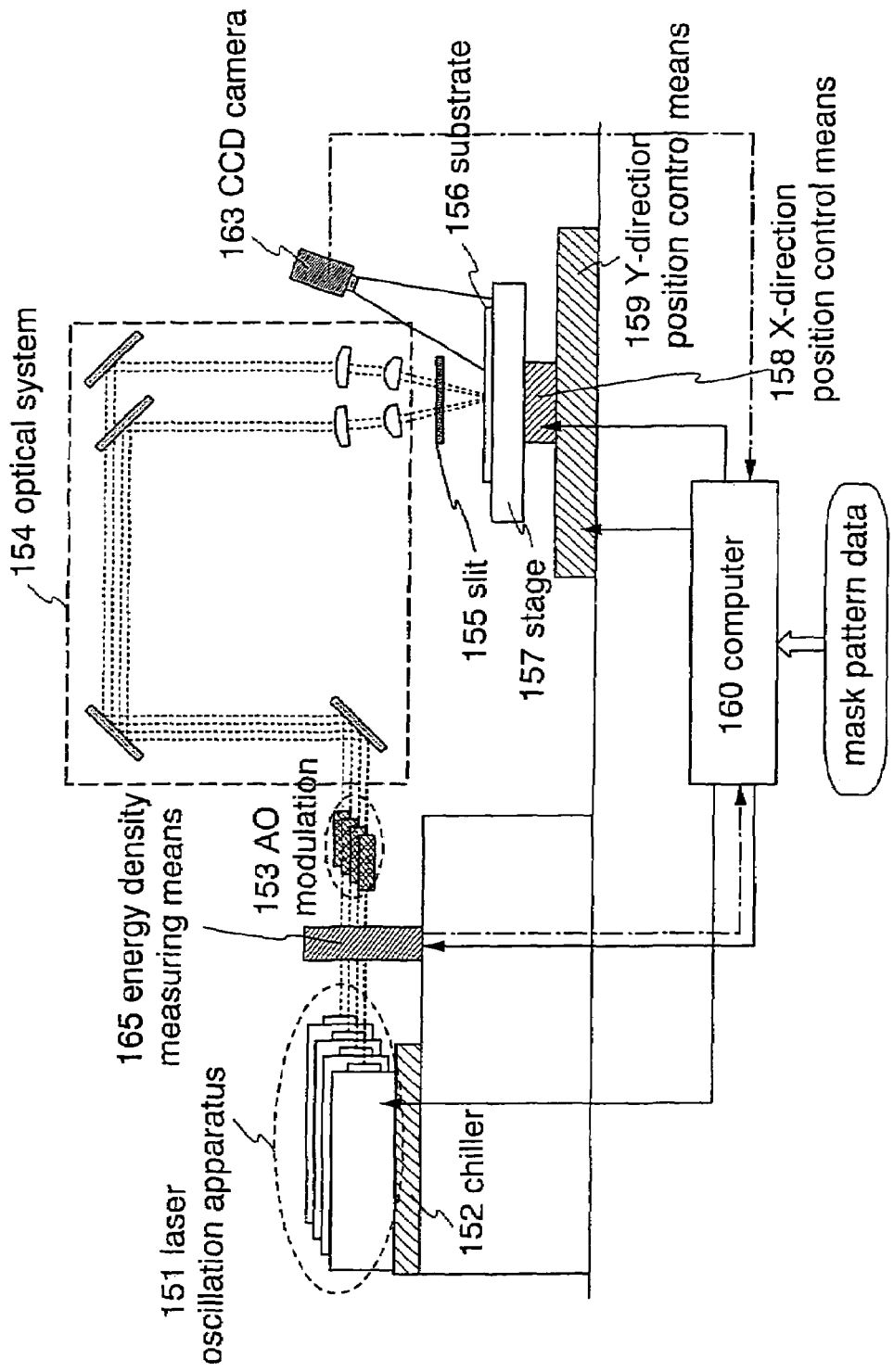
FIG. 12 is a view of a laser irradiation apparatus.

Using FIG. 12, explanation is made on the structure of a laser irradiation apparatus to be used in the invention 151 is a laser oscillator. Although four laser oscillators are used in FIG. 12, the laser oscillators possessed by the laser irradiation apparatus are not limited to that number.

The laser oscillator 151 may use a chiller 152 to keep constant the temperature thereof. The provision of a chiller 152 is not necessarily required. However, by keeping the temperature of laser oscillator 151 constant, the energy of output laser light is suppressed from varying depending upon temperature.

Meanwhile, 154 is an optical system. This can change a path of the light outputted from the laser oscillator 151 and work a laser beam form thereby focusing the laser light. Furthermore, in the laser irradiation system of FIG. 12, the laser beam of laser light outputted from the plurality of laser oscillators 151 can be combined together by being partly superposed one over another.

An AO modulator 153, capable of changing a laser-light travel direction in an extreme brief time, may be provided on an optical path at between a substrate 156 as a subject to be worked and the laser oscillator 151. In place of the AO modulator, an attenuator (light-amount adjusting filter) may be provided to regulate the energy density of laser light.

Meanwhile, means (energy density measuring means) 165, for measuring an energy density of the laser light outputted from the laser oscillator 151, may be provided on an optical path between the substrate 156 as a subject to be worked and the laser oscillator 165, to monitor the change in time of a measured energy density by the computer 160. In this case, the output from the laser oscillator 151 may be enhanced in order to compensate for the attenuation in laser-light energy density.

The synthesized laser beam is irradiated onto the substrate 156 as a subject to be worked through the slit 155. The slit is desirably formed of such a material as can block laser light but not to be deformed or damaged by laser light. The slit 155 is variable in slit width. Depending upon a width of the slit, laser beam width can be varied.

The laser beam form, on the substrate 156, of the laser light oscillated from the laser oscillator 151 not through the slit 155 is different depending upon the kind of laser. This can be shaped by an optical system.

The substrate 156 is rested upon a stage 157. In FIG. 12, position control means 158, 159 corresponds to the means for controlling a point of laser beam on the subject to be worked. The stage 157 position is under control of the position control means 158, 159.

In FIG. 12, the position control means 158 controls the position of stage 157 in X-direction while the position control means 159 controls the position of stage 157 in Y-direction.

Meanwhile, the laser irradiation apparatus of FIG. 6 has a computer 160 serving also as storage means, such as a memory, and central processor unit. The computer 160 controls the laser oscillator 151 to oscillate, and defines a scanning route of laser light. This, further, controls the position control means 158, 159 to move the substrate to a predetermined position so that the laser beam of laser light can be scanned according to a defined scanning route.

Although the laser beam position in FIG. 12 was controlled by moving the substrate, movement may be made by an optical system, such as a galvano mirror, or by the both.

In FIG. 12, the computer 160 can control the width of the slit 155 wherein the laser beam width can be changed according to the pattern information about mask. The provision of a slit is not necessarily required.

The laser irradiation apparatus may have means to adjust the temperature of subject to be worked. Because laser light is a light having high directivity and energy density, a damper may be provided to prevent reflection light from irradiating to an improper point. The damper desirably has a nature to absorb reflection light. By circulating a cooling water through the damper, the partition wall may be prevented from rising in temperature due to absorption of reflection light. Meanwhile, the stage 157 may be provided with means for heating the substrate (substrate heating means).

Where forming a marker by a laser, a laser oscillator for marker may be provided. In this case, the oscillation of laser oscillator for marker may be under control of the computer 160. Furthermore, where providing a laser oscillator for marker, an optical system is separately provided to focus the laser light outputted from the laser oscillator for marker. The laser to be used for forming a marker, typically, includes a YAG laser and a $CO_2$ laser. Of course, the other laser than these can be used in forming.

For alignment with a marker, one CCD camera 163, or several depending on the case, may be provided. Note that the CCD camera means a camera using a CCD (charge coupled device) as an imaging device.

The pattern on an insulation or semiconductor film may be recognized by the CCD camera 163 without providing a marker, to align the substrate. In this case, collation can be made between the pattern information on insulation or semiconductor film due to mask inputted to the computer 160 and the pattern information on actual insulation or semiconductor film gathered by the CCD camera 163, thereby grasp the position information about substrate. In this case, there is no need of separately providing a marker.

Meanwhile, the laser light incident on the substrate reflects upon a surface of the substrate and turns into, what is called, a return light, the light returning along the same optical path as that upon incidence. The return light has a bad effect, that is, laser output and frequency variation, and rod fracture. Consequently, an isolator may be provided in order to remove such return light and stabilize laser oscillation.

Figure 13:
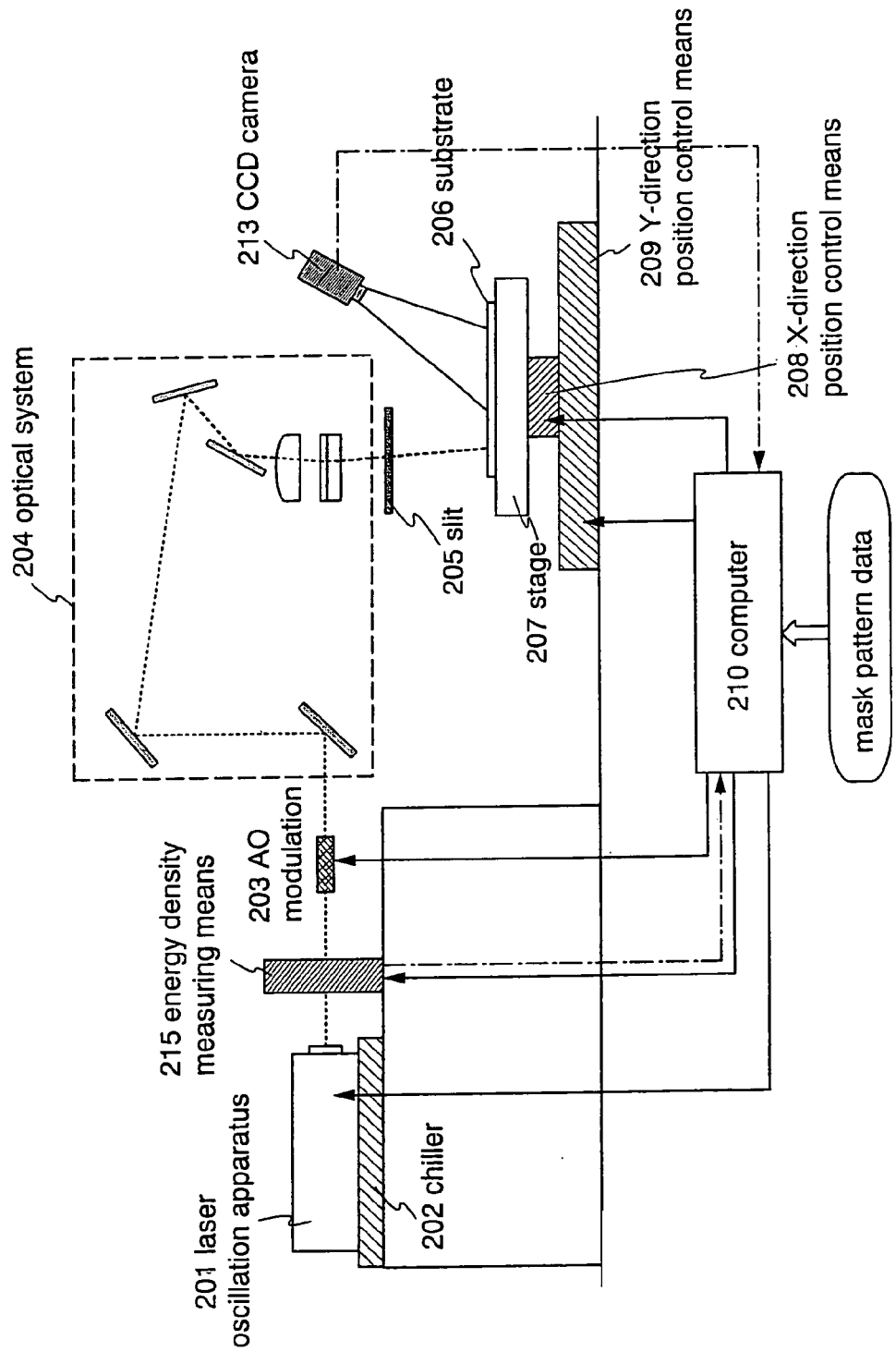
FIG. 13 is a view of a laser irradiation apparatus.

Incidentally, although FIG. 12 showed the laser irradiation apparatus structure having several laser oscillators, only one laser oscillator may be provided. FIG. 13 shows a laser irradiation apparatus structure having one laser oscillator. In FIG. 13, 201 is a laser oscillator and 202 is a chiller. 215 is an energy density measuring device, 2003 is an AO modulator, 204 is an optical system, 205 is a slit and 213 is a CCD camera. A substrate 206 is placed on a stage 207. The stage 207 is under position control of an X-direction position control means 208 and Y-direction position control means 209. As shown in FIG. 12, the operation of each means possessed by the laser irradiation apparatus is controlled by a computer 210. The difference from FIG. 12 is in that only one laser oscillator is provided. The optical system 204 may serve to focus one of laser light, different from that of FIG. 12.

In this manner, the invention, after crystallization by laser light, removes a semiconductor film in its concave, convex edge and its vicinity by patterning to positively use, as a TFT active layer, a convex central region excellent in crystallinity. Due to this, the TFT channel region is prevented from forming grain boundaries. This prevents the TFT from conspicuously decreasing mobility, lowering on-current and increasing off-current, due to grain boundaries. Note that the designer is allowed to properly define to what region the convex edge and its vicinity are to be removed by patterning.

Meanwhile, by scanning laser light to minimally crystallize at least requisite region instead of scanning and irradiating laser light throughout the entire semiconductor film, it is possible to omit the time for irradiating laser light to a region to be removed by patterning after crystallization of the semiconductor film. This can greatly reduce the process time required per substrate.

EMBODIMENTS

Embodiments of the present invention will now be explained.

Embodiment 1

This embodiment explains an example to fabricate a TFT having a crystalline semiconductor film formed on an underlying insulation film having a stepped form wherein a channel region is arranged in the crystalline semiconductor film formed on a convex part (projection part) thereof.

In FIG. 14, a first insulation film 9602 is formed of silicon nitride oxide film having 100 nm on a glass substrate 9601. A silicon oxide film is formed on that and formed into a second insulation film 9603-9606 having a rectangular pattern by photolithography. The silicon oxide film is formed by a plasma CVD process that TEOS and $O_2$ are mixed together to cause deposition to a thickness of 50 nm in discharge under a condition of a reaction pressure, of 40 Pa, a substrate temperature of 300-400° C. and a radio frequency (13.56 MHz) power density of 0.6 W/cm$^2$. Thereafter, this is etched into a rectangular form.

Figure 15:
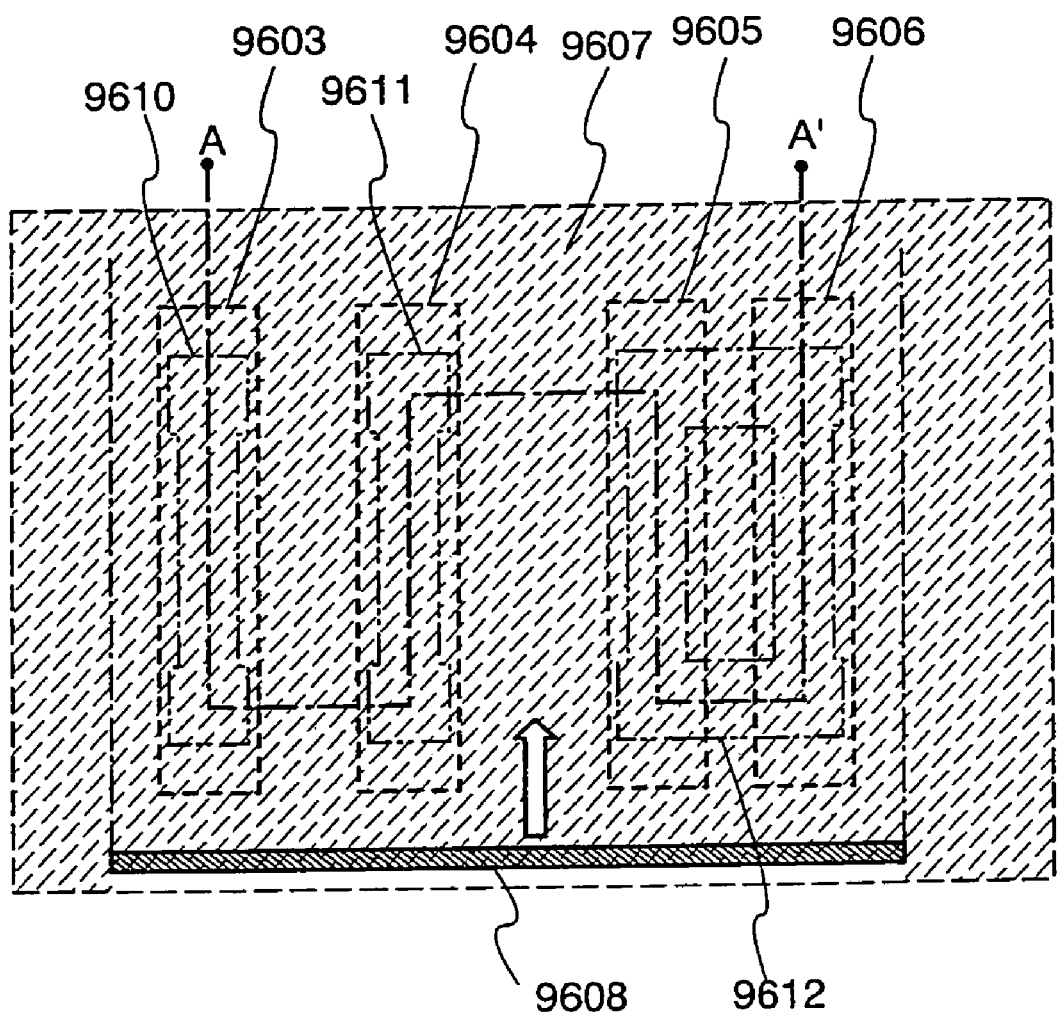
FIG. 15 is a top view explaining the detail of a crystallization process of the invention.

Then, an amorphous silicon film 9607 is formed in a thickness of 100 nm covering the first insulation film 9602 and second insulation film 9603-9606. This is crystallized by irradiating a continuous-oscillation laser beam, a top view of which is shown in FIG. 15. The sectional view along the line A-A' corresponds to FIG. 14A. Meanwhile, 9610-9612 shown by the one-dot chain lines overlapped with the second insulation films 9603-9606 denotes a position where a TFT active layer is to be formed.

Figure 14A:
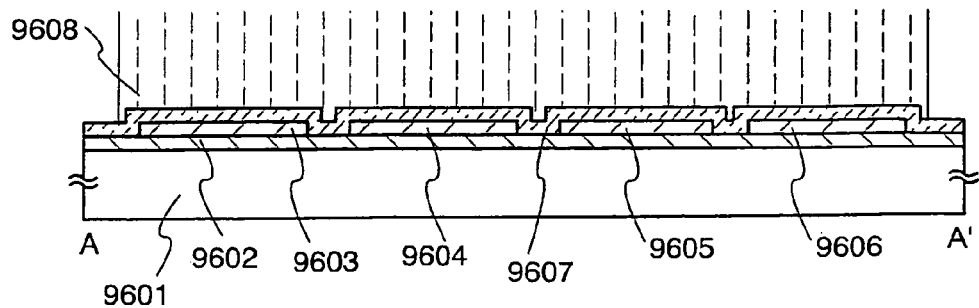
FIGS. 14A, 14B, 14C, 14D, 14E and 14F are longitudinal sectional views explaining a manufacturing method of a semiconductor device of the invention.
Figure 14B:
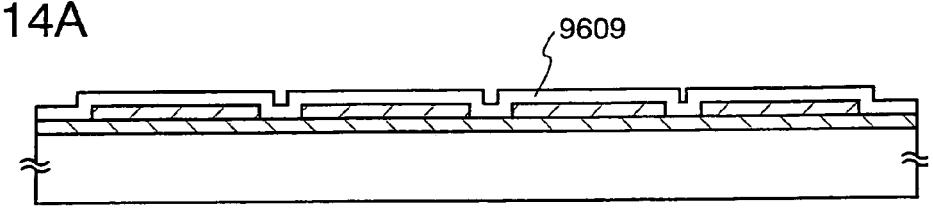
Figure 14C:
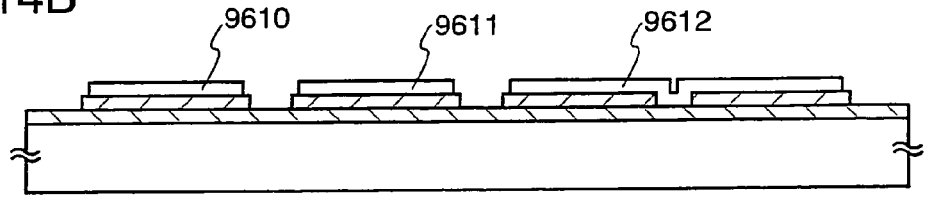

By irradiating a linear laser beam 9608 having an energy density distribution uniform in lengthwise direction while scanning it, a crystalline semiconductor film 9609 is formed as shown in FIG. 14B. Uniform energy density distribution does not mean to exclude the other than perfectly constant one, wherein energy density distribution has an allowable range of ±20%. For irradiating such a laser beam, the laser processing apparatus constructed shown in FIG. 7 is applicable. The laser beam focused through an optical system has an intensity distribution region uniform in lengthwise direction. The distribution may be in a transverse direction. Crystallization is carried out in such intensity distribution region uniform in lengthwise direction. This can enhance the effect in crystal growth in a direction parallel with a scanning direction of laser beam.

Figure 16:
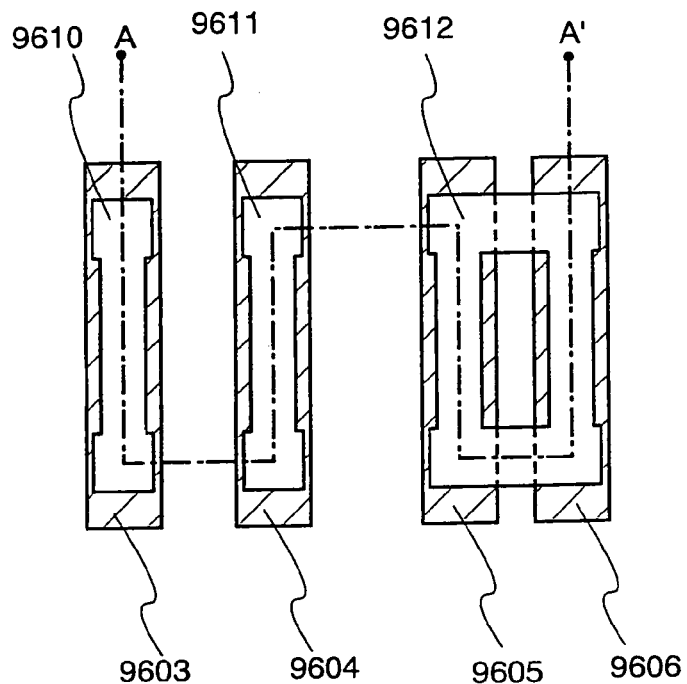
FIG. 16 is a top view explaining a fabrication method of a semiconductor device of the invention.

Thereafter, an etch process is carried out in a form to leave the crystalline semiconductor film 9609 on the second insulation film 9603-9606, thereby forming an active layer 9610-9612. FIG. 16 shows a top view in this state.

Figure 14D:
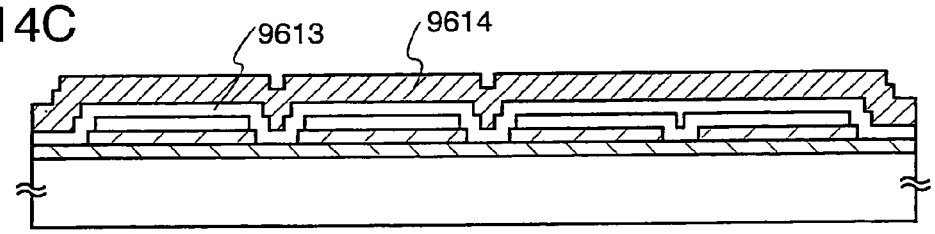
Figure 14E:
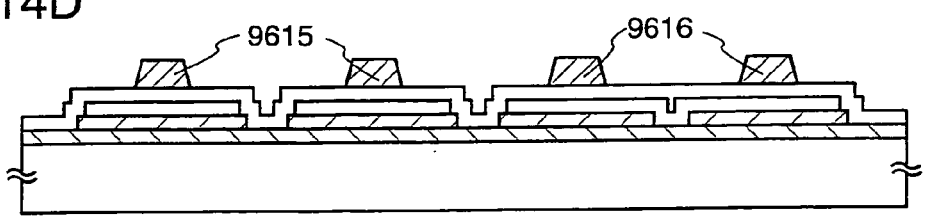
Figure 14F:
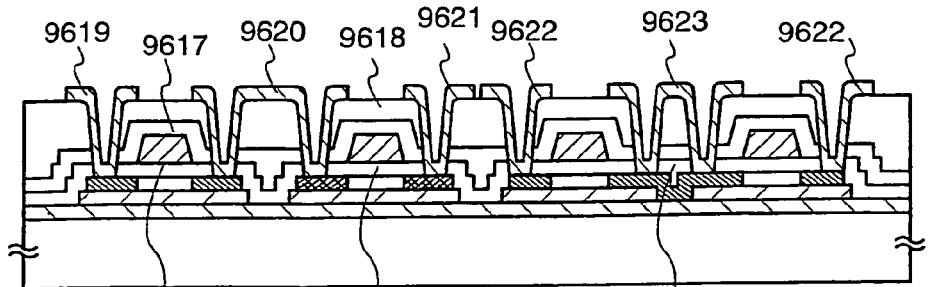

As shown in FIG. 14D, a gate insulation film 9613 is formed of silicon oxide while a conductive film 9614 for forming a gate electrode is formed of tungsten or an alloy containing tungsten. By photolithography, a gate electrode 9615, 9616 is formed as shown in FIG. 14E.

Figure 17:
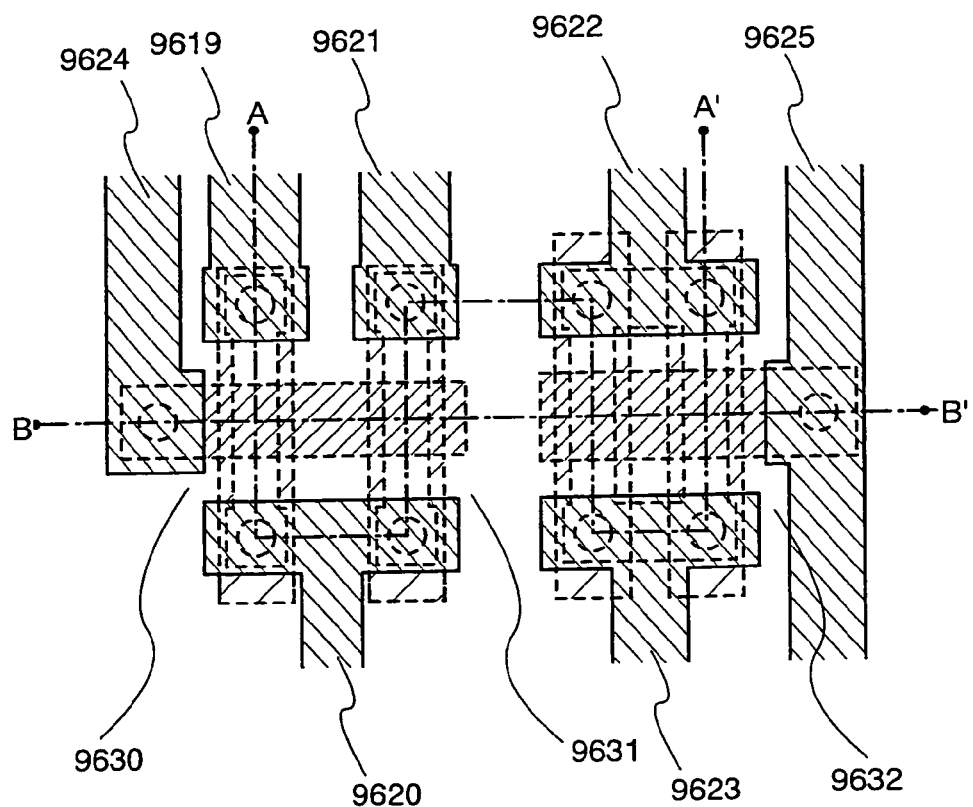
FIG. 17 is a top view explaining a fabrication method of a semiconductor device of the invention.
Figure 18:
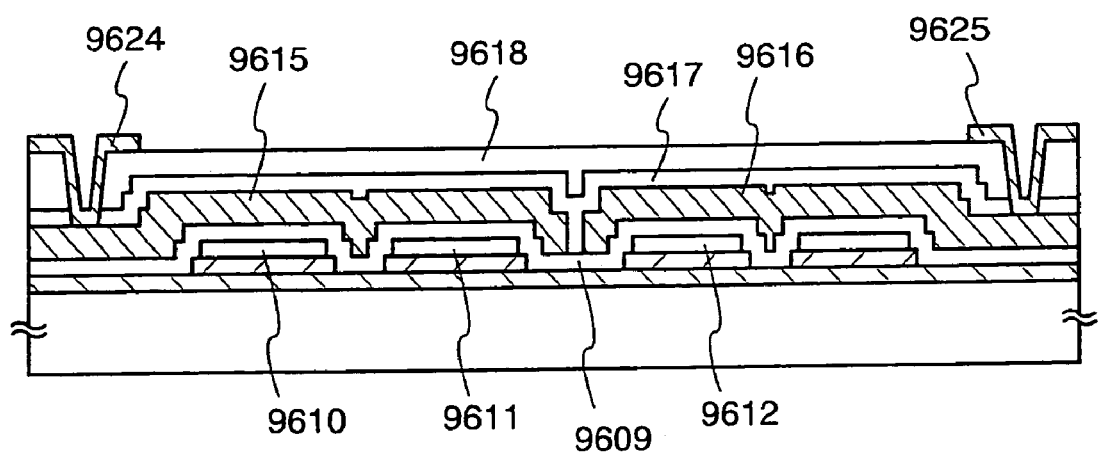
FIG. 18 is a longitudinal sectional view explaining a manufacturing method of a semiconductor device of the invention.

Furthermore, a doping process is carried out to form source and drain regions in each active layer, and then a passivation film 9617 and planarizing film 9618 are formed. After forming contact holes, the interconnections 9619-9623 on a planarizing film 9618 are formed by properly combining aluminum, titanium and the like. In this manner, formed are a single-channeled n-channel TFT 9630 and p-channel TFT 9631 and a multi-channeled n-channel TFT 9632. FIG. 17 shows a top view in this state. The vertical sectional view on the line A-A' in the figure corresponds to FIG. 14F. Herein, one example is shown configuring an inverter circuit with the single-channeled n-channel TFT 9630 and p-channel TFT 9631. Meanwhile, the vertical sectional view on the line B-B' in FIG. 17 is shown in FIG. 18.

Figure 19:
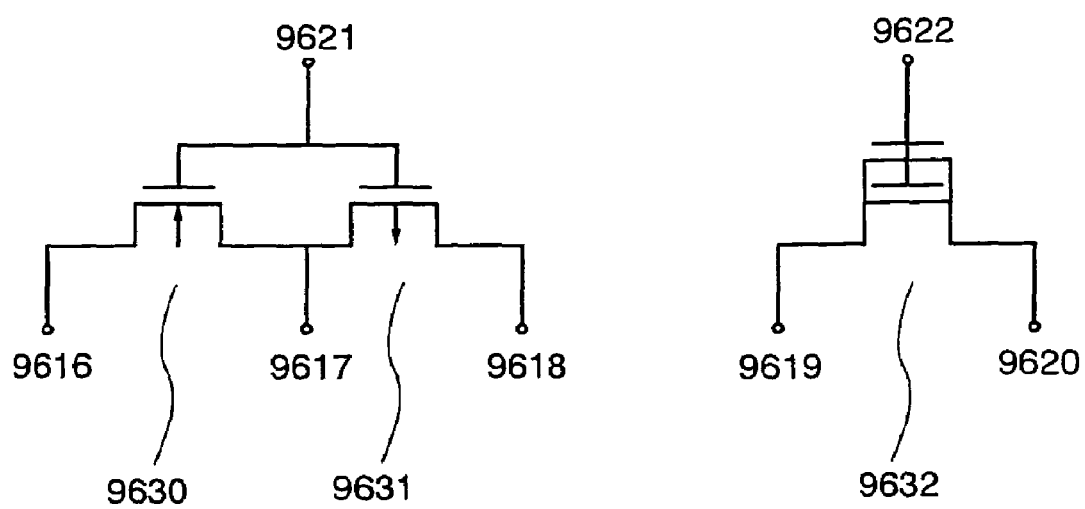
FIG. 19 is a equivalent circuit diagram corresponding to the top view shown in FIG. 17.

FIG. 19 shows equivalent circuits of a single channeled n-channel TFT 9630 or p-channel TFT 9631 and of a multi-channeled n-channel TFT 9632. The multi-channeled n-channel TFT 9632 has a plurality of channels provided in parallel between source and drain regions to form one transistor. By providing channel regions in parallel, the current flowing between the channels is normalized. By the transistor of this structure, characteristic variation can be reduced between a plurality of elements.

Embodiment 2

This embodiment shows an example to irradiate a laser beam in a direction different from that of Embodiment 1, the manner of which is explained by using FIG. 20.

Figure 20A:
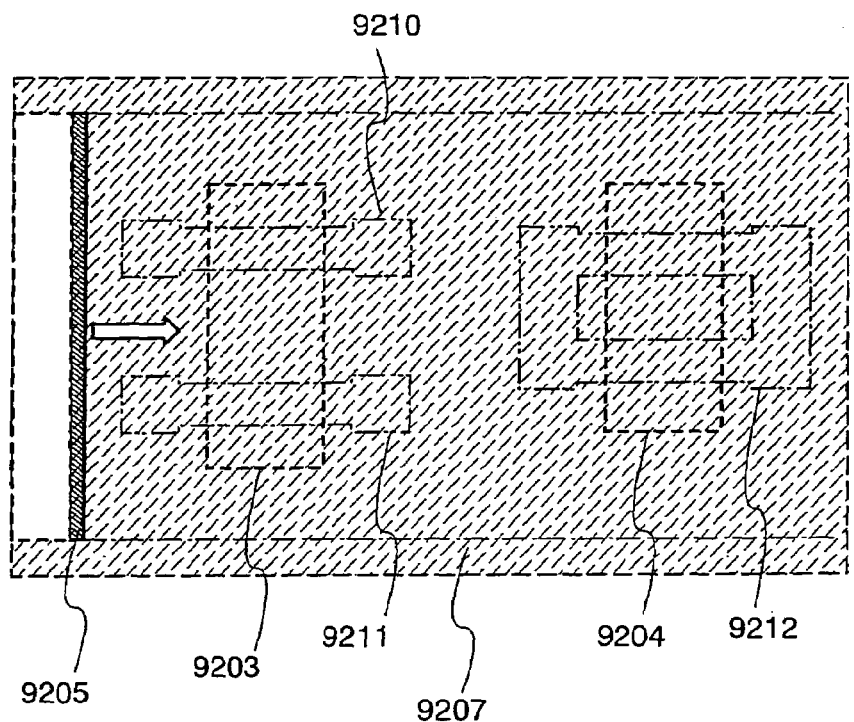
FIGS. 20A and 20B are top views explaining a fabrication method of a semiconductor device of the invention.

FIG. 20A shows a stage that an amorphous silicon film 9207 is formed on a second insulation film 9203, 9204 to crystallize it by a continuous-oscillation laser beam 9205. 9210-9212 shown by the one-dot chain line overlapped with the second insulation film 9203, 9204 denotes a region where a TFT active layer is to be formed.

There is no need for an active layer 9210-9212 to be entirely superposed on the second insulation film, i.e. it is arranged such that at least a region to be made into a channel region positions on that. Provided that the crystal region accumulated with strains is not superposed on a channel region, the arrangement shown in FIG. 20A is allowed.

Figure 20B:
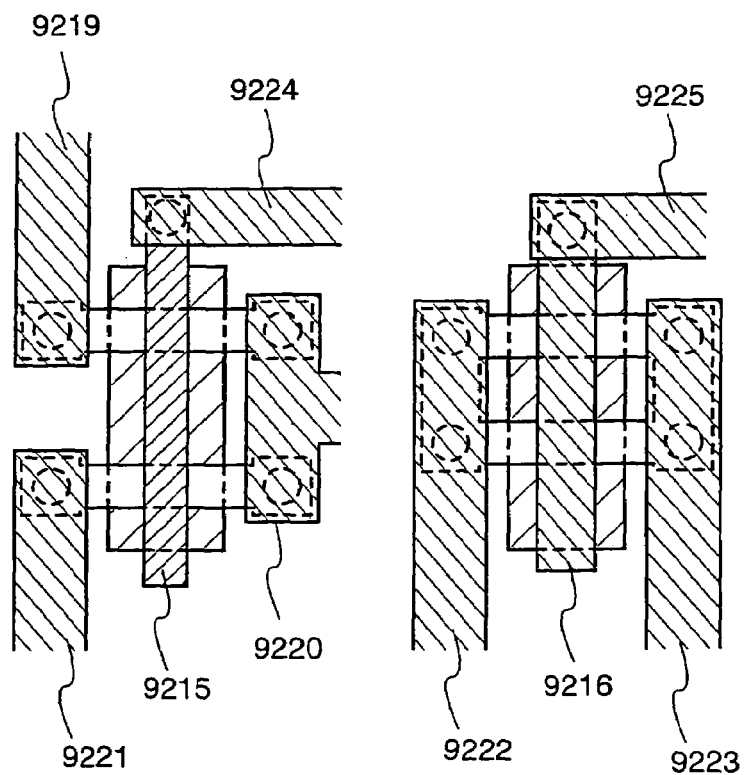

To complete a TFT, source and drain regions and the like may be formed in the active layer and passivation films, planarizing films and interconnections 9219-9223 are formed as shown in FIG. 20B. With such an arrangement of the second insulation film and active layer, TFTs can be completed that are similar to those of Embodiment 1.

Embodiment 3

In forming an active layer, an amorphous semiconductor film may be crystallized by irradiating a laser beam as shown in Embodiment 1. However, a laser beam may be further irradiated after being poly-crystallized, thereby enhancing the crystallinity. Such a two-staged crystallization process makes it possible to form a crystalline semiconductor film comparatively less in strain as compared to Embodiment 1.

Figure 21A:
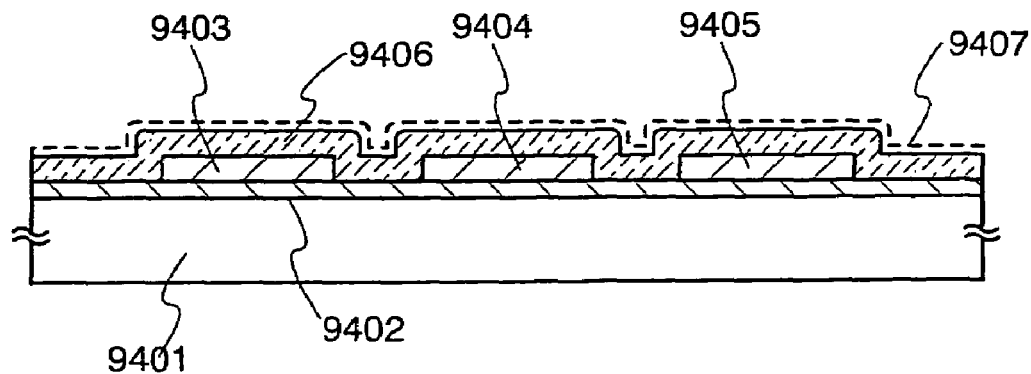
FIGS. 21A, 21B and 21C are longitudinal sectional views explaining the detail of a crystallization process of the invention.

FIG. 21 is a vertical sectional view showing the process. In FIG. 21A, a first insulating film 9402 is formed of silicon oxide nitride having 100 nm on a glass substrate 9401. A silicon oxide film is formed on that, and formed by photolithography into a second insulation film 9403-9405 having a rectangular pattern. An amorphous silicon film 9406 is formed in a thickness of 150 nm on that.

Ni is added onto the entire surface of the amorphous semiconductor film 9406, which is as a catalytic element capable of lowering the crystallization temperature of silicon and improving crystal orientation. There is no limitation for Ni adding scheme, i.e. spin application process, evaporation process or sputter process is applicable. In the case of using a spin application scheme, a solution containing 5 ppm of nickel acetate is applied to form a catalytic element containing layer 9407. It is natural that the catalytic element is not limited to Ni but other known material may be used.

Figure 21B:
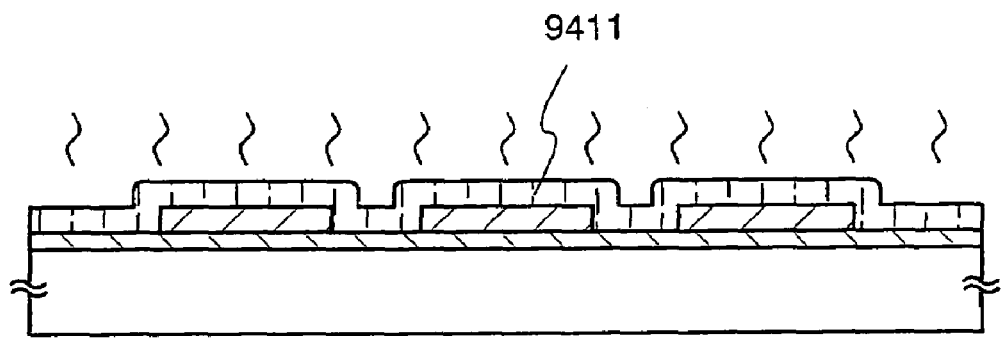

Thereafter, the amorphous silicon film 9406 is crystallized by a heating process at 580° C. for 4 hours, as shown in FIG. 21B. In this manner, a crystalline silicon film 9411 is obtained. The crystalline silicon film 9411 is also structured by the gathering of rod or needle-like crystals. Each of the crystals, macroscopically, has grown in a certain directionality to have crystallinity aligned in order. There is a feature that alignment ratio is high in a certain orientation.

Figure 21C:
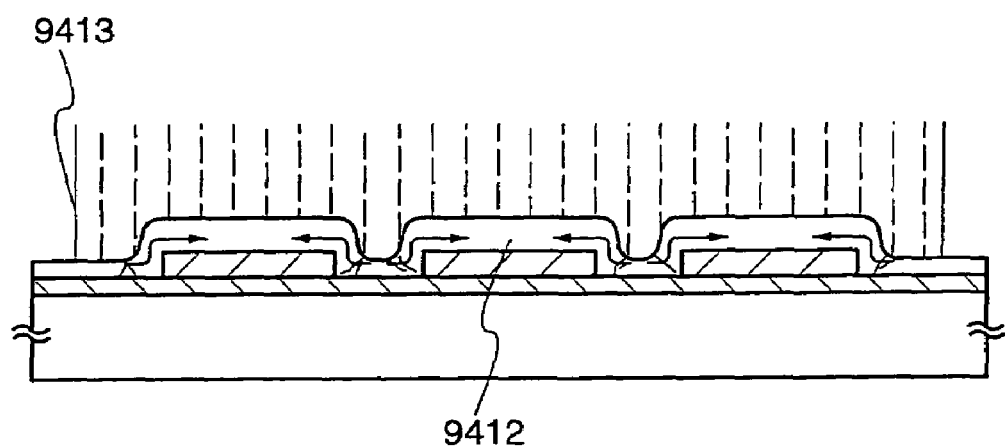

As shown in FIG. 21C, a continuous-oscillation laser beam is irradiated to the crystalline semiconductor film crystallized by the heating process, thereby improving the crystallinity. A linear laser beam 9413 having an energy density distribution uniform in a lengthwise direction is irradiated while being scanned, to fuse and recrystallize the crystalline semiconductor film 9411. Also, the amorphous region remaining in the crystalline semiconductor film 9411 can be crystallized by this process. By this recrystallization process, grain size increase and alignment control are achieved. In the stage of crystallization, somewhat volume contraction occurs. The strain is accumulated in the stepped region, however, a crystalline semiconductor film on the second insulation film 9412 can be formed without influence of the strain upon the crystallinity semiconductor film.

From then on, TFTs can be completed by the similar process to that of Embodiment 1.

Embodiment 4

Figure 22A:
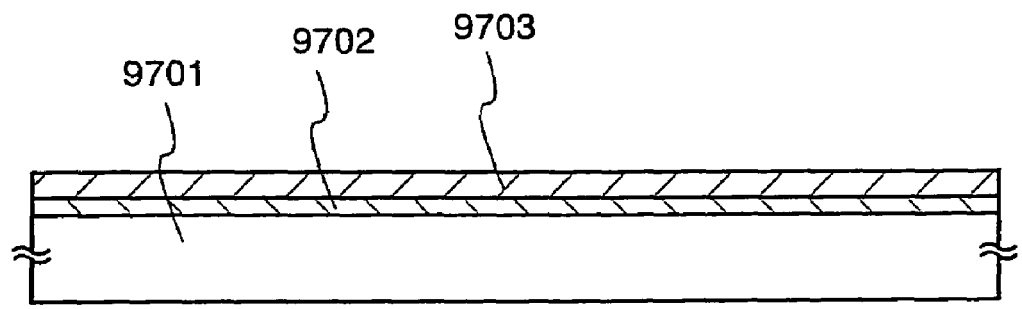
FIGS. 22A, 22B and 22C are longitudinal sectional views explaining a method of forming an underlying insulation film and amorphous semiconductor film of the invention.
Figure 22B:
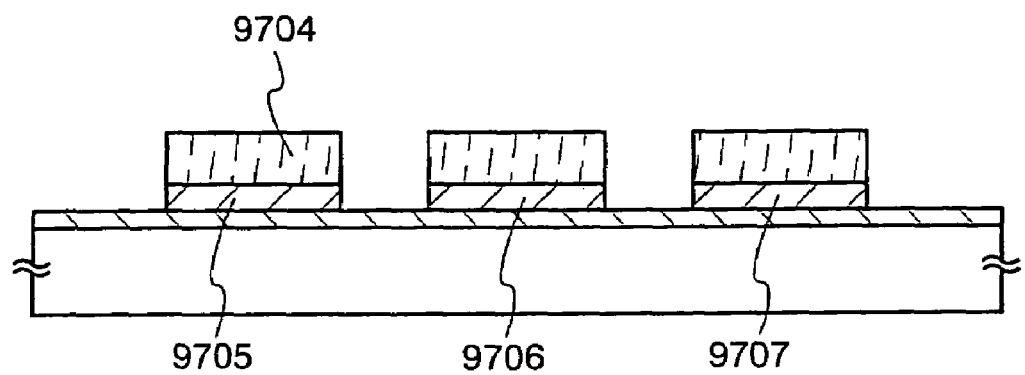
Figure 22C:
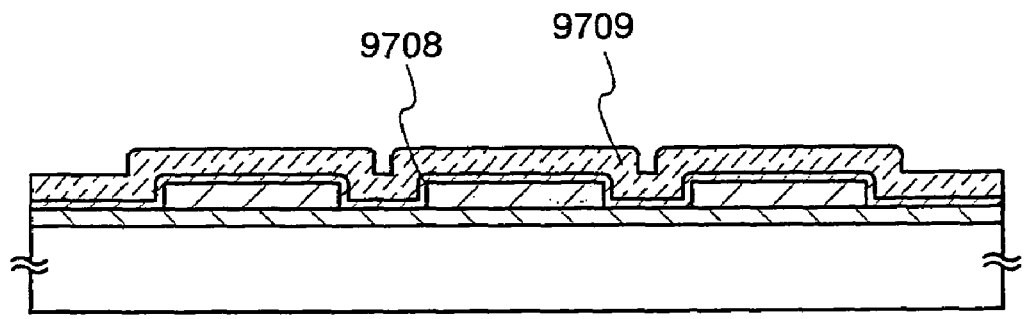

The method for forming an underlying insulation film having a stepped form is as follows. Namely, according to Embodiment 1, a first insulation film 9702 of silicon nitride oxide and a second insulation film 9703 of silicon oxide are layered on a glass substrate 9701 as shown in FIG. 22A. Thereafter, as shown in FIG. 22B, a mask 9704 is formed to form the second insulation film 9703 into a pattern shown at 9705-9707. The etching method includes, as an example, wet etching wherein etching of the second insulation film 9703 can be conducted with comparatively high selectivity against the first insulation film 9702 by using a mixture solution containing 7.13% of ammonium hydrogen fluoride ($NH_4HF_2$) and 15.4% of ammonium fluoride ($NH_4F$).

In a stage of forming an amorphous semiconductor film 9709 on that, a silicon oxide nitride film 9708 and an amorphous semiconductor film 9709 are preferably, continuously formed without being exposed to the air within a plasma CVD apparatus, in order to avoid the affection of contamination at the interface with the underlying insulating film. By such a process method can be formed a clean interface. During crystallization, it is possible to prevent uncontrollable crystal nucleation caused due to interfacial impurity or the like.

From then on, TFTs can be completed by the similar process to that of any of Embodiments 1-3.

Embodiment 5

Figure 23A:
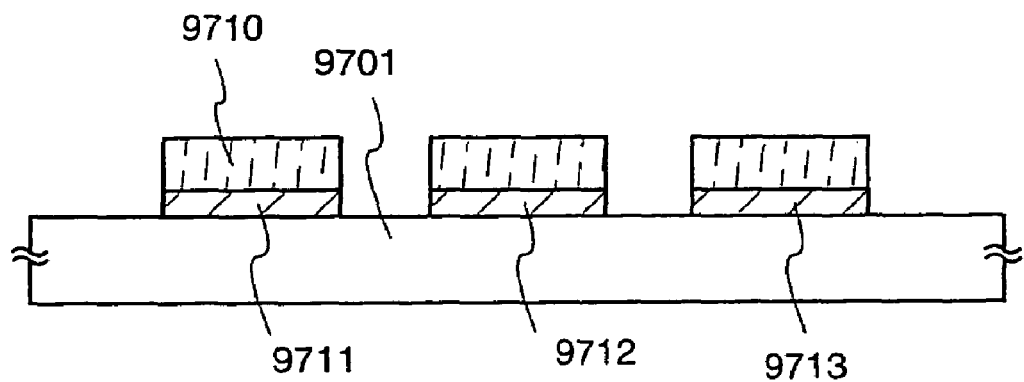
FIGS. 23A, 23B and 23C are longitudinal sectional views explaining a method of forming an underlying insulation film and amorphous semiconductor film of the invention.
Figure 23B:
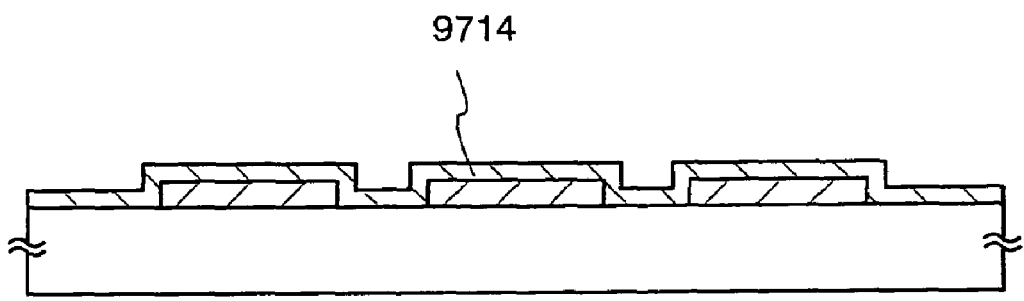
Figure 23C:
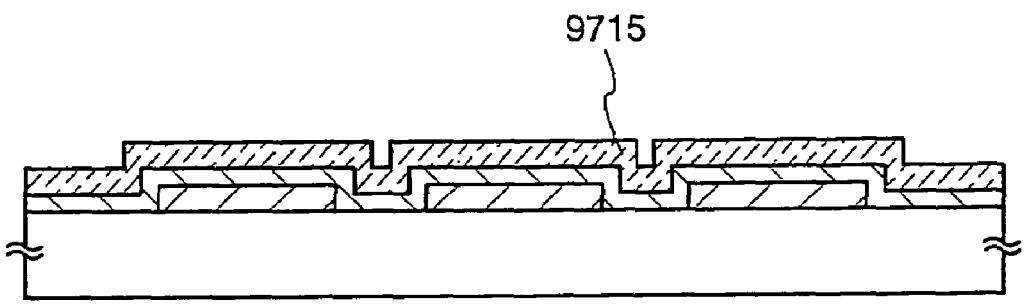

Another method for forming an underlying insulation film having a stepped form is as follows. Namely, as shown in FIG. 23A, a silicon oxide film is formed on a glass substrate 9701. Thereafter, by the photolithography using a mask 9710, a first insulation film 9711-9713 is formed of silicon oxide and patterned in a rectangular or stripe form.

Thereafter, after the mask 9710 is stripped off, a silicon oxide nitride film is formed covering the first insulation film 9711-9713 into a second insulation film 9714. On the second insulation film, an amorphous semiconductor film 9715 is formed. The silicon oxide nitride film, to be formed as a second insulating film, has a blockability against the alkali metal or the like contained in the glass substrate 9710 and a comparatively low internal stress, thus being suited as an underlying insulating film to contact a semiconductor film.

From then on, TFTs can be completed by the similar process of Embodiment 1 or Embodiment 2.

Embodiment 6

The invention is applicable to various semiconductor devices. Based on Embodiments 1-5, the form of a panel to be fabricated is explained by using FIGS. 24 and 25.

Figure 24:
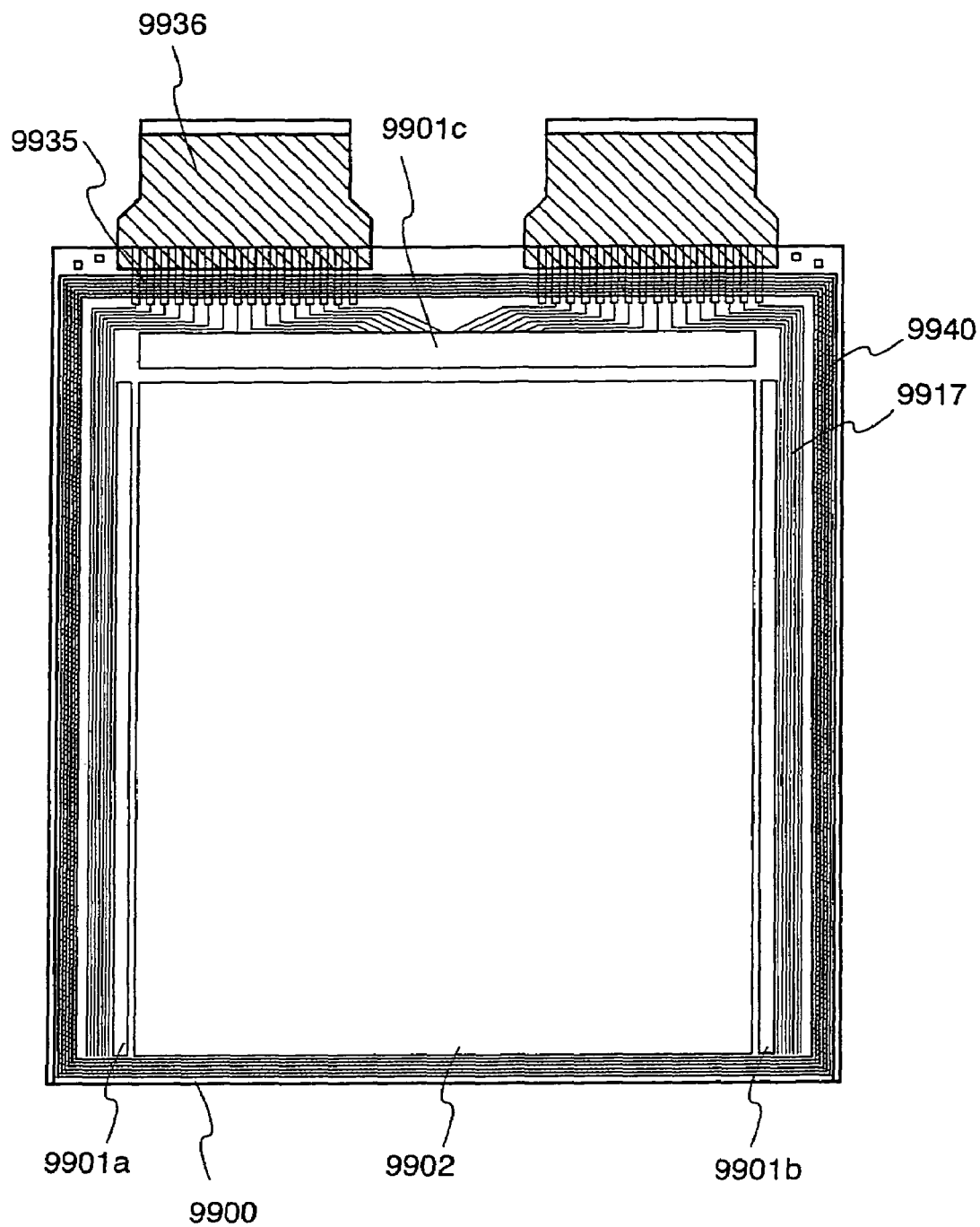
FIG. 24 is an external view of a display panel.

In FIG. 24, a substrate 9900 has a pixel region 9902, gate-signal drive circuits 9901a, 9901b, a data-signal drive circuit 9901c, an input/output terminal 9935 and wirings or a wiring group 9917. A shield pattern 9940 may partly overlap with the gate-signal drive circuits 9901a, 9901b, the data-signal drive circuit 9901c, and the wirings or wiring group 9917 connecting between the drive circuit part and the input/output terminal 9935. With this arrangement, the display panel can be reduced in the area of peripheral edge region (peripheral region of the pixel region). The input/output terminal 9935 is secured with an FPC 9936.

The TFTs shown in Embodiment 1 or 2 can be applied as switching elements for the pixel region 9902 and further as active elements constituting the gate-signal drive circuits 9901a, 9901b or data-signal drive circuit 9901c.

Figure 25:
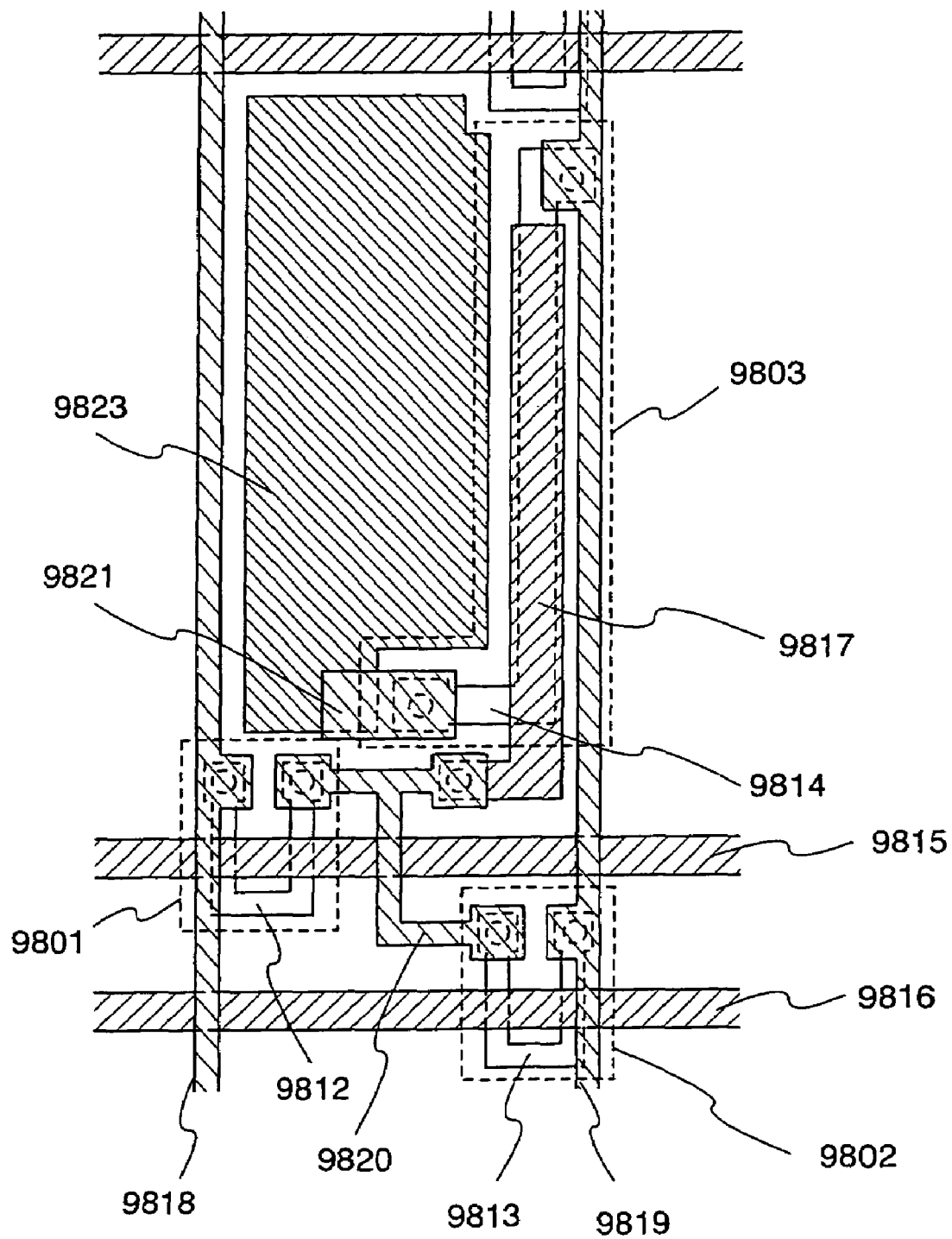
FIG. 25 is a top view explaining a structure of a pixel part of the display panel.

FIG. 25 is an example showing a configuration of one pixel of the pixel region 9902 that has TFTs 9801-9803. These are respectively switching, resetting and driving TFTs to control the light-emitting element or liquid-crystal element provided in the pixel.

These TFTs have active layers 9812-9814 arranged on the convex part (projection part) of the underlying insulation film formed underneath thereof. The crystalline semiconductor film forming the active layer can be formed on the basis of Embodiments 1-5. Gate interconnections 9815-9817 are formed in a layer above the active layers 9812-9814. Through passivation and planarizing films, formed are a signal line 9818, a power line 9819 and other interconnections 9820, 9821 and a pixel electrode 9823.

Embodiment 7

The semiconductor device, mounting TFTs fabricated using the invention, is applicable in various ways. The examples include a personal digital assistant (electronic pocketbook, mobile computer, cellular phone, etc.), a video camera, a digital camera, a personal computer, a television receiver, a cellular phone and projection-type display device. The examples of them are shown in FIGS. 26 and 27.

Figure 26A:
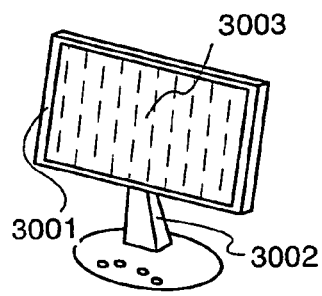
FIGS. 26A, 26B, 26C, 26D, 26E, 26F and 26G are views showing examples of semiconductor devices.

FIG. 26A is an example of a television receiver completed by applying the invention, which is constructed with a housing 3001, a support base 3002, a display part 3003 and the like. The TFTs fabricated according to the invention is to be applied to the display part 3003. Thus, the invention can complete a television receiver.

Figure 26B:
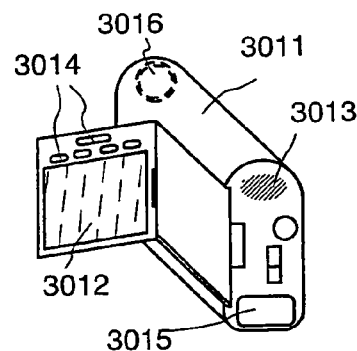

FIG. 26B is an example of a video camera completed by applying the invention, which is constructed with a main body 3011, a display part 3012, a voice input part 3013, an operation switch 3014, a battery 3015, an image receiving part 3016 and the like. The TFTs fabricated according to the invention is to be applied to the display part 3012. Thus, the invention can complete a video camera.

Figure 26C:
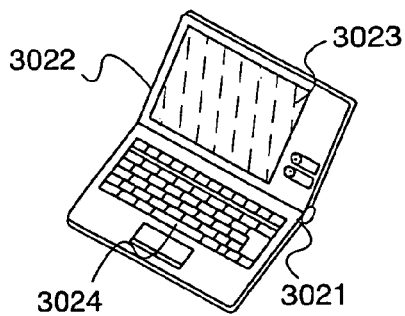

FIG. 26C is an example of a notebook personal computer completed by applying the invention, which is constructed with a main body 3021, a housing 3022, a display part 3023, a keyboard 3024 and the like. The TFTs fabricated according to the invention is to be applied to the display part 3023. Thus, the invention can complete a personal computer.

Figure 26D:
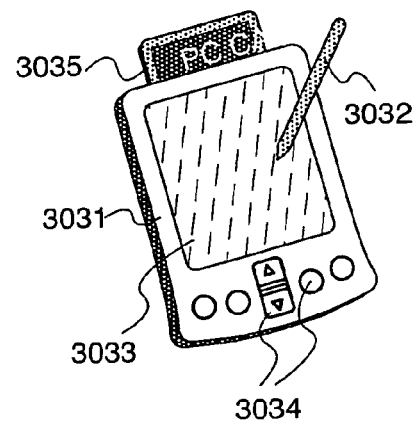

FIG. 26D is an example of a PDA (Personal Digital Assistant) completed by applying the invention, which is constructed with a main body 3031, a stylus 3032, a display part 3033, an operation button 3034, an external interface 3035 and the like. The TFTs fabricated according to the invention is to be applied to the display part 3033. Thus, the invention can complete a PDA.

Figure 26E:
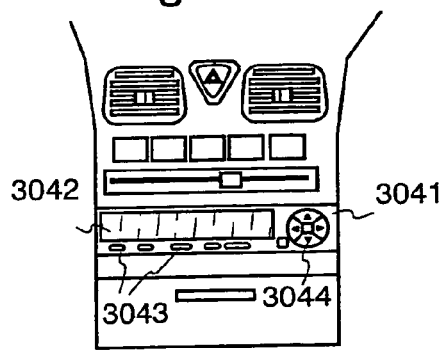

FIG. 26E is an example of an audio reproducing apparatus completed by applying the invention, specifically a vehicular audio apparatus, which is constructed with a main body 3041, a display part 3042, an operation switch 3043, 3044 and the like. The TFTs fabricated according to the invention is to be applied to the display part 3042. Thus, the invention can complete an audio apparatus.

Figure 26F:
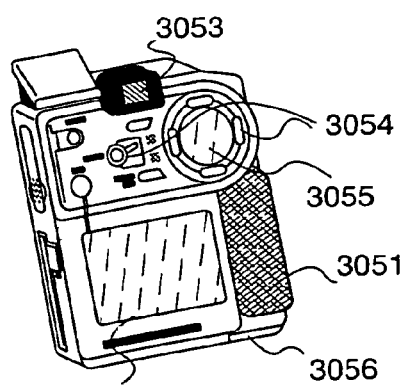

FIG. 26F is an example of a digital camera completed by applying the invention, which is constructed with a main body 3051, a display part A 3052, an eyepiece 3053, an operation switch 3054, a display part B 3055, a battery 3056 and the like. The TFTs fabricated according to the invention is to be applied to the display part A 3052 and display part B 3055. Thus, the invention can complete a digital camera.

Figure 26G:
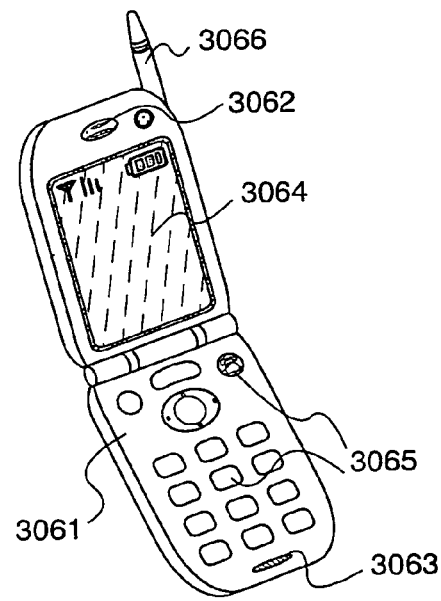

FIG. 26G is an example of a cellular phone completed by applying the invention, which is constructed with a main body 3061, a sound output part 3062, a voice input part 3063, a display part 3064, an operation switch 3065, an antenna 3066 and the like. The TFTs fabricated according to the invention is to be applied to the display part 3064. Thus, the invention can complete a cellular phone.

Figure 27A:
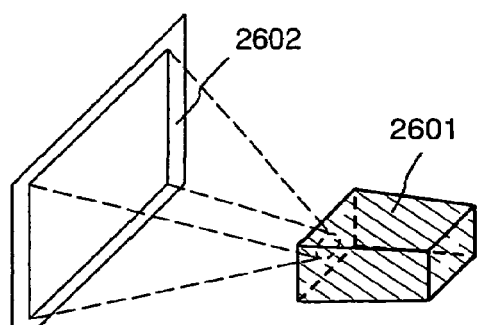
FIGS. 27A, 27B, 27C and 27D are views showing examples of projectors.
Figure 27B:
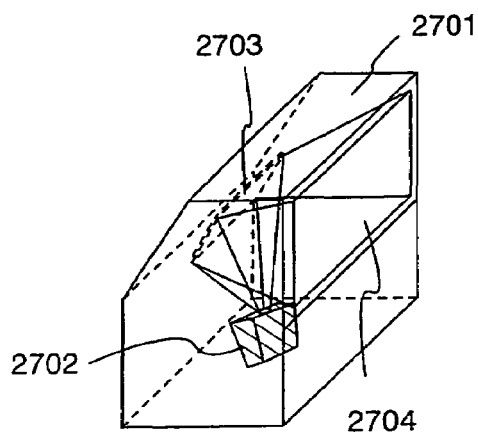

FIG. 27A is a front-type projector including a projector unit 2601 and a screen 2602. FIG. 27B is a rear-type projector including a main body 2701, a projector unit 2702, a mirror 2703 and a screen 2704.

Figure 27C:
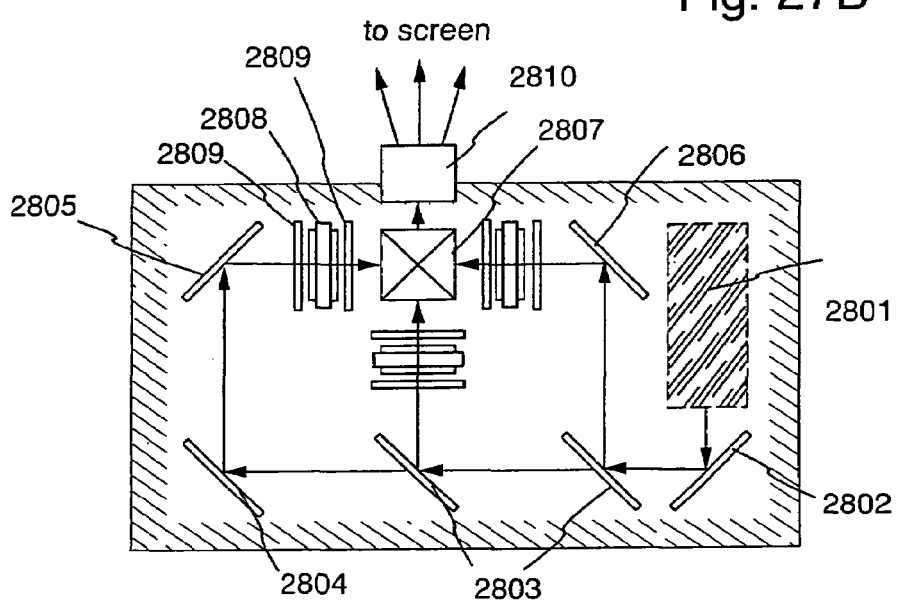

Incidentally, FIG. 27C is a view showing one example of structure of the projector unit 2601, 2702 in FIGS. 27A and 27B. The projector unit 2601, 2702 is constructed with a light-source optical system 2801, mirrors 2802, 2804-2806, a dichroic mirror 2803, a prism 2807, a liquid-crystal display device 2808, a phase difference plate 2809 and a projection optical system 2810. The projection optical system 2810 is structured with an optical system including a projector lens. This embodiment showed an example of three-plate type. However, there is no especial limitation, e.g. a single-plate type is usable. Meanwhile, it is possible for the practitioner to provide an optical system, such an optical lens, a film having polarizing effect, a film for phase difference adjustment or IR film, as required, on an optical path shown by the arrow in FIG. 27C.

Figure 27D:
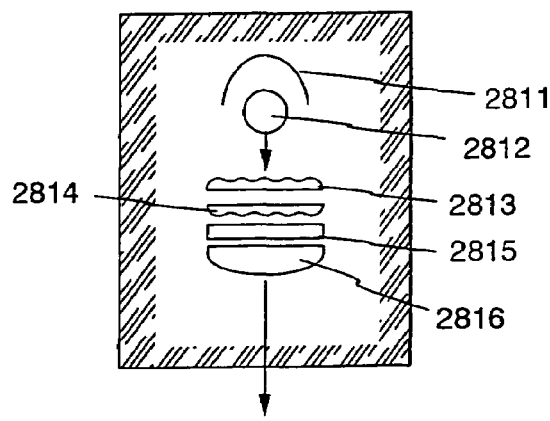

FIG. 27D is a view showing one example of structure of the light-source optical system 2801 in FIG. 27C. In this embodiment, the light-source optical system 2801 is constructed with a reflector 2811, a light source 2812, lens arrays 2813, 2814, a polarization converter element 2815 and a focus lens 2816. Incidentally, the light-source optical system shown in FIG. 27D is one example and not especially limited to. For example, it is possible for the practitioner to properly provide an optical system, such an optical lens, a film having polarizing effect, a film for phase difference adjustment or IR film, on the light-source optical system.

It is noted that the apparatuses shown herein are mere examples and the invention is not limited to the applications of these.

Embodiment 8

This embodiment explains how to form an insulation film having concavo-convex.

Figure 28A:
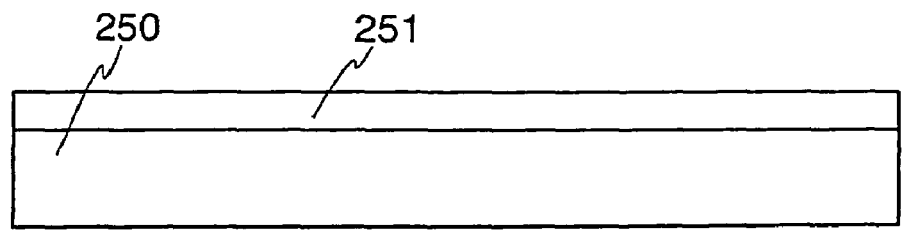
FIGS. 28A, 28B, 28C and 28D are views showing a method for forming an insulation film having a concavo-convex.

At first, a first insulation film 251 is formed on a substrate 250, as shown in FIG. 28A. Although the first insulation film 251 uses silicon oxide nitride in this embodiment, this is not limited to, i.e. an insulation film having a great etching selective ratio to a second insulation film is satisfactory. In this embodiment, the first insulation film 251 was formed to a thickness of 50-200 nm using $SiH_4$ and $N_2O$ by a CVD apparatus. Note that the first insulation film may be of a single layer or a layered structure having a plurality of insulation films.

Figure 28B:
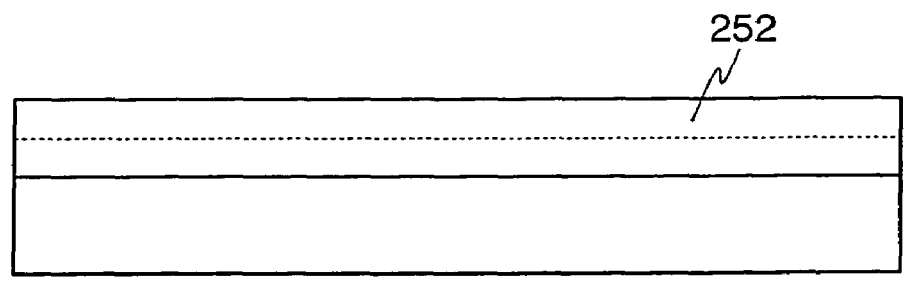

Then, a second insulation film 252 is formed in contact with the first insulation film 252) as shown in FIG. 28B. The second insulation film 252 requires a film thickness to a degree that, when a concavo-convex is formed thereon by patterning in a subsequent process, the concavo-convex appears on a surface of a semiconductor film to be subsequently deposited. This embodiment forms, as the second insulation film 252, silicon oxide having 30 nm-300 nm by using a plasma CVD process.

Figure 28C:
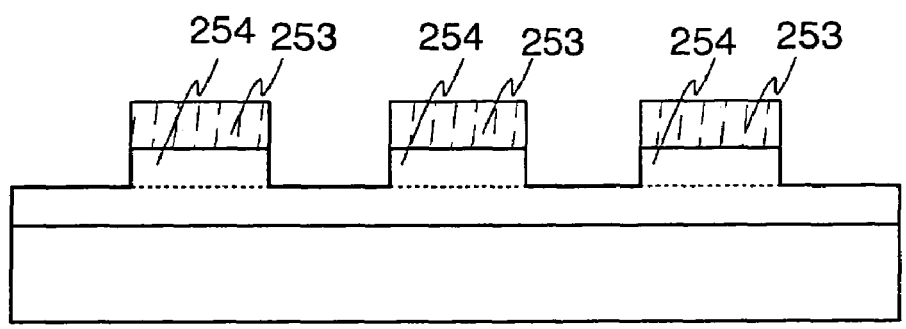
Figure 28D:
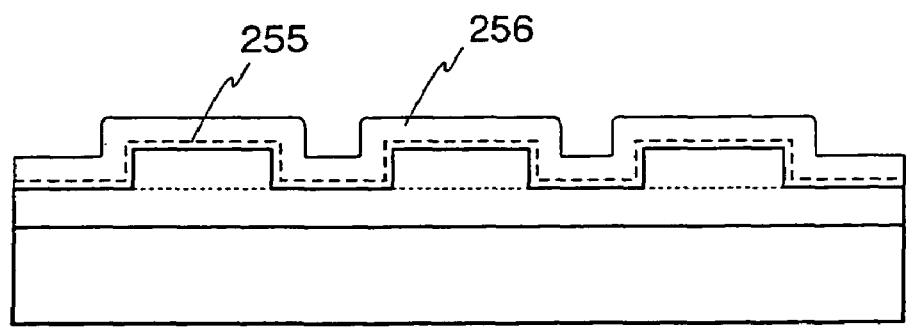

Next, a mask 253 is formed as shown in FIG. 28C to etch the second insulation film 252. This embodiment conducts wet etching at 20° C. using an etchant of a mixture solution containing 7.13% of ammonium hydrogen fluoride ($NH_4HF_2$) and 15.4% of ammonium fluoride ($NH_4F$) (product name: LAL500 by Stellachemiphar). This etching forms a convex part (projection part) 254 in a rectangular or stripe form. In this specification, a combination of the first insulation film 251 and the convex part (projection part) 254 is considered as one insulation film.

Then, a semiconductor film is formed covering the first insulation film 251 and convex part (projection part) 254. Because in the embodiment the convex part (projection part) has a thickness of 30 nm-300 nm, the semiconductor film is desirably given a film thickness of 50-200 nm, herein 60 nm. Incidentally, in case an impurity is mixed between the semiconductor film and the insulation film, there is a possibility that bad affection is exerted to the crystallinity of semiconductor film to increase the characteristic and threshold voltage variation of the TFT fabricated. Accordingly, the insulation film and the semiconductor film are desirably formed continuously. For this reason, in this embodiment, after forming an insulation film comprising the first insulation film 251 and the convex part (projection part) 254, a silicon oxide film is formed in a small thickness on the insulation film, followed by continuously forming a semiconductor film 256 without exposure to the air. The thickness of silicon oxide film, although properly set by the designer, was given 5 nm-30 nm in this embodiment.

Incidentally, when etching the second insulation film 252, the convex part (projection part) may be etched into a taper form. By making the convex part (projection part) in a taper form, a semiconductor film, gate insulation film or gate electrode is prevented from having disconnection at a convex-region edge.

Now, explanation is made on a different way to form an insulation film. At first, a first insulation film 261 is formed on a substrate 260, as shown in FIG. 29A. The first insulation film is formed of silicon oxide, silicon nitride or silicon oxide nitride.

In the case of using a silicon oxide nitride film, it can be formed by mixing Tetraethyl Ortho Silicate (TEOS) and $O_2$ and subjecting it to a plasma CVD process with discharge under a reaction pressure of 40 Pa, at a substrate temperature of 300-400° C. and with a radio frequency (13.56 MHz) power density of 0.5-0.8 W/cm$_2$. In the case of using a silicon oxide nitride film, it may be formed by a plasma CVD process with a silicon oxide nitride film formed from $SiH_4$, $N_2O$ and $NH_3$ or a silicon oxide nitride film formed from $SiH_4$ and $N_2O$. This is performed under a forming condition of a reaction pressure of 20-200 Pa and a substrate temperature of 300-400° C., with a radio frequency (60 MHz) power density of 0.1-1.0 W/cm$^2$. Meanwhile, a silicon oxide nitride hydride film may be used that is to be formed from $SiH_4$, $N_2O$ and $H_2$. A silicon nitride film can be similarly formed from $SiH_4$ and $NH_3$ by a plasma CVD process.

After forming a first insulation film to a thickness of 20-200 nm (preferably 30-60 nm) over the entire surface of the substrate, a mask 262 is formed by using a photolithography technique as shown in FIG. 29B. Unwanted regions are removed away to form a convex part (projection part) 263 in a stripe or rectangular form. On the first insulation film 261, a dry etching process may be used that uses a fluorine-based gas. Otherwise, a wet etching process may be used that uses a fluorine-based solution. In the case of selecting the latter, etching is preferably conducted using a mixture solution containing 7.13% of ammonium hydrogen fluoride ($NH_4HF_2$) and 15.4% of ammonium fluoride ($NH_4F$) (product name: LAL500 by Stellachemiphar).

Then, a second insulation film 264 is formed covering the convex part (projection part) 263 and substrate 260. This layer is formed of silicon oxide, silicon nitride or silicon oxide nitride to a thickness of 50-300 nm (preferably 100-200 nm), similarly to the first insulation film 261.

By the above fabrication process, an insulation film is formed comprising the convex part (projection part) 263 and the second insulation film 264. After forming the second insulation film 264, by continuously forming a semiconductor film without exposure to the air, the impurities in the air are prevented from mixing between the semiconductor film and the insulation film.

Figure 30A:
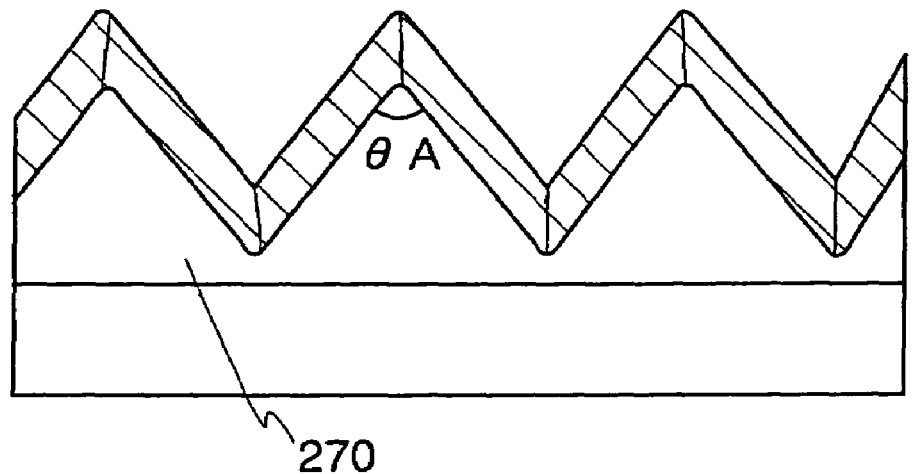
FIGS. 30A and 30B are views showing forms of insulation films having a concavo-convex.
Figure 30B:
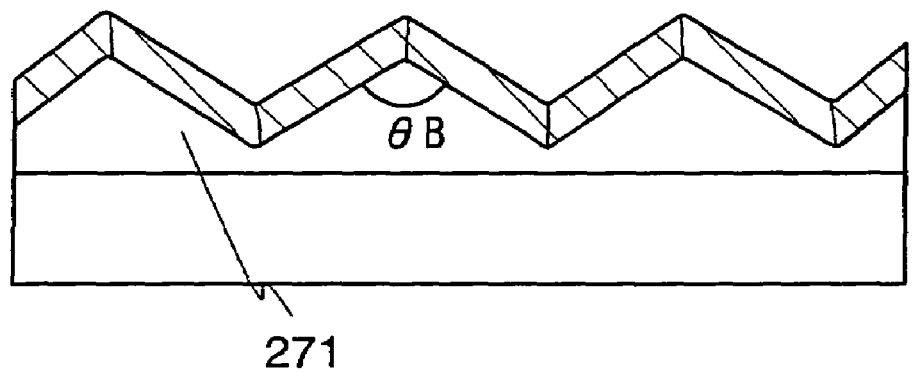

Explanation is now made on an insulation film having a triangular convexes in a section perpendicular to a scanning direction of laser light. FIGS. 30A and 30B show sectional views different in angle of the convex edge of insulation film. An insulation film 270 in FIG. 30A has an angle $\theta_A$ of 70.5 degrees at the convex edge while an insulation film 271 in FIG. 30B has an angle $\theta_B$ of 109.5 degrees at the convex edge. In FIG. 30A, there is an increased ratio of (100) plane on a surface parallel with the semiconductor film substrate. In FIG. 30B, the ratio of (110) plane is increased.

The triangular insulation film of FIG. 30 is obtained by etching the mask together with the semiconductor film during etching using a dry etch process.

Explanation is made on how to form an insulation film of FIG. 30, by using FIG. 31. As shown in FIG. 31A, an insulation film 273 is formed over a substrate 272. Then, a mask 274 is formed on the insulation film 273. Next, the mask 274 is used to conduct etching by a dry etching process, thereby etching the insulation film 273 as shown in FIG. 31B into a tapered insulation film 276. At this time, the mask 274 is also etched into a mask 275 somewhat smaller in size.

Figure 31A:
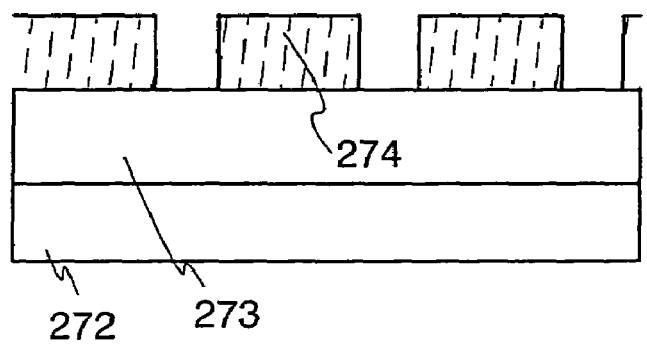
FIGS. 31A, 31B, 31C and 31D are views showing a method for forming an insulation film having a concavo-convex.
Figure 31B:
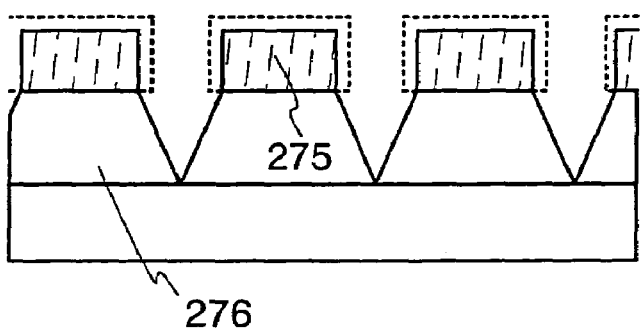
Figure 31C:
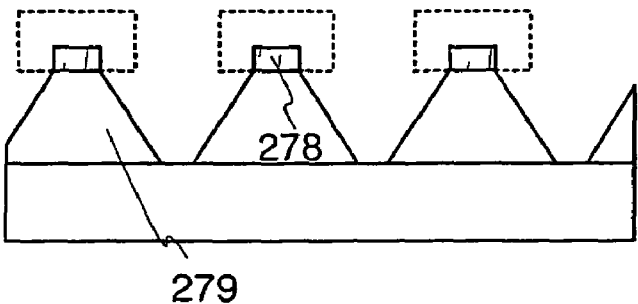

As dry etching is continued, the insulation film 276 is etched as shown in FIG. 31C. The taper angle decreases with respect to the substrate into an insulation film 279. At this time, the mask 275 is also etched into a mask 278 somewhat smaller in size.

Figure 31D:
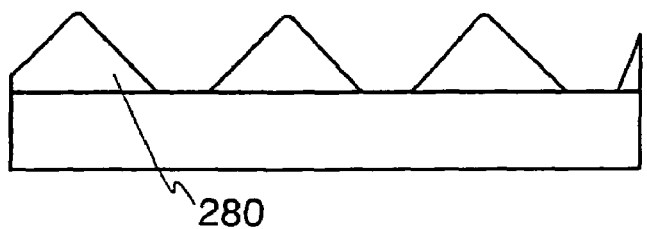

By proceeding the etching until the mask 278 is completely removed away by etching, an insulation film 280 can be formed that has a triangular section as shown in FIG. 31D. The angle at the convex edge can be controlled by a film thickness of the insulation film before etching, a width of the mask 274 before etching in a direction perpendicular to a scanning direction of laser light, and an etching selective ratio of insulation film and mask.

Incidentally, by crystallizing the semiconductor film formed on the insulation film shown in FIG. 30, grain boundaries are readily formed in the vicinity of the edge of the convex and concave part rather than in a region in contact with a flat region of insulation film. Accordingly, it is preferred to remove the semiconductor film in the vicinity of the edge of convex and concave part by patterning and use, as an active layer, the remaining region comparatively excellent in crystallinity.

Embodiment 9

This embodiment explains an example that a semiconductor film formed on an insulation film in a stripe form is crystallized by laser light irradiation and thereafter mutually isolated islands are formed on a surface parallel with an convex-formed substrate to fabricate TFT using the islands.

Figure 32A:
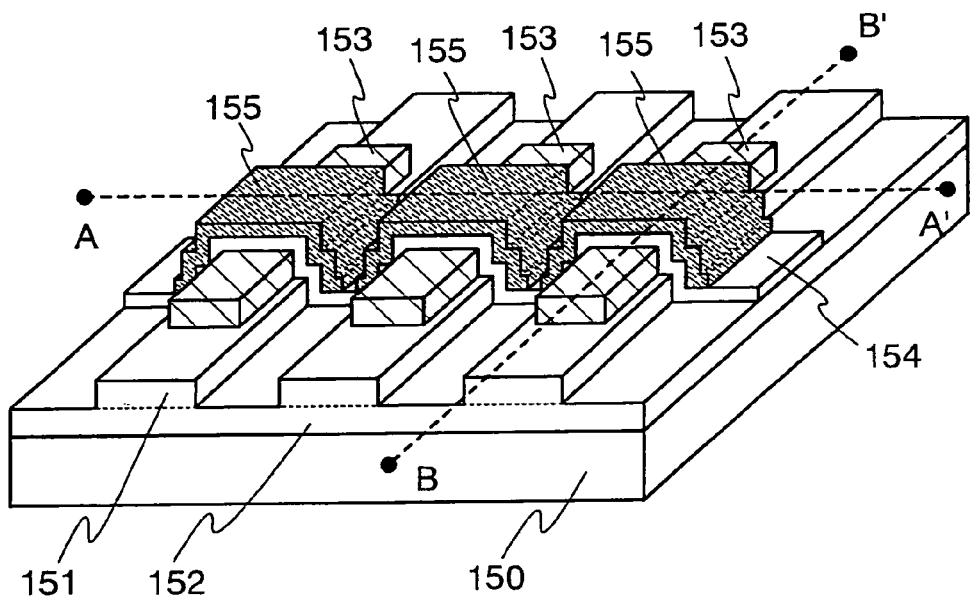
FIGS. 32A, 32B and 32C are views of an island formed by patterning the crystallized semiconductor film.

FIG. 32A shows a TFT structure of this embodiment. In FIG. 32A, an insulation film 152 having striped convex parts (projection parts) 151 is formed on a substrate 150. A plurality of islands 153 are formed, isolated from one another, on the top surfaces of the convex parts. (projection parts) 151. A gate insulation film 154 is formed in a manner contacting with the islands 153. Incidentally, although the gate insulation film 154 in FIG. 32A is formed exposing the regions, to be made into impurity regions, of the island, it may be formed covering the entire island 154.

A plurality of gate electrodes 155 are formed on the gate insulation film 154 in a manner superposed over a plurality of islands 153. The plurality of gate electrodes 155 may be mutually connected depending upon a circuit configuration.

Figure 32B:
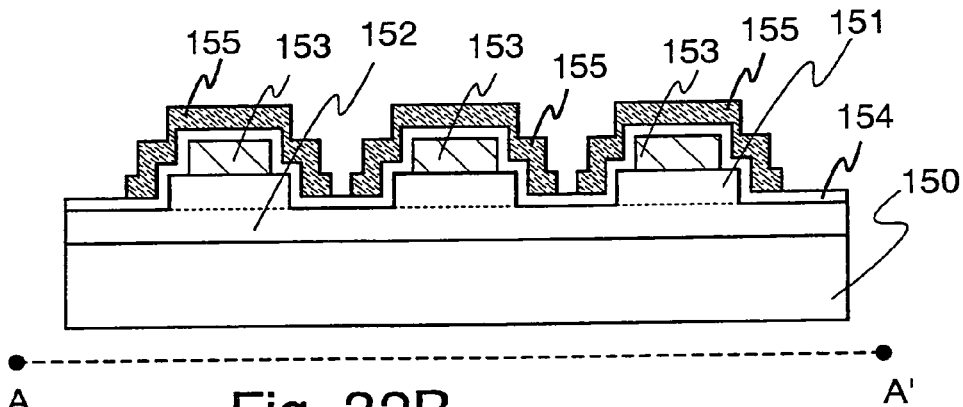
Figure 32C:
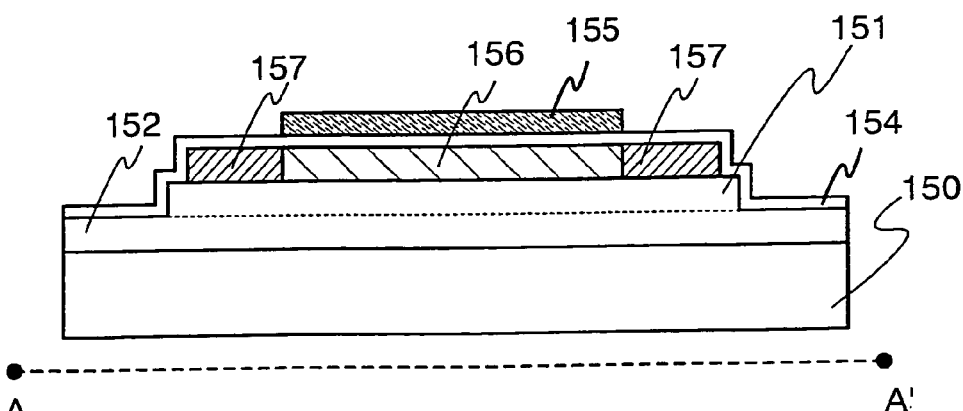

Note that the sectional view on the line A-A' in FIG. 32A corresponds to FIG. 32B while the sectional view on the line B-B' in FIG. 12A corresponds to FIG. 32C. As shown in FIG. 32C, each gate electrode 155 is superposed on a channel region 156 of the island 153 with gate insulation film 154 sandwiched therebetween. The channel region 156, in turn, is sandwiched between two impurity regions 157 included also in the island 153.

This embodiment can be implemented in combination with Embodiment 4 or Embodiment 8.

Embodiment 10

This embodiment explains variations of insulation film forms.

Figure 33A:
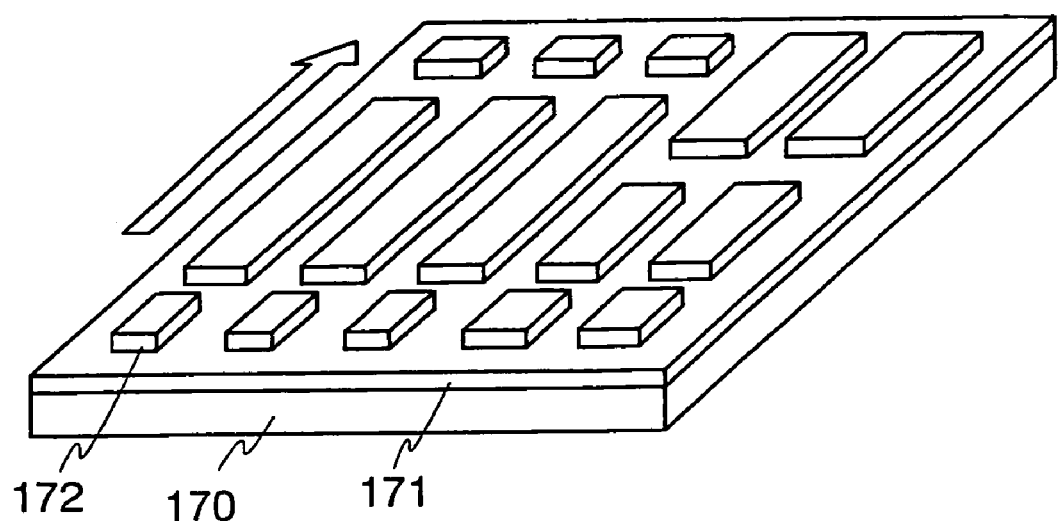
FIGS. 33A and 33B are views showing forms of insulation films having a concavo-convex.

FIG. 33A shows an embodiment on an insulation film form of the invention. In FIG. 33A, an insulation film 171 is formed on a substrate 170 wherein the insulation film 171 has a plurality of convex parts (projection parts) 172. The convex part 172 is rectangular in form as viewed from the above. All the convex parts (projection parts) have respective rectangular longer or shorter sides in a direction parallel with a scanning direction of laser light shown by the arrow.

The convex parts (projection parts) 172 are not necessarily identical to one another in the width in laser-light scanning direction and the width perpendicular to the scanning direction. Insulation film form is desirably designed to meet a desired island form.

Figure 33B:
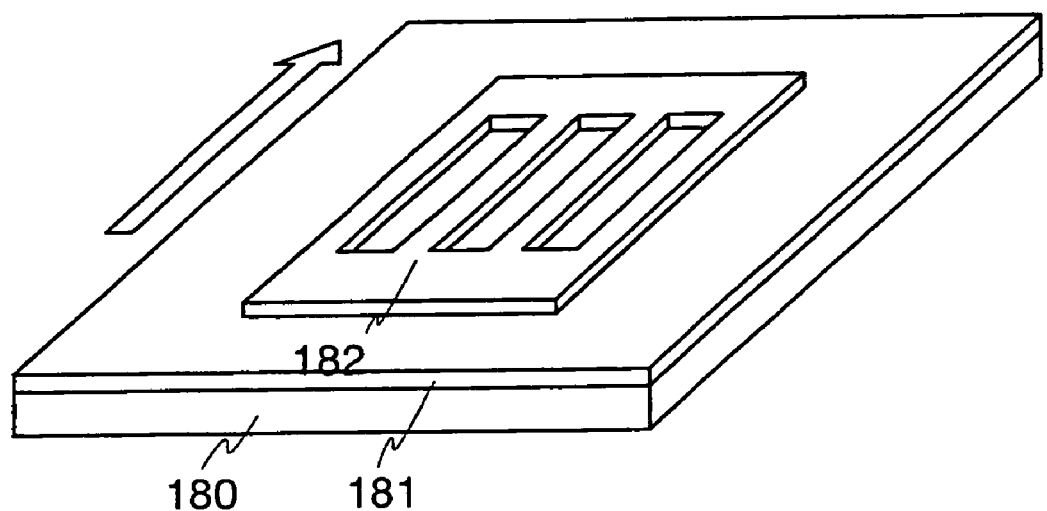

FIG. 33B shows an embodiment on an insulation film form of the invention. In FIG. 33B, an insulation film 181 is formed on a substrate 180. The insulation film 181 is formed with a rectangular convex part (projection part) 182 having slit-like openings as viewed from the above. In the convex part (projection part) 182, the slit has a longer or shorter side in parallel with a scanning direction of laser light shown by the arrow.

Explanation is now made on an example of a TFT structure formed by using the insulation film having slit-like openings shown in FIG. 33B.

FIG. 34A shows a top view of the TFT of this embodiment. As shown in FIG. 34A, this embodiment used an insulation film having a rectangular convex part (projection part) 160 having therein slit-like openings. A semiconductor film is formed covering the convex part (projection part) 160. Laser light is scanned, in a direction shown by the arrow, along a direction of a longer axis of the slit-like opening to crystallize the semiconductor film. Then, the semiconductor film is patterned to form an island 161 having an opening formed in the upper surface of the convex part (projection part).

Then, a gate insulation film 162 is formed in a manner contacting with the island 161. Note that the sectional view on the line A-A' in FIG. 34A is shown in FIG. 34B, the sectional view on the line B-B' in FIG. 34C and the sectional view on the line C-C' in FIG. 34D.

Then, a conductive film is formed on the gate insulation film 162. By patterning the conductive film, a gate electrode 163 is formed. The gate electrode 163 is superposed on a channel region 164 of the island 161 with gate insulation film sandwiched therebetween. The channel region 164 is sandwiched between the two impurity regions 165 included in the island 161.

A first interlayer insulation film 166 is formed covering the gate electrode 163, island 161 and gate insulation film 162. The first interlayer insulation film 166 is formed of inorganic insulator having an effect to prevent a substance, such as alkali metal, having a bad effect upon TFT characteristics from mixing in the island 161.

A second interlayer insulation film 167 is formed of organic resin on the first interlayer insulation film 166. Openings are formed, by etching, through the second interlayer insulation film 167, first interlayer insulation film 166 and gate insulation film 162. Through the openings, the interconnections 168, 169 are formed on the second interlayer insulation film 167, respectively connecting between the two impurity regions 165 and the gate electrode 163.

In this embodiment, channel regions 164 are formed in plurality and the channel regions are isolated from each other. Accordingly, by increasing the channel width of the channel region, the heat generated by driving the TFT can be efficiently dissipated while securing on-current.

Embodiment 11

This embodiment explains a method for manufacturing an active-matrix substrate using a laser crystallization method of the invention, by using FIGS. 35-38. In this description, the substrate forming, on the same substrate, a CMOS circuit and a pixel region having drive circuit, pixel TFTs and hold capacitances is referred to as an active-matrix circuit, for convenience sake.

This embodiment uses a substrate 600 formed of a glass such as barium borosilicate glass or aluminum borosilicate glass. The substrate 600 may use a quartz, silicon, metal or stainless steel substrate formed with an insulation film on a surface thereof. Otherwise, a plastic substrate may be used that has a heat resistance to withstand at process temperature in this embodiment.

Then, an insulation film of silicon oxide, silicon nitride or silicon oxide nitride is formed in a thickness of 100-300 nm on the substrate 600, by the known means (sputter process, LPCVD process, plasma CVD process or the like).

Figure 35A:
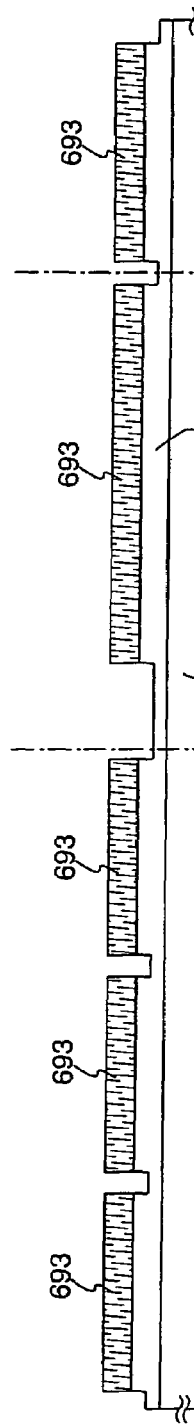
FIGS. 35A, 35B, 35C and 35D are views showing a method for manufacturing a semiconductor device using the invention.

Next, in order to form a large and small thickness regions in the insulation film, the embodiment forms a resist mask 693 by a photolithography technique and carries out an etching process on it. Although the dimensions of a step is determined by an etching amount, the embodiment provides nearly 50-100 nm. For example, to etch a silicon oxide nitride film having 150 nm by 75 nm, it is possible to use wet etching using a solution containing hydrogen fluoride or applying a dry etching using $CF_4$. In this manner, an insulation film 601 formed with a convex form is formed. In this case, the width of a convex part (projection part) perpendicular to a scanning direction may be properly determined taking a TFT size into consideration, preferably a size (in diameter or diagonal length) of approximately 2-6 µm for the purpose of controlling the number of crystal nucleations (FIG. 35A).

Figure 35B:
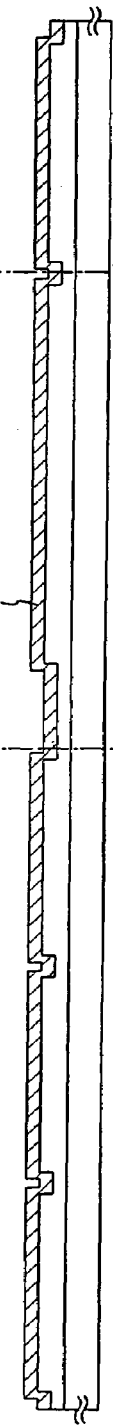

Then, an amorphous semiconductor film 692 is formed in a thickness of 25-80 nm (preferably 30-60 nm) on the insulation film 601, by the known means (sputter process, LPCVD process, plasma CVD process or the like) (FIG. 35B). Incidentally, although this embodiment forms an amorphous semiconductor film, a fine crystal semiconductor film or crystalline semiconductor film is also applicable. Otherwise, an amorphous-structured compound semiconductor film, such as an amorphous silicon-germanium film, may be used.

Next, the amorphous semiconductor film 692 is crystallized by a laser crystallization method. The scanning direction of laser light is parallel with an extension of the striped convex part (projection part) of insulation film 601. Incidentally, where the convex part (projection part) of insulation film 601 is rectangular as viewed from the above of the substrate, the scanning direction of laser light is defined parallel with a direction of a longer or shorter side of the rectangle. Specifically, laser light is preferentially irradiated according to the information about mask inputted to the computer of the laser irradiation apparatus. Of course, besides the laser crystallization method, this may be combined with other known crystallization methods (thermal crystallization method using RTA or furnace anneal, thermal crystallization method using a metal element to promote crystallization, or the like). Although the embodiment shows an example to change a laser beam width to a width of insulation film perpendicular to a scanning direction by the use of a slit, the invention is not limited to this, i.e. the slit is not necessarily required to be used.

In crystallizing the amorphous semiconductor film, by using a continuous oscillatable solid laser and a second to fourth harmonic of basic wave, an increased grain size of crystal can be obtained. Typically, desirably used is the second harmonic (532 nm) or third harmonic (355 nm) of an Nd:YVO$_4$ laser (basic wave: 1064 nm). Specifically, the laser light emitted from a continuous-oscillation YVO$_4$ laser is changed into a harmonic by a nonlinear optical device to obtain a 10 W-output laser light. Meanwhile, there is a method that an YVO$_4$ crystal and a nonlinear optical device are inserted in a resonator to emit a higher harmonic. Preferably, laser light is formed by an optical system into a rectangular or elliptic form on irradiation plane, which is irradiated to a subject to be worked. The energy density, in this case, requires approximately 0.01-100 MW/cm$^2$ (preferably 0.1-10 MW/cm$^2$). For irradiation the semiconductor film is moved at a speed of approximately 10-2000 cm/s relatively to laser light.

In laser irradiation can be used a pulse-oscillation or continuous-oscillation gas laser or solid laser. Gas lasers includes ah excimer laser, an Ar laser and a Kr laser. Solid lasers includes a YAG laser, a YVO$_4$ laser, a YLF laser, a YAlO$_3$ laser, a glass laser, a ruby laser, an alexandorite laser, a Ti:sapphire laser and a Y$_2$O$_3$ laser. As the solid laser can be used a laser using a crystal of YAG, YVO$_4$, YLF or YAlO$_3$ doped with Cr, Nd, Er, Ho, Ce, Co, Ti Yb or Tm. Also, a slab laser is usable. The laser has a different basic wave depending upon a doping material, providing laser light having a basic wave at around 1 µm. The harmonic to basic wave is available by the use of a non-linear optical device.

Figure 35C:
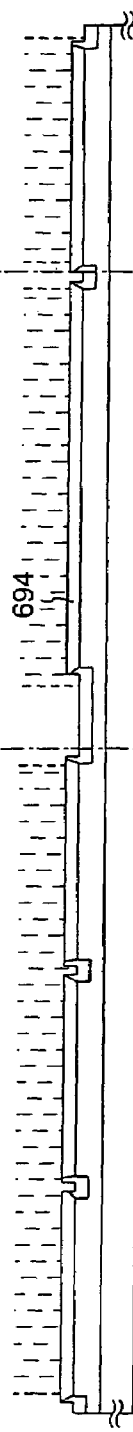

The foregoing laser crystallization forms a crystalline semiconductor film 696 enhanced in crystallinity (FIG. 35C). In the crystalline semiconductor film, grain boundaries tend to occur at or around the concave or convex part (projection part) edge.

Figure 35D:
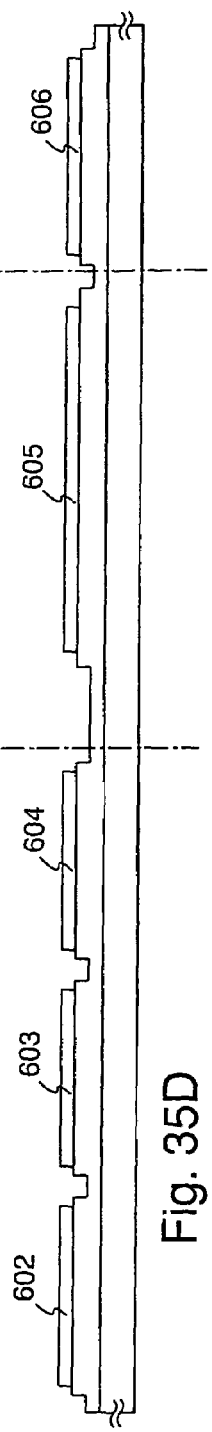

Next, the crystalline semiconductor film 694 enhance in crystallinity is patterned into a desired form to form crystallized islands 602-606 (FIG. 35D).

After forming the islands 602-606, a slight amount of impurity element (boron or phosphorus) may be doped in order to control the TFT threshold.

Then, a gate insulation film 607 is formed covering the islands 602-606. The gate insulation film 607 is formed by an insulation film containing silicon to a thickness of 40-150 nm, by using a plasma CVD or sputter process. In this embodiment is formed a silicon oxide nitride film (composition ratio: Si=32%, O=59%, N=7%, H=2%) in a thickness of 110 nm by a plasma CVD process. Naturally, the gate insulation film is not limited to the silicon oxide nitride film but a single-layer or layered-structure of insulation layers containing silicon.

Meanwhile, in the case of using silicon oxide, it can be formed by a plasma CVD process wherein TEOS (Tetraethyl Orthosilicate) and O$_2$ are mixed together and discharge is caused with a radio frequency (13.56 MHz) power density of 0.5-0.8 W/cm2 at a reaction pressure of 40 Pa and at a substrate temperature of 300-400° C. The silicon oxide film thus formed is thereafter subjected to thermal anneal at 400-500° C., thereby obtaining a favorable characteristic as a gate insulation film.

Next, on the gate insulation film 607 are layered a first conductor film 608 having a film thickness of 20-10 nm and a second conductor film 609 having a film thickness of 100-400 nm (FIG. 36A). In this embodiment formed are the layers of a first conductor film 608 of TaN having a film thickness of 30 nm and a second conductor film 609 of W having a film thickness of 370 nm. The TaN film is formed by a sputter process in which a Ta target is used to cause sputter in an atmosphere containing nitrogen. The W film was formed by a sputter process using a W target. Besides, forming is possible by a thermal CVD process using tungsten hexafluoride (WF$_6$). In any case, resistance reduction is required for use as a gate electrode. It is desired to reduce the resistivity of W film to 20 µΩcm or less. The W film can be decreased in resistivity by increasing its grain size. However, where there is much impurity element such as oxygen in the W film, crystallization is hindered to raise resistance. Accordingly, this embodiment forms a W film by a sputter process using a high purity of W (purity: 99.9999%) target while giving full consideration not to mix impurities from a gas phase during deposition, thereby realizing a resistivity of 9-20 µΩcm.

Although in this embodiment used are TaN for the first conductor film 608 and W for the second conductor film 609, there is no especial limitation, i.e. any of them may be formed of an element selected from Ta, W, Ti, Mo, Al, Cu, Cr and Nd or an alloy or compound material based on the element. Meanwhile, a semiconductor film may be used that is represented by a polysilicon film doped with an impurity element such as phosphorus. Otherwise, an AgPdCu alloy may be used. Besides, can be used a combination of the first conductor film formed by a tantalum (Ta) film and the second conductor film by a W film, a combination of the first conductor film formed by a titanium nitride (TiN) film and the second conductor film by a W film, a combination of the first conductor film formed by a tantalum nitride (TaN) film and the second conductor film by a W film, a combination of the first conductor film formed by a tantalum nitride (TaN) film and the second conductor film by an Al film, or a combination of the first conductor film formed by a tantalum nitride (TaN) film and the second conductor film by a Cu film.

Meanwhile, the two-layer structure is not limitative, e.g. a three-layer structure is applicable that has the layers of a tungsten film, an aluminum-silicon (Al—Si) alloy film and a titanium nitride film in the order. In the case with a three-layer structure, it is possible to use tungsten nitride in place of tungsten, an aluminum-titanium (Al—Ti) alloy film in place of an aluminum-silicon (Al—Si) alloy film or a titanium film in place of a titanium nitride film.

Incidentally, it is emphasized to properly select an optimal etching scheme or etchant kind depending upon a conductor film material.

Next, a photolithography process is used to form a resist mask 610-615 to carry out a first etching process for forming electrodes and interconnections. The first etching process is carried out under first and second etching conditions (FIG. 16B). In this embodiment, as the first etching condition used is an ICP (Inductively Coupled Plasma) etching scheme. Etching is conducted causing a plasma by supplying 500 W RF (13.56 MHz) power to a coil type electrode and using etching gas of $CF_4$, $Cl_2$ and $O_2$ with a flow rate ratio of these gases of 25:25:10 (sccm) under a pressure of 1 Pa. 150 W RF (13.56 MHz) power is also supplied to a substrate side (sample stage) to apply substantially a negative bias voltage. The W film is etched under the first etching condition to make an end of the first conductor layer into a taper form.

Thereafter, the resist mask 610-615 is not removed for change into the second etching condition. Etching was conducted causing a plasma for approximately 30 seconds by supplying 500 W RF (13.56 MHz) power to the coil type electrode and using etching gas of $CF_4$ and $Cl_2$ with a flow rate ratio of these gases of 30:30 (sccm) under a pressure of 1 Pa. 20 W RF (13.56 MHz) power is supplied to the substrate side (sample stage) to apply substantially a negative bias voltage. Under the second etching condition mixed with $CF_4$ and $Cl_2$, the W film and the TaN film are both etched in the same degree. In order to conduct etching without leaving residues on the gate insulation film, etching time is preferably increased by a percentage of 10-20%.

In the above first etching process, by providing the resist mask with a suitable form, the first conductor layer and second conductor layer at respective ends are made in a taper form due to the effect of a bias voltage applied to the substrate side. The taper has an angle of 15-45 degrees. On the first etching process formed is a first-formed conductor layer 617-622 having the first and the second conductor layers (first conductor layer 617a-622a and second conductor layer 617b-622b). 616 is a gate insulation film. The region not covered by the first-formed conductor layer 617-622 is etched by approximately 20-50 nm into a thickness-reduced region.

Then, a second etching process is carried out without removing the resist mask (FIG. 36C). Herein, as etching gas are used $CF_4$, $Cl_2$ and $O_2$ to preferentially etch the W film. At this time, a second conductor layer 628-633 is formed by the second etching process. On the other hand, the first conductor layer 617a-622a is least etched which is formed into a second-formed conductor layer 628-633.

Then, a first doping process is carried out without removing the resist mask, to add to the island a low concentration of n-type-providing impurity element. The doping process may be performed by an ion dope or ion implant scheme. The ion dope process is performed under the condition at a dose of $1\times10^{13}$-$5\times10^{14}$ atoms/cm$^2$ and an acceleration voltage of 40-80 kV. In this embodiment it is carried out at a dose of $5\times10^{13}$ atoms/cm$^2$ and at an acceleration voltage of 60 kV. As the n-type-providing impurity element used is an element belonging to Group 15, typically phosphorus (P) or arsenic (As). Herein, phosphorus (P) is used. In this case, the conductor layer 628-633 serves as a mask against the n-type-providing impurity element to form an impurity region 623-627 in a self-aligned fashion. The impurity region 623-627 is added by an n-type-providing impurity element in a concentration range of $1\times10^{18}$-$1\times10^{20}$/cm$^3$.

After removing the resist mask, a new resist mask 634a-634c is formed to carry out a second doping process at an acceleration voltage higher than that of the first doping process. The ion dope process is performed under the condition at a dose of $1\times10^{13}$-$1\times10^{15}$ atoms/cm$^2$ and at an acceleration voltage of 60-120 kV. In the doping process, the second conductor layer 628b-623b is used as a mask against impurity element to carry out doping such that impurity element is added to the island below the taper of the first conductor layer. Subsequently, the acceleration voltage is lowered than that of the second doping process to carry out a third doping process, thus obtaining a state of FIG. 37A. The ion dope process is performed under the condition at a dose of $1\times10^{15}$-$1\times10^{17}$ atoms/cm$^2$ and at an acceleration voltage of 50-100 kV. By the second and third doping processes, the low-concentration impurity region 636, 642, 648 overlapped with the first conductor layer is added by an n-type-providing impurity element in a concentration range of $1\times10^{18}$-$5\times10^{19}$ atoms/cm$^3$ while the high-concentration impurity region 635, 641, 644, 647 is added by an n-type-providing impurity element in a concentration range of $1\times10^{19}$-$5\times10^{21}$ atoms/cm$^3$.

Of course, with a proper acceleration voltage, by the second and third doping processes can be formed low-concentration and high-concentration impurity regions by one round of doping process.

Then, after removing the resist mask, a new resist mask 650a-650c is formed to carry out a fourth doping process. By this fourth doping process, an impurity region 653, 654, 659, 660, added with an impurity element providing an opposite conductivity to the foregoing one conductivity, is formed in the island to be made into a p-cannel TFT active layer. The second conductor layer 628a-632a is used as a mask against impurity element to add a p-type-providing impurity element thereby forming an impurity region in a self-aligned fashion. In this embodiment, the impurity region 653, 654, 659, 660 is formed by an ion dope process using diborane ($B_2H_6$) (FIG. 17B). During the fourth doping process, the island for forming an n-channel TFT is covered with a resist mask 650a-650c. By the first to third doping processes, the impurity regions 653 and 654 or 659 and 660 are added by different concentrations of phosphorus. However, in any of the regions, by carrying out the doping process to a concentration of p-type-providing impurity element of $1\times10^{19}$-$5\times10^{21}$ atoms/cm$^3$, there arises no problem in operating as source and drain regions of a p-channel TFT.

By the process so far, impurity regions are formed in the respective islands.

Then, the resist mask 650a-650c is removed away to form a first interlayer insulation film 661. This first interlayer insulation film 661 is formed by an insulation film containing silicon with a thickness of 50-200 nm by using a plasma CVD or sputter process. In this embodiment formed is a silicon oxide nitride film having a film thickness of 100 nm by a plasma CVD process. Naturally, the first interlayer insulation film 661 is not limited to the silicon oxide nitride film but may be an insulation film containing other form of silicon in a single-layer or layered structure.

Next, as shown in FIG. 37C, a laser irradiation method is used for an activation process. In the case of using a laser anneal process, it is possible to use a laser used in crystallization. In the case of activation, moving speed is the same as that of crystallization, requiring an energy density of approximately 0.01-100 MW/cm$^2$ (preferably 0.01-10 MW/cm$^2$). Meanwhile, a continuous-oscillation laser may be used for crystallization while a pulse-oscillation laser may be used for activation.

Meanwhile, activation process may be carried out prior to forming a first interlayer insulation film.

The heating process (thermal process at 300-550° C. for 1-12 hours) allows for hydrogenation. This process is a process to terminate the dangling bond in the island by the hydrogen contained in the first interlayer insulation film 661. As other means for hydrogenation, plasma hydrogenation may be carried out (using plasma excited hydrogen) or otherwise a heating process at 300-650° C. in an atmosphere containing 3-10% hydrogen for 1-12 hours. In this case, the semiconductor layer can be hydrogenated regardless of the presence of first interlayer insulation film.

Next, a second interlayer insulation film 662 is formed of an inorganic or organic insulation film material on the first interlayer insulation film 661. In this embodiment formed is an acryl resin film having a film thickness of 1.6 μm. Then, after forming a second interlayer insulation film 662, a third interlayer insulation film 672 is formed in contact with the second interlayer insulation film 662. In this embodiment, as the third interlayer insulation film 672 used is a silicon nitride film.

Figure 38:
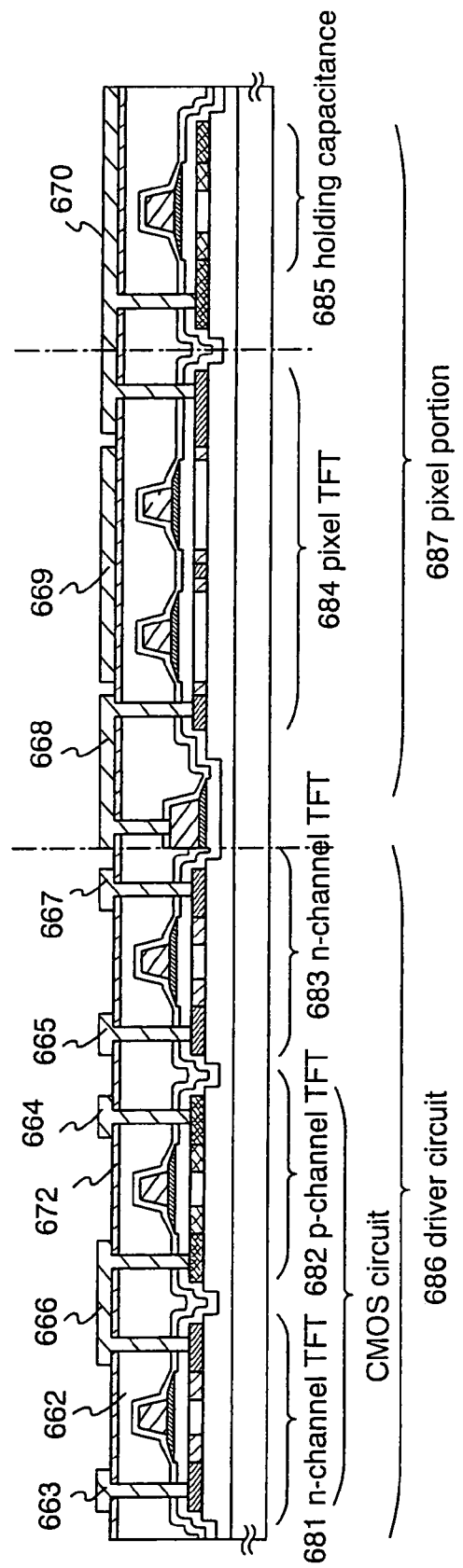
FIG. 38 is a view showing a method for manufacturing a semiconductor device using the invention.

Then, in a drive circuit 686, interconnections 663-667 are formed respectively electrically connected to the impurity regions. These interconnections are formed by patterning a layered film of a Ti film having a film thickness of 50 nm and an alloy film (alloy film of Al and Ti) having a film thickness of 500 nm. Of course, it is not limited to the two-layer structure, i.e. a single-layer structure or a layered structure having three or more layers is also applicable. Meanwhile, the material of interconnection is not limited to Al and Ti. For example, the interconnections may be formed by patterning a layered film in which Al or Cu is formed on a TaN film and further a Ti film is formed (FIG. 38).

Meanwhile, in a pixel region 687, formed are a pixel electrode 670, a gate interconnection 669 and a connection electrode 668. By the connection electrode 668, a source interconnection (layers of 633a and 633b) is electrically connected to the pixel TFT. The gate interconnection 669 is electrically connected to the gate electrode of pixel TFT. The pixel electrode 670 is electrically connected to a drain region 644 of pixel TFT, and to an island 606 serving as one electrode forming a hold capacitance. Meanwhile, although in the description the pixel electrode and the connection electrode are formed of the same material, as the pixel electrode 670 preferably used is a material excellent in reflectance, e.g. a film based on Al or Ag or a layered film of them.

As in the above, it is possible to form, on the same substrate, the drive circuit 686 having a CMOS circuit comprising an n-channel TFT 681 and a p-channel TFT 682 and an n-channel TFT 683, and the pixel region 687 having a pixel TFT 684 and a hold capacitance 685. In this manner, an active-matrix substrate is completed.

The n-channel TFT 681 in the drive circuit 686 has a channel region 637, a low-concentration impurity region 636 (GOLD (Gate Overlapped LDD) region) overlapped with a first conductor layer 628a constituting a part of a gate electrode, and a high-concentration impurity region 652 serving as a source or drain region. The p-channel TFT 682, connected to the n-channel TFT 681 by an electrode 666 to form a CMOS circuit, has a channel region 640, a high-concentration impurity region 653 serving as a source or drain region, and a low-concentration impurity region 654 introduced with a p-type-providing impurity element. Also, the n-channel TFT 683 has a channel region 643, a low-concentration impurity region 642 overlapped with the first conductor layer 630a constituting a part of the gate electrode (GOLD region), and a high-concentration impurity region 656 serving as a source or drain region.

The pixel TFT 684 in the pixel region has a channel region 646, a low-concentration impurity region 645 formed on the outer side of the gate electrode (LDD region), and a high-concentration impurity region 644 serving as a source or drain region. Meanwhile, the island serving as one electrode of the hold capacitance 685 is added with n-type-providing and p-type-providing impurity elements. The hold capacitance 685, having a insulation film 616 as a dielectric, is formed with electrodes (overlying layers of 632a and 632b) and the island 606.

In the pixel structure of this embodiment, the pixel electrodes are arranged superposed at their ends with the source interconnection to shadow the gap of between pixel electrodes without the use of a black matrix.

Incidentally, although this embodiment explained the structure of the active-matrix substrate for use on a liquid-crystal display device, a light-emitting device can be fabricated by using the making process of this embodiment. The light-emitting device refers generally to the display panel sealing the light-emitting elements formed on a substrate between the substrate and a cover member, and to the display module mounting TFTs or the like on such a display panel. Incidentally, the light-emitting element has a layer containing an organic compound capable of obtaining electro luminescence by applying an electric field (light-emitting layer), an anode layer and a cathode layer.

Incidentally, the light-emitting element used in this embodiment possibly takes a form that the hole injection layer, electron injection layer, hole transport layer or electron transport layer is formed of a material of an inorganic compound singly or of an organic compound mixed with an inorganic compound. Meanwhile, these layers may be, partly mixed with one another.

Embodiment 12

This embodiment explains an example of a combination of a laser irradiation process and a semiconductor film crystallizing process using a catalyst when crystallizing a semiconductor film. In the case of using a catalytic element, desirably used is an art disclosed in JP-A-130652/1995 and JP-A-78329/1996.

Figure 39A:
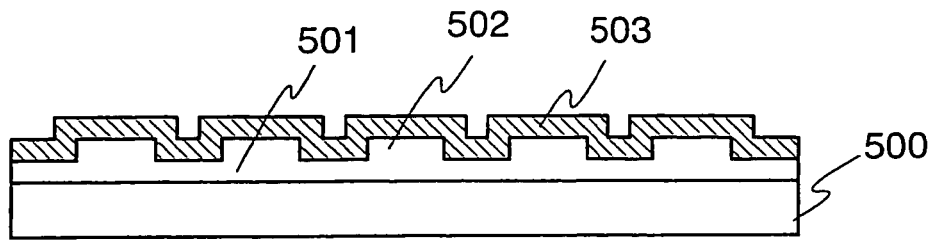
FIGS. 39A, 39B, 39C, 39D and 39E show views showing a method for crystallizing the semiconductor film.

At first, as shown in FIG. 39A, an insulation film 501 having a convex part (projection part) 502 is formed on a substrate 500. Then, a semiconductor film 503 is formed on the insulation film 501.

Figure 39B:
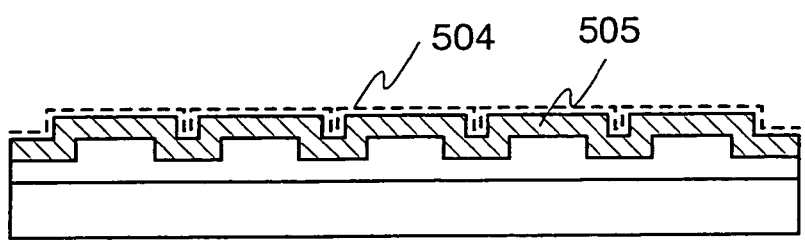
Figure 39C:
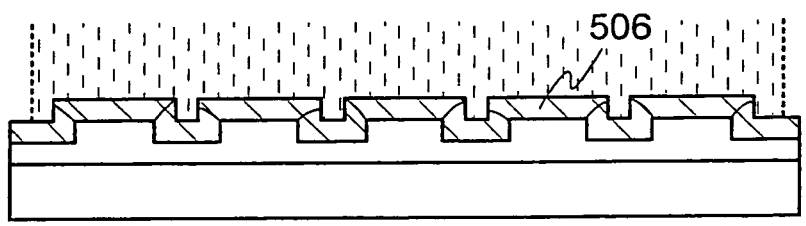

Next, a catalytic element is used to crystallize the semiconductor film 503 (FIG. 39B). For example, in the case of using the art disclosed in JP-A-130652/1995, a nickel acetate solution containing 10 ppm nickel by weight is applied onto the semiconductor film 503 to form a nickel-containing layer 504. After a dehydrogenation process at 500° C. for 1 hour, thermal process is carried out at 500-650° C. for 4-12 hours, e.g. at 550° C. for 8 hours, to form a semiconductor film 505 enhanced in crystallinity. Incidentally, usable catalytic elements may be an element of germanium (Ge), iron (Fe), palladium (Pd), tin (Sn), lead (Pb), cobalt (Co), platinum (Pt), copper (Cu) or Gold (Au), besides nickel (Ni).

By laser irradiation, a semiconductor film 506 further enhanced in crystallinity is formed from the semiconductor film 505 crystallized by NiSPC. The semiconductor film 506 obtained by laser irradiation contains a catalytic element. After laser irradiation, carried out is a process to remove the catalytic element from the semiconductor film 506 (gettering). For gettering, it is possible to use an art described in JP-A-135468/1998 or JP-A-135469/1998.

Figure 39D:
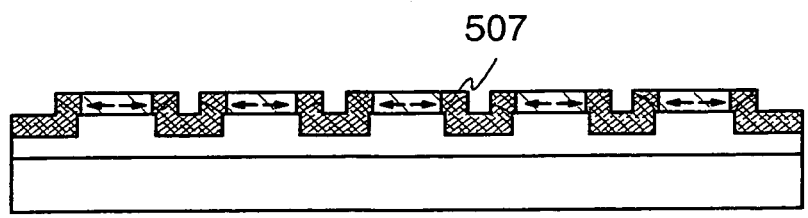

Specifically, a phosphorus-added region 507 is formed in a part of a semiconductor film 506 obtained after laser irradiation. Thermal process is carried out in a nitrogen atmosphere at 550-800° C. for 5-24 hours, e.g. at 600° C. for 12 hours. Thereupon, the phosphorus-added region 507 of the semiconductor film 506 acts as a gettering site to aggregate the catalytic element existing in the semiconductor film 506 to the phosphorus-added region 507 (FIG. 39D).

Figure 39E:
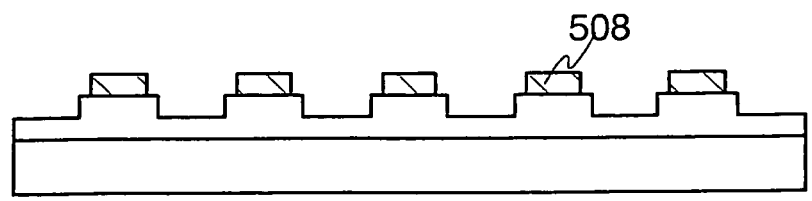

Thereafter, the phosphorus-added region 507 of the semiconductor film 506 is removed by patterning, thereby obtaining an island 508 reduced in catalytic element concentration to $1 \times 10^{17}$ atoms/cm$^3$ or less, preferably to approximately $1 \times 10^{16}$ atoms/cm$^3$ (FIG. 39E).

Incidentally, after applying a solution containing a catalytic element to the semiconductor film of prior to crystallization, crystal growth may be by laser light irradiation.

This embodiment can be implemented in combination with Embodiments 1-11.

Embodiment 13

This embodiment explains the form of a laser beam combined by superposing together a plurality of laser beams.

Figure 40A:
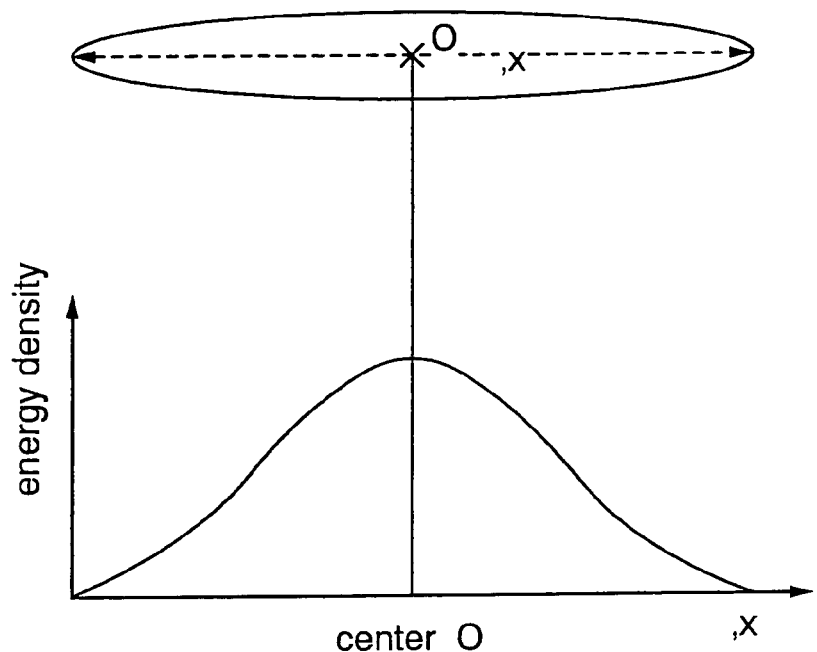
FIGS. 40A and 40B are views showing an energy density distributions of laser beam.

FIG. 40A shows an example of a laser beam form on a subject to be processed in the case that laser light is oscillated from a plurality of laser oscillators without a slit. The laser beam shown FIG. 40A is elliptic in form. Incidentally, in the invention, the laser beam form of laser light oscillated from the laser oscillator is not limited to the elliptic. The laser beam form is different depending on a laser kind and can be formed by an optical system. For example, the laser light emitted from an XeCl excimer laser (wavelength 308 nm, pulse width 30 ns) L3308 by Lambda is rectangular in form having 10 mm×30 mm (each, width at half maximum in beam profile). The laser light emitted from a YAG laser is circular in form if a rod is cylindrical and rectangular in form if it is a slab type. By further forming such laser light by an optical system, a desired size of laser light can be formed.

FIG. 40A shows an laser light energy density distribution in a major-axis Y-direction of the laser beam. The laser light, whose laser beam is elliptic, has an energy density distribution increasing toward an elliptic center O. In this manner, the laser beam shown in FIG. 40A has an energy density in a center axis direction following the Gaussian distribution, wherein the region is narrow where energy density is to be determined uniform.

Figure 40B:
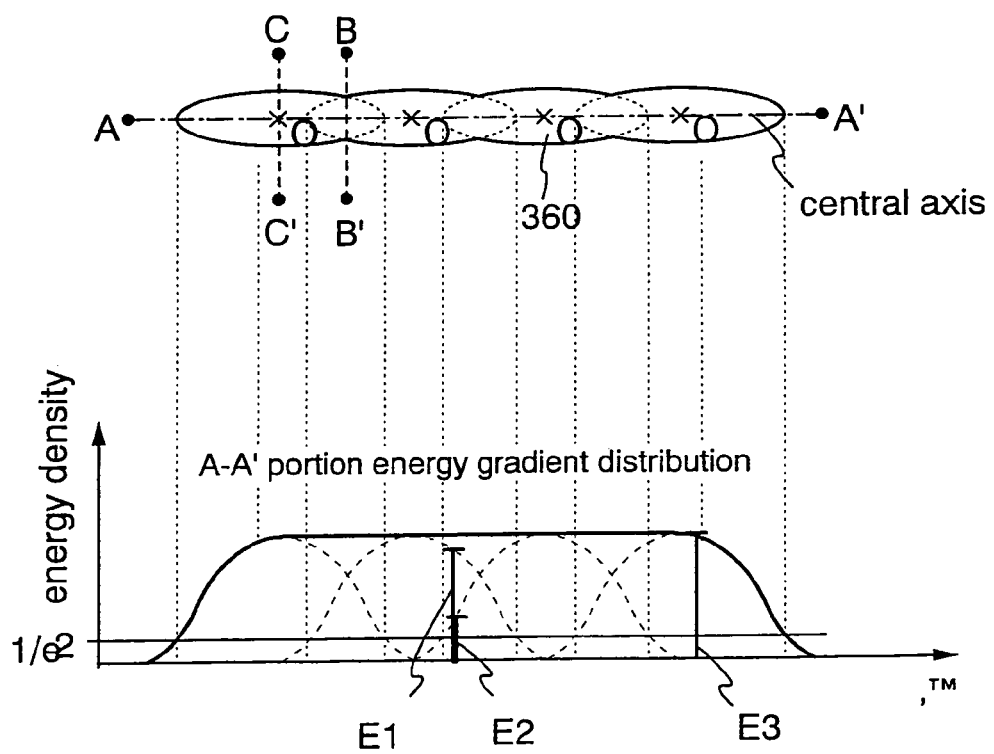

FIG. 40B shows a laser beam form when the laser light having a laser beam of FIG. 40A is combined together. Although FIG. 40B shows the case that four laser-light laser beams are superposed together to form one linear laser beam, the number of laser beams superposed is not limited to that.

As shown in FIG. 40B, the laser beams of laser light are combined together by partly superposed one over another with their major axes placed in coincidence, thereby being formed into one by connecting the ellipse centers O is assumed to be a center axis of the laser beam 360.

FIG. 40B shows a laser-light energy density distribution in a center-axis y-direction of a combined laser beam. The laser beam of FIG. 40B corresponds to a region satisfying an energy density of 1/e$^2$ of a peak value in the energy density of FIG. 40A. Energy density is added on in the overlapped areas of the uncombined laser beams. For example, adding the energy densities E1 and E2 together of the overlapped beams as shown in the figure, it becomes nearly equal to a peak value E3 of beam energy density. Thus, energy density is flattened between the elliptic centers O.

Incidentally, the addition of E1 and E2 together, ideally, equals to E3, practically an equal value is not necessarily obtainable. It is possible for the designer to appropriately set an allowable range of deviation between the added value of E1 and E2 and the value of E3.

With the use of a single laser beam, the energy density distribution follows the Gaussian distribution. Accordingly, it is difficult to irradiate an even energy density of laser light to the entire of a semiconductor film contacting with the flat region of insulation film or a part to be made into an island. However, as can be seen from FIG. 40B, by superposing together a plurality of laser light to mutually compensate for the regions low in energy density, the region having a uniform energy density is broadened rather than the single use thereof without superposing a plurality of laser light. This can efficiently enhance the crystallinity of a semiconductor film.

Figure 41A:
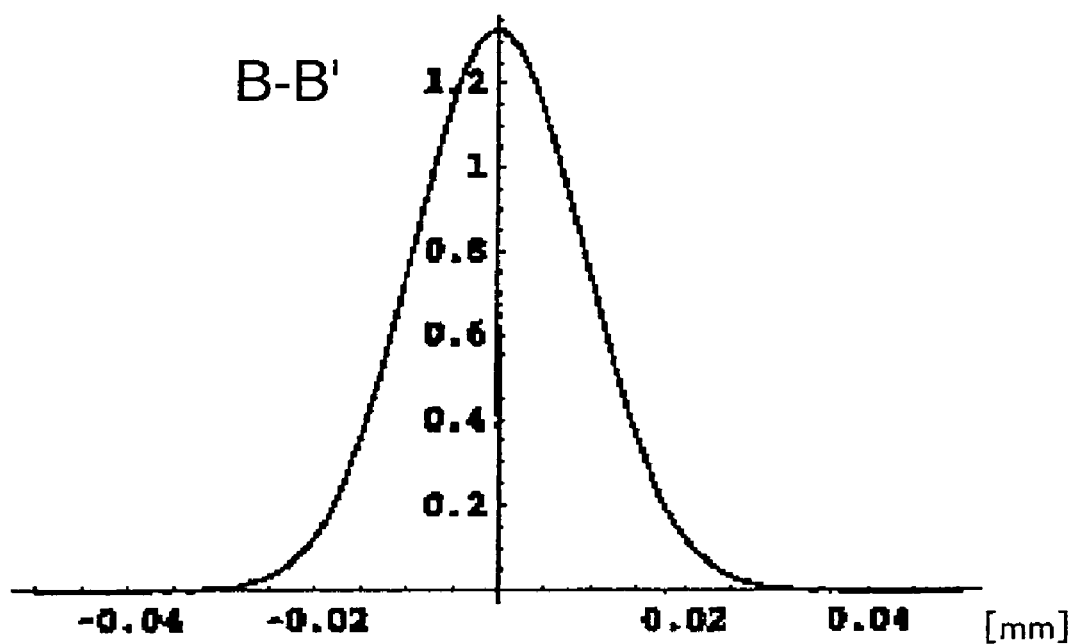
FIGS. 41A and 41B are views showing energy density distributions of laser beam.
Figure 41B:
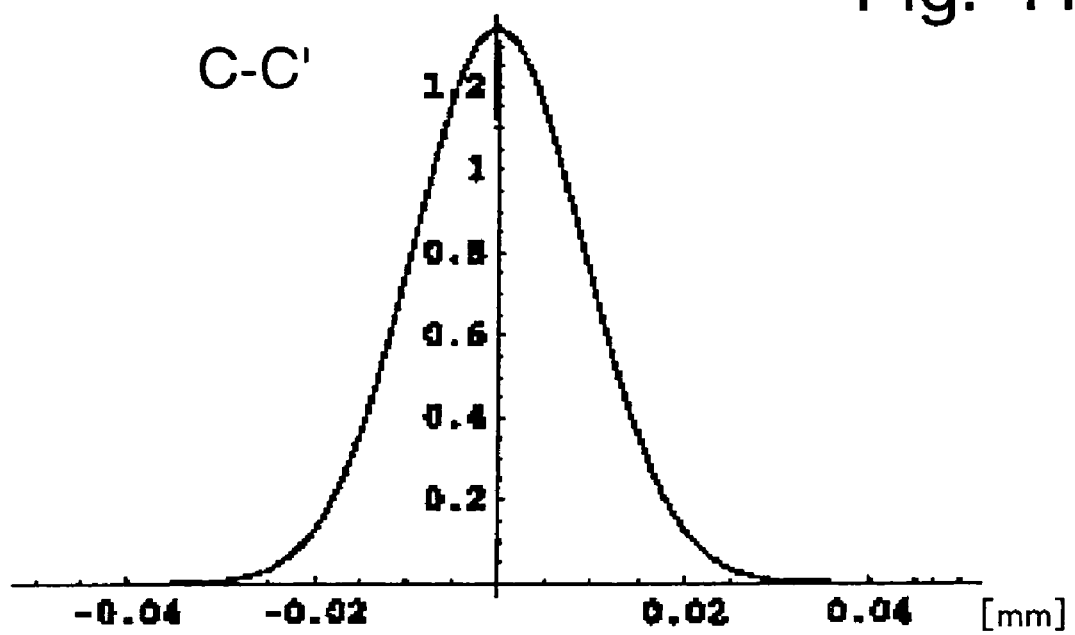

FIG. 41 shows an energy density distribution, determined by computation, on B-B' and C-C' in FIG. 40B. Note that FIG. 41 is with reference to the region satisfying an energy density of 1/e$^2$ of a peak value of an uncombined laser beam. When the uncombined laser beam assumably has a length in minor axis direction of 37 μm and a length in major axis direction of 410 μm and a center-to-center distance of 192 μm, the energy densities on B-B' and C-C' have respective distributions as shown in FIGS. 41A and FIG. 41B. Although the one on B-B' is somewhat smaller than the one on C-C', these can be considered to be substantially the same in magnitude. The combined laser beam, in a region satisfying an energy density of 1/e$^2$ of a peak value of an uncombined laser beam, can be considered as linear in form.

Figure 42:
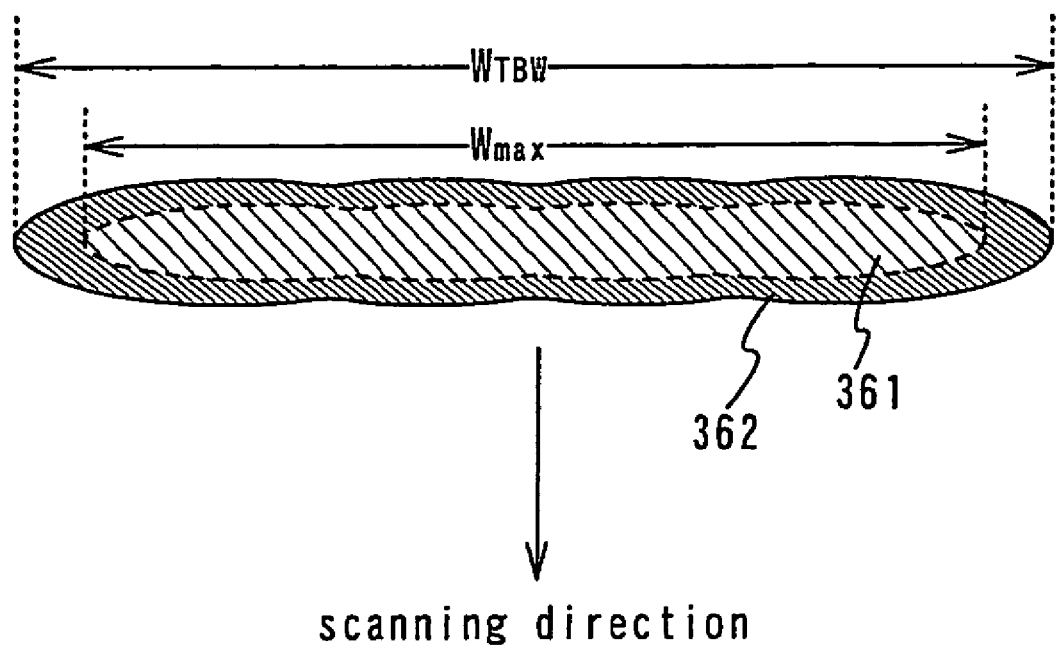
FIG. 42 is a view showing an energy density distribution of laser beam.

FIG. 42A shows an energy distribution of a combined laser beam. The region shown at 361 is a region where energy density is assumed uniform while the region shown at 362 is a region having a low energy density. In FIG. 42, it is assumed that the laser beam has a length in a center axis direction of $W_{TBW}$ while the region 361 having an assumed uniform energy density has a length in a center axis direction of $W_{max}$. As $W_{TBW}$ increases greater as compared to $W_{max}$, the ratio of the region 362 uneven in energy density not to be used in crystallizing a semiconductor film increases relatively to the region 361 having an assumed uniform energy density to be used in crystallization. The semiconductor film irradiated only by the region 362 uneven in energy density has fine crystals, thus being not well in crystallinity. Consequently, there arises a necessity to define a layout of scanning route and insulation-film concavo-convex such that the region of semiconductor film to be made into an island is not superposed with the region irradiated with only the laser beam region 362. This restriction increases furthermore as the ratio of region 362 to region 361 increases. Accordingly, it is effective to use a slit to prevent only the region 362 uneven in energy density from being irradiated to the semiconductor film formed on the insulation-film convex part (projection part), in respect of decreasing the restriction occurring upon providing a layout of scanning route and insulation-film concavo-convex.

This embodiment can be implemented in combination with Embodiments 1-12.

Embodiment 14

This embodiment explains the optical systems of a laser irradiation apparatus to be used in the invention and the positional relationship of the optical systems and a slit.

Figure 43:
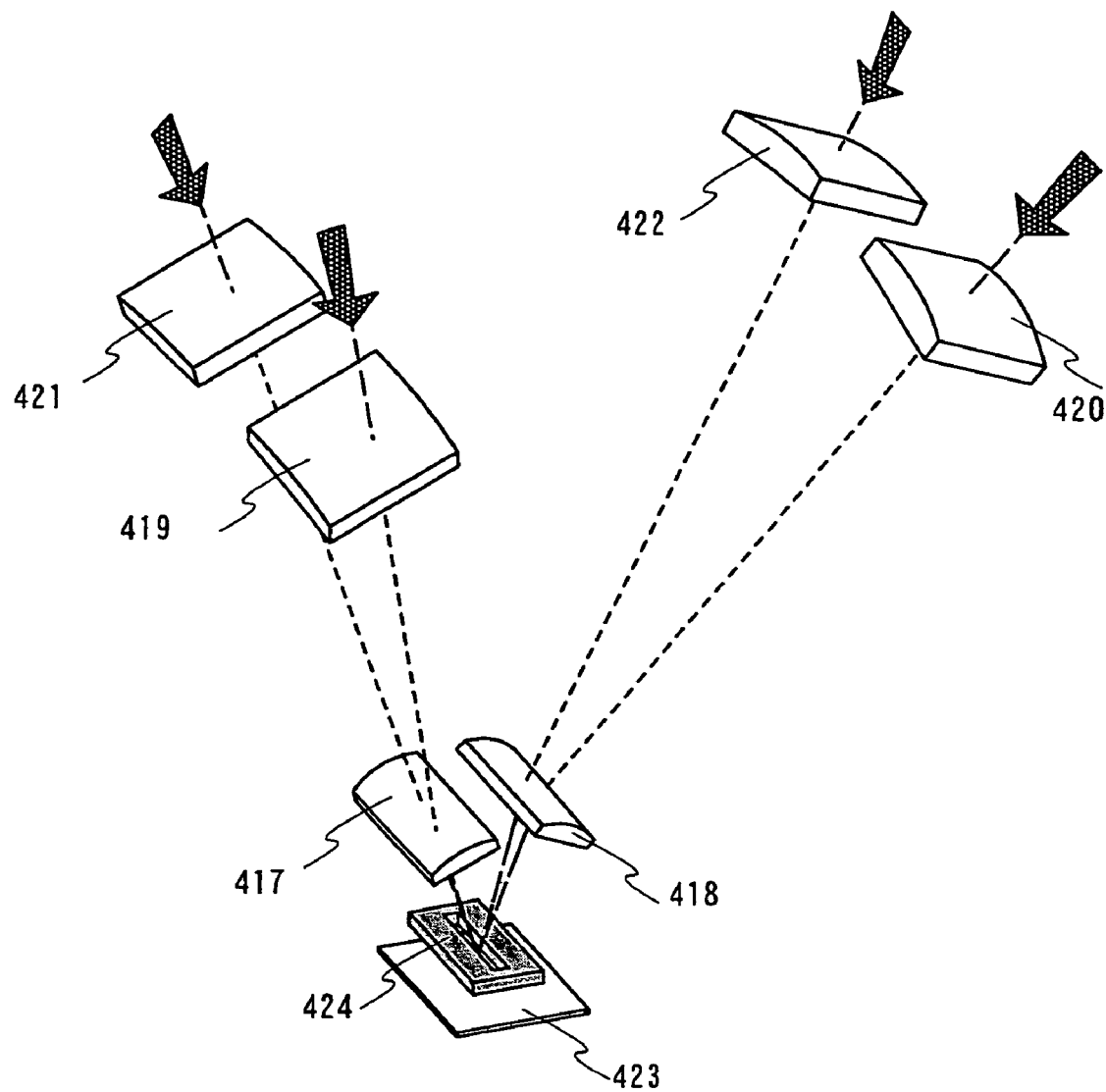
FIG. 43 is a view of an optical system.

FIG. 43 shows an optical system for combining four laser beams into one laser beam. The optical system of FIG. 43 has six cylindrical lenses 417-422. The four portions of laser light entering in a direction of the arrows are respectively incident on the four cylindrical lens 419-422. The two portions of laser light formed by the cylindrical lenses 419, 421 are again formed in their laser beam form by the cylindrical lens 417, and then irradiated to a subject to be processed through a slit 424. On the other hand, the two portions of laser light formed by the cylindrical lenses 420, 422 are again formed in their laser beam form by the cylindrical lens 418, and then irradiated to the subject to be processed 423 through the slit 424.

The laser beams of laser light on the subject to be processed 423 are mutually, partly superposed and combined together into one laser beam.

It is possible for the designer to properly set a focal length and incident angle. However, the focal length of the closest cylindrical lens 417, 418 to the subject to be processed is given smaller than the focal length of the cylindrical lens 419-422. For example, the cylindrical lens 417, 418 closest to the subject to be processed 423 assumably has a focal length of 20 mm while the cylindrical lens 419-422 assumably has a focal length of 150 mm. The lenses are arranged such that the laser light from the cylindrical lens 417, 418 to the subject to be processed 423, in this embodiment, has an incident angle of 25 degrees while the laser light from the cylindrical lens 419-422 to the cylindrical lens 417, 418 has an incident angle of 10 degrees. Incidentally, in order to prevent return light and provide irradiation with uniformity, it is desired to keep an incident angle of laser light on a substrate greater than 0 degree, desirably 5-30 degrees.

FIG. 43 shows the example to combine four laser beams together. In this case, there are provided four cylindrical lenses respectively corresponding to four laser oscillators and two cylindrical lenses corresponding to the four cylindrical lenses. The number of laser beams to be combined is not limited to the above, i.e. the number of laser beams to be combined may be 2 or greater and 8 or smaller. In the case of combining laser beams in the number of n (n=2, 4, 6, 8), there are provided cylindrical lenses in the number of n respectively corresponding to the laser oscillator in the number of n as well as cylindrical lenses in the number of n/2 corresponding to the relevant cylindrical lenses in the number of n. In the case of combining laser beams in the number of n (n=3, 5, 7), there are provided cylindrical lenses in the number of n respectively corresponding to the laser oscillator in the number of n as well as cylindrical lenses in the number of (n+1)/2 corresponding to the relevant cylindrical lenses in the number of n.

When combining together five or more laser beams, the fifth or subsequent of laser light is desirably irradiated at an opposite side of a substrate taking into consideration the arrangement location of optical system and interference. In such a case, there is a need to provide a slit also on the opposite side of the substrate. Meanwhile, the substrate requires optical transmissivity.

Incidentally, in order to prevent return light from returning along the incoming optical path, the incident angle on a substrate is desirably kept greater than 0 degree and smaller than 90 degrees.

In order to realize laser light irradiation with uniformity, an incident plane is defined by a plane vertical to an irradiation plane and including either one of a shorter side or a longer side as considering the forms of uncombined beams respectively as rectangular forms. Then, the laser light desirably has an incident angle $\theta$ satisfying $\theta \geq \arctan (W/2d)$ when the shorter or longer side included in the incident plane has a length W and a substrate provided on the irradiation plane and having an optical transmissivity for the laser light has a thickness d. This discussion must be held for the individual ones of uncombined laser light. Incidentally, when the path of laser light is not on the incident plane, the incident angle the path is projected onto the incident plane is assumably given $\theta$. In case laser light is incident at this incident angle $\theta$, there is no interference between the reflection light upon a substrate surface and the reflection light coming from a substrate backside, thus making it possible to laser light irradiation with uniformity. This discussion was considered by taking the substrate refractive index as 1. Actually, the substrate in many cases has a refractive index of at around 1.5. Taking this numeral into consideration, obtained is a computation value greater than the angle computed in the above discussion. However, because the beam spot has energy attenuation at the both lengthwise ends thereof, there is less affection of interference at the points. Thus, the foregoing computation value fully provides an effect of interference attenuation.

Note that the optical system possessed by the laser irradiation apparatus to be used in the invention is not limited to the structure shown in this embodiment.

This embodiment can be implemented in combination with Embodiments 1-13.

Embodiment 15

The laser light having a laser beam in an elliptic form has an energy density distribution perpendicular to a scanning direction following the Gaussian distribution. Consequently, the ratio of a low energy density region to the entire is higher as compared to the laser light having a rectangular or linear laser beam. Accordingly, in the invention, the laser beam of laser light is desirably rectangular or linear comparatively uniform in energy density distribution.

The representative gas laser, for obtaining a rectangular or linear laser beam, is an excimer laser while the representative solid laser is a slab laser. This embodiment explains a slab laser.

Figure 44A:
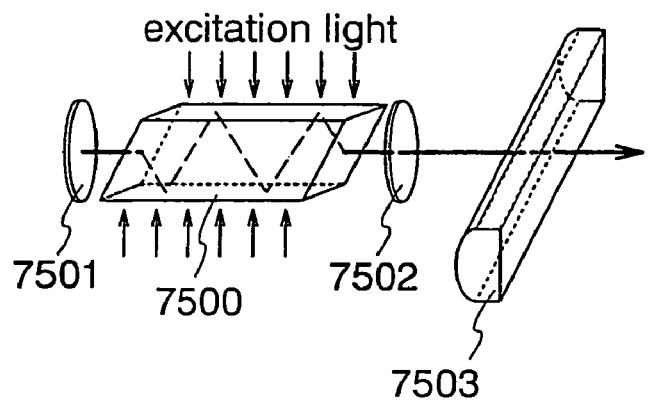
FIGS. 44A, 44B and 44C are views of optical systems.

FIG. 44A shows an example of a laser oscillator structure of a slab type. The slab-type laser oscillator of FIG. 24A has a rod 7500, a reflection mirror 7501, an output mirror 7502 and a cylindrical lens 7503.

In case an excitation light is irradiated to the rod 7500, laser light travels through a zigzag optical path and emits toward the reflection mirror 7501 or emission mirror 7502. The laser light emitted toward the reflection mirror 7501 is reflected thereon and again enters the rod 7500, then emitting toward the emission mirror 7502. The rod 7500 is of a slab type using a plate-like slab medium to form a comparatively long rectangular or linear laser beam upon emission. The emitted laser light, in the cylindrical lens 7503, is formed smaller in its laser beam form and emitted at the laser oscillator.

Figure 44B:
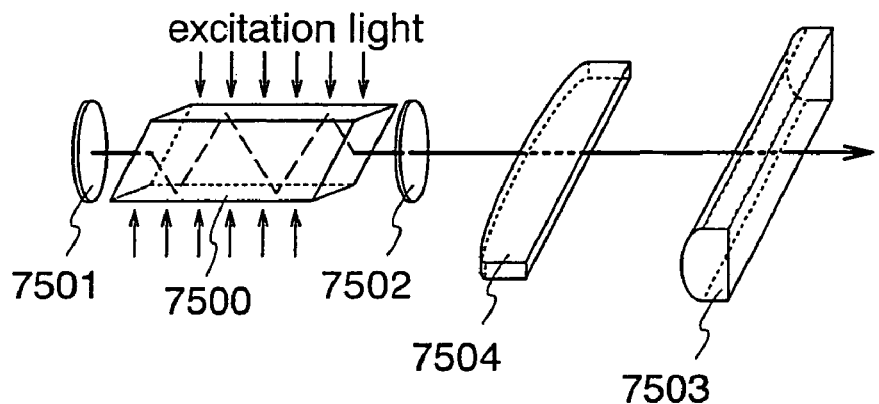

FIG. 44B shows a slab-type laser oscillator structure different from that showed in FIG. 44A. In FIG. 44B, a cylindrical lens 7504 is added to the laser oscillator of FIG. 44A to control a laser beam length by the cylindrical lens 7504.

Incidentally, with a coherent length of 10 cm or longer, preferably 1 m or longer, the laser beam can be reduced in form furthermore.

In order to prevent the rod 7500 from excessively rising in temperature, temperature control means may be provided, e.g. circulating a cooling water.

Figure 44C:
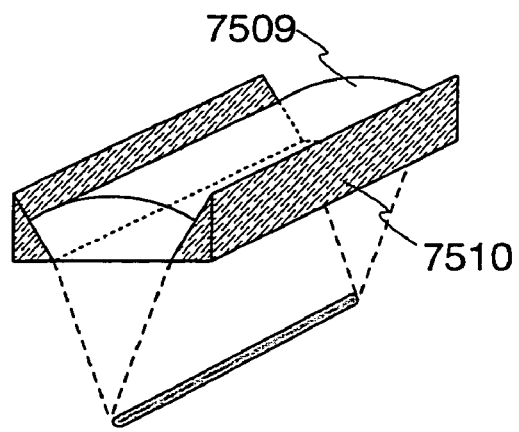

FIG. 44C shows an embodiment of a cylindrical lens form. 7509 is a cylindrical lens of this embodiment fixed by a holder 7510. The cylindrical lens 7509 has a form that a cylindrical surface and a rectangular flat surface are opposed to each other, wherein the two generating lines of the cylindrical surface and the two sides of the opposed rectangle are all in parallel with one another. The two surfaces, formed by the two lines of cylindrical surface and the parallel two lines, intersect with the rectangular flat surface at an angle greater than 0 degree and smaller than 90 degrees. In this manner, the two surfaces formed with the two parallel sides intersect with the rectangular flat surface at an angle of smaller than 90 degrees, whereby the focal length can be shortened as compared to that at 90 degrees or greater. This can further reduce the form of laser beam and approximate it to a linear form.

This embodiment can be implemented in combination with Embodiments 1-14.

Embodiment 16

This embodiment explains a relationship between a center-to-center distance of laser beams and an energy density when laser beams are superposed one over another.

Figure 45:
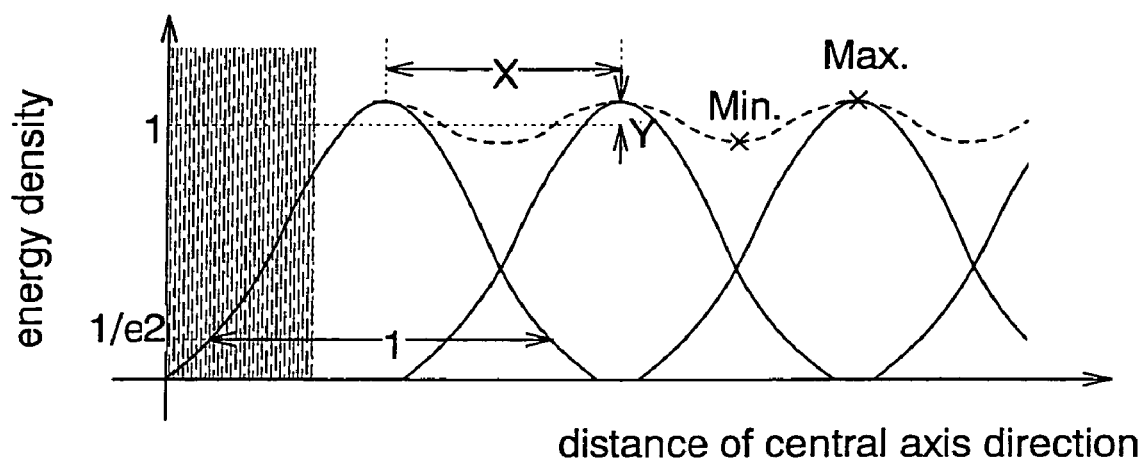
FIG. 45 is a view showing an energy density distribution in a center-axis direction of a superposed laser beam.

FIG. 45 shows an energy density distribution of each laser beam in a center axis direction by the solid line and an energy density distribution of a combined laser beam by the dotted line. The energy density value of a laser beam in a center axis direction of a laser beam generally follows the Gaussian distribution.

Figure 46:
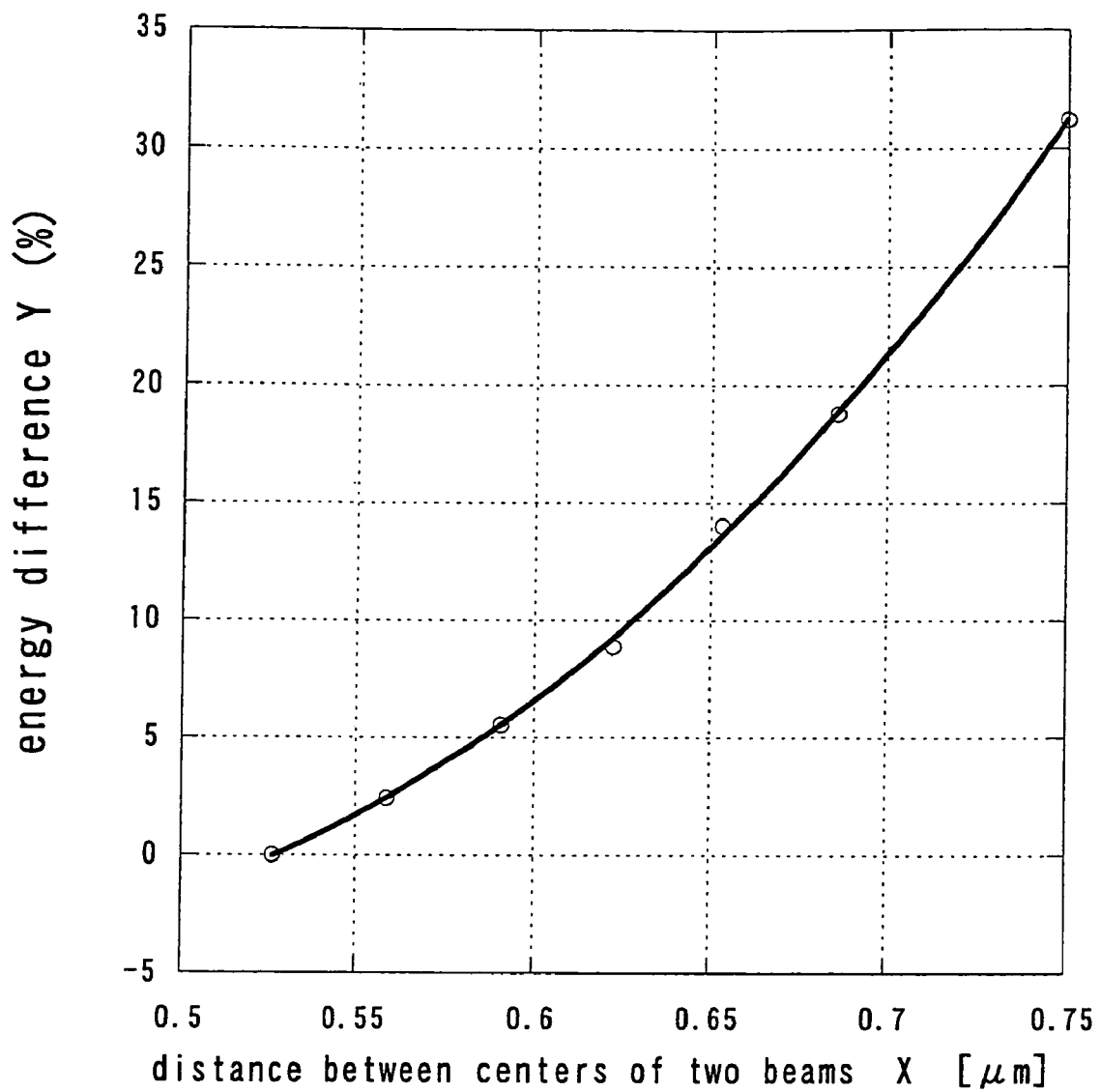
FIG. 46 is a view showing a relationship between a center-to-center distance of laser beam and an energy difference.

It is assumed that, the uncombined laser beam has a peak-to-peak distance X when a distance in a center axis direction is taken as 1 that is satisfying an energy density equal to or greater than $1/e^2$ of a peal value. Meanwhile, in a combined laser beam, the increase amount of peak value is assumably taken as Y with respect to an average value of a peak value and valley value of after combination. FIG. 46 shows a relationship between X and Y determined on simulation. Note that Y in FIG. 46 is expressed by percentage.

In FIG. 46, an energy difference Y is expressed by an approximate expression as given in the following Equation 1.

$Y=60-293X+340X^2$ (X: assumed to be greater one of two solutions) [Equation 1]

According to Equation 1, it can be seen that X≈0.584 may be provided when obtaining an energy difference of approximately 5% for example. Incidentally, although ideally Y=0, there is practically a difficulty in realizing it. There is a need for the designer to appropriately set an allowable range of energy difference Y. Although ideally X=0, it makes the beam spot length short. Consequently, X is preferably determined considering a balance with throughput.

Figure 47:
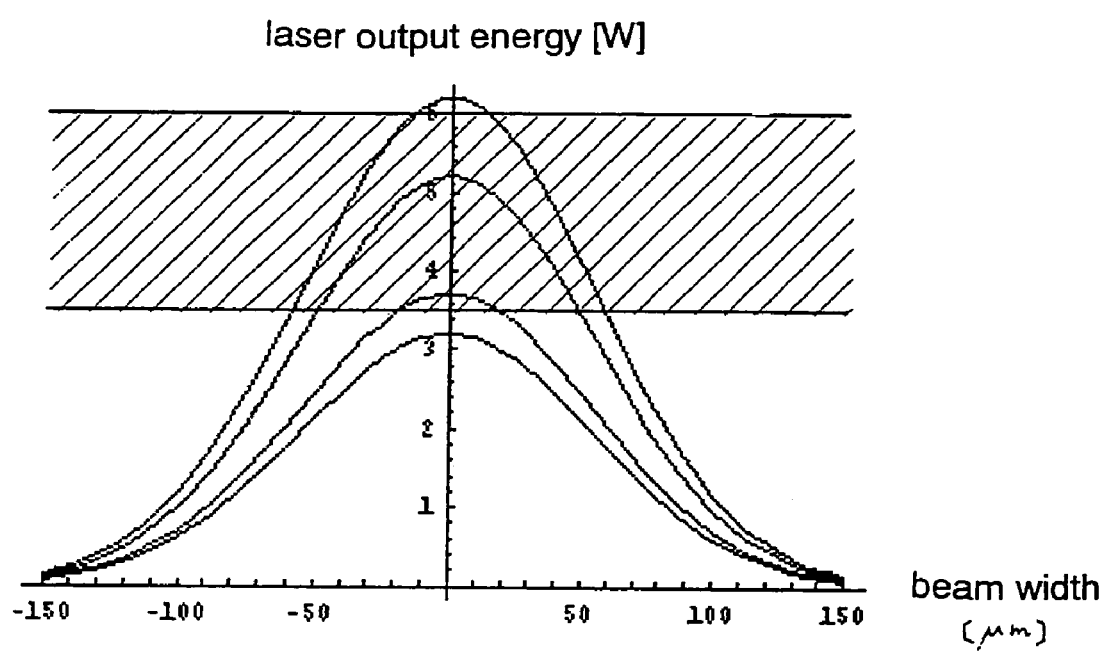
FIG. 47 is a view showing an output energy distribution in a center-axis direction of laser beam.

Explanation is now made on an allowable range of Y. FIG. 47 shows an output (W) distribution of $YVO_4$ laser with respect to a beam width in a center axis direction in the case the laser beam has an elliptic form. The hatched region is an output energy range required to obtain favorable crystallinity. It can be seen that the output energy of combined laser light is satisfactorily within a range of 3.5-6 W.

When the output energy maximum and minimum values of a beam spot after combination are fallen, to a full limit, within the output energy range required to obtain favorable crystallinity, the energy difference Y for favorable crystallinity assumes to be the maximum. Accordingly, in the case of FIG. 47, the energy difference Y is ±26.3%. It can be seen that favorable crystallinity is to be obtained provided that the energy difference Y falls within the foregoing range.

Incidentally, the output energy range for favorable crystallinity varies depending upon to what extent crystallinity is to be determined favorable. Further, because output energy distribution changes depending on a laser beam form, the allowable range of energy difference Y is not necessarily limited to the foregoing value. The designer is required to appropriately define an output energy range required to obtain favorable crystallinity and set an allowable range of energy difference Y from an output energy distribution of a laser to be used.

This embodiment can be implemented in combination with Embodiment 13.

As explained above, according to the present invention, a crystalline semiconductor film is left on the convex part (projection part) thereof conforming to a pattern of underlying insulation film having a step form, and made into an active layer of a TFT thereby preferentially use a quality crystal. Namely, the strain concentrated in the step region can be excluded from the channel region.

Namely, in the crystallization irradiating a continuous oscillation laser beam to an amorphous semiconductor film, the provision of a step form on the underlying insulation film can concentrate the strain or stress due to crystallization to that point. Thus, the crystalline semiconductor to be made into an active layer can be made free from such strain or stress. By forming a TFT having a channel region arranged in the crystalline semiconductor film released from strain or stress, current drivability can be improved at high speed. Device reliability can be also improved.

In the invention, after crystallization with laser light, concave-part, convex part (projection part) edge and its vicinity of semiconductor film are removed by patterning to actively use, as a TFT active layer, the region excellent in crystallinity at the vicinity of the convex part (projection part). This can prevent grain boundaries from forming in the TFT channel region, and further prevent conspicuous lowering in TFT mobility due to grain boundaries, on-current decrease or off-current increase.

Note that the designer is allowed to properly define to what region the convex part (projection part edge and its vicinity are to be removed by patterning.

Meanwhile, instead of irradiating laser light by scanning throughout the entire semiconductor film, laser light is scanned to crystallize minimally at least a requisite region. This configuration can omit the time for irradiating laser light to the region to be removed by patterning after crystallization of a semiconductor film, thus greatly shorten the process time required per substrate sheet.

Also, by superposing together a plurality of laser light to compensate for the energy-density low regions, the crystallinity of semiconductor film can be more efficiently improved than that in the single use without superposition of a plurality of laser light.

Incidentally, instead of forming a concavo-convex on an insulation film, a concavo-convex may be provided on the substrate itself by etching so that a region where stress concentration is to occur can be intentionally formed by providing a concavo-convex on the semiconductor film formed on that.

What is claimed is:

1. A semiconductor device comprising:
  a substrate;
  an insulation film having a first triangular convex and a second triangular convex over the substrate;
  a thin film transistor comprising a crystalline semiconductor film including a channel region and source and drain regions,
  wherein between the first triangular convex and the second triangular convex is a concave, and wherein the crystalline semiconductor film in the vicinity of an apex of at least the first triangular convex and an edge in the concave are removed, and wherein the channel region in the crystalline semiconductor film is formed on a flat region of at least the first triangular convex.

2. The semiconductor device according to claim 1, wherein the insulation film comprises a material selected from the group consisting of silicon oxide and silicon oxide nitride.

3. The semiconductor device according to claim 1, wherein the channel region extends in a direction parallel with a scanning direction of a laser beam.

4. The semiconductor device according to claim 1, wherein an angle of an apex of at least the first triangular convex is 70.5 degrees.

5. The semiconductor device according to claim 1, wherein an angle of an apex of at least the first triangular convex is 109.5 degrees.

6. A semiconductor device comprising:
a substrate;
an insulation film having a first triangular convex and a second triangular convex over the substrate; and
a crystalline semiconductor film on the insulating film having the first triangular convex and the second triangular convex,
wherein between the first triangular convex and the second triangular convex is a concave,
wherein the crystalline semiconductor film in the vicinity of an apex of at least the first triangular convex and an edge in the concave are removed, and
wherein a channel region in the crystalline semiconductor film is formed on a flat region of at least the first triangular convex.

7. The semiconductor device according to claim 6, wherein the insulation film comprises a material selected from the group consisting of silicon oxide and silicon oxide nitride.

8. The semiconductor device according to claim 6, wherein the channel region extends in a direction parallel with a scanning direction of a laser beam.

9. The semiconductor device according to claim 6, wherein an angle of the apex of at least the first triangular convex is 70.5 degrees.

10. The semiconductor device according to claim 6, wherein an angle of the apex of at least the first triangular convex is 109.5 degrees.

11. A semiconductor device comprising:
a substrate;
an insulation film having a first triangular convex and a second triangular convex over the substrate; and
a thin film transistor comprising a crystalline semiconductor film including a channel region and source and drain regions,
wherein the channel region is formed on a flat region of at least the first triangular convex, and
wherein the channel region extends in a lengthwise direction of the first triangular convex.

12. The semiconductor device according to claim 11, wherein the insulation film comprises a material selected from the group consisting of silicon oxide and silicon oxide nitride.

13. The semiconductor device according to claim 11, wherein the channel region extends in a direction parallel with a scanning direction of a laser beam.

14. The semiconductor device according to claim 11, wherein an angle of an apex of at least the first triangular convex is 70.5 degrees.

15. The semiconductor device according to claim 11, wherein an angle of an apex of at least the first triangular convex is 109.5 degrees.

16. A semiconductor device comprising:
a substrate;
an insulation film having a first triangular convex and a second triangular convex over the substrate; and
a thin film transistor comprising a crystalline semiconductor film including a channel region and source and drain regions,
wherein a carrier flow direction of the channel region is along one edge of the first triangular convex,
wherein the channel region is formed on a flat region of at least the first triangular convex, and
wherein at least one of the source and drain regions is formed on the flat region of the first triangular convex and extends beyond the one edge of the first triangular convex so that a part of the one of the source and drain regions is formed over the substrate.

17. The semiconductor device according to claim 16, wherein the insulation film comprises a material selected from the group consisting of silicon oxide and silicon oxide nitride.

18. The semiconductor device according to claim 16, wherein the channel region extends in a direction parallel with a scanning direction of a laser beam.

19. The semiconductor device according to claim 16, wherein an angle of an apex of at least the first triangular convex is 70.5 degrees.

20. The semiconductor device according to claim 16, wherein an angle of an apex of at least the first triangular convex is 109.5 degrees.

* * * * *